US012237019B2

(12) United States Patent
Yamazaki et al.

(10) Patent No.: US 12,237,019 B2
(45) Date of Patent: Feb. 25, 2025

(54) MEMORY DEVICE, OPERATION METHOD OF MEMORY DEVICE, DATA PROCESSING DEVICE, DATA PROCESSING SYSTEM, AND ELECTRONIC DEVICE

(71) Applicant: Semiconductor Energy Laboratory Co., Ltd., Kanagawa-ken (JP)

(72) Inventors: Shunpei Yamazaki, Tokyo (JP);
Takayuki Ikeda, Kanagawa (JP);
Hitoshi Kunitake, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 171 days.

(21) Appl. No.: 17/772,740

(22) PCT Filed: Oct. 16, 2020

(86) PCT No.: PCT/IB2020/059740
§ 371 (c)(1),
(2) Date: Apr. 28, 2022

(87) PCT Pub. No.: WO2021/090092
PCT Pub. Date: May 14, 2021

(65) Prior Publication Data
US 2022/0375529 A1    Nov. 24, 2022

(30) Foreign Application Priority Data

Nov. 10, 2019   (JP) .................................. 2019-203617
Dec. 5, 2019    (JP) .................................. 2019-220233

(51) Int. Cl.
*G11C 16/26*   (2006.01)
*G06N 3/063*   (2023.01)

(52) U.S. Cl.
CPC ............. *G11C 16/26* (2013.01); *G06N 3/063* (2013.01)

(58) Field of Classification Search
CPC .................................................... G11C 16/26
See application file for complete search history.

(56) References Cited

U.S. PATENT DOCUMENTS 7,613,880 B2   11/2009   Miura et al.
7,991,954 B2    8/2011   Miura et al.
(Continued)

FOREIGN PATENT DOCUMENTS

CN    001717662 A    1/2006
CN    102270496 A    12/2011
(Continued)

OTHER PUBLICATIONS

International Search Report (Application No. PCT/IB2020/059740) Dated Dec. 15, 2020.
(Continued)

*Primary Examiner* — Douglas King
(74) *Attorney, Agent, or Firm* — Husch Blackwell LLP

(57) ABSTRACT

A low-power memory device in which a NAND flash memory and a controller are connected to each other with a short wiring, the controller and a cache memory are connected to each other with a short wiring, and signal transmission delay is small is provided. For example, the NAND flash memory is formed using a Si transistor formed with a single crystal silicon substrate. Since an OS transistor can be formed by a method such as a thin-film method, the cache memory formed using the OS memory can be stacked over the NAND flash memory. When the NAND flash memory and the cache memory are formed in one chip, the NAND flash memory and the controller can be connected to each other with a short wiring, and the controller and the cache memory can be connected to each other with a short wiring.

21 Claims, 36 Drawing Sheets

(56) References Cited

U.S. PATENT DOCUMENTS

| | | | |
|---|---|---|---|
| 8,185,690 | B2 | 5/2012 | Miura et al. |
| 8,379,458 | B1* | 2/2013 | Or-Bach ............ H01L 29/0673 |
| | | | 365/177 |
| 8,514,013 | B2 | 8/2013 | Takeuchi et al. |
| 8,611,121 | B2 | 12/2013 | Ahn et al. |
| 8,687,416 | B2 | 4/2014 | Kurokawa |
| 9,093,136 | B2 | 7/2015 | Kurokawa |
| 9,209,160 | B2 | 12/2015 | Lee |
| 9,837,157 | B2 | 12/2017 | Tamura |
| 11,355,176 | B2 | 6/2022 | Yamazaki et al. |
| 11,379,231 | B2 | 7/2022 | Yamazaki et al. |
| 2006/0041711 | A1 | 2/2006 | Miura et al. |
| 2008/0036082 | A1* | 2/2008 | Eun ..................... H01L 24/06 |
| | | | 257/E21.597 |
| 2010/0030952 | A1 | 2/2010 | Miura et al. |
| 2011/0258373 | A1 | 10/2011 | Miura et al. |
| 2011/0298534 | A1 | 12/2011 | Takeuchi et al. |
| 2012/0271987 | A1 | 10/2012 | Miura et al. |
| 2013/0021866 | A1* | 1/2013 | Lee ....................... G11C 5/02 |
| | | | 365/230.01 |
| 2015/0340366 | A1* | 11/2015 | Lim ..................... G11C 16/10 |
| | | | 257/401 |
| 2016/0149004 | A1* | 5/2016 | Rabkin ............ H01L 29/66969 |
| | | | 257/43 |
| 2017/0213842 | A1* | 7/2017 | Park .................. H01L 29/40117 |
| 2018/0005670 | A1* | 1/2018 | Lee ..................... G11C 7/1072 |
| 2019/0006386 | A1* | 1/2019 | Yamazaki ............. H10B 43/10 |
| 2019/0057959 | A1* | 2/2019 | Or-Bach ............ H01L 21/76259 |

FOREIGN PATENT DOCUMENTS

| | | |
|---|---|---|
| CN | 102890959 A | 1/2013 |
| DE | 10 2012 106 454 A1 | 1/2013 |
| EP | 2249348 A | 11/2010 |
| JP | 2010-263211 A | 11/2010 |
| JP | 2011-146075 A | 7/2011 |
| JP | 2011-249362 A | 12/2011 |
| JP | 2013-025806 A | 2/2013 |
| JP | 2014-197444 A | 10/2014 |
| JP | 2017-059291 A | 3/2017 |
| KR | 2006-0055436 A | 5/2006 |
| KR | 2013-0011138 A | 1/2013 |
| WO | WO 2004/049168 A1 | 6/2004 |

OTHER PUBLICATIONS

Written Opinion (Application No. PCT/IB2020/059740) Dated Dec. 15, 2020.

Yamazaki, S. et al., "Properties of crystalline In—Ga-Zn-oxide semiconductor and its transistor characteristics," Japanese Journal of Applied Physics, Mar. 31, 2014, vol. 53, No. 4S, pp. 04ED18-1-04ED18-10.

Kato, K. et al., "Evaluation of Off-State Current Characteristics of Transistor Using Oxide Semiconductor Material, Indium-Gallium-Zinc Oxide," Japanese Journal of Applied Physics, 2012, vol. 51, pp. 021201-1-021201-7.

Yamazaki, S. et al., "Research, Development, and Application of Crystalline Oxide Semiconductor," SID Digest '12: SID International Symposium Digest of Technical Papers, Jun. 5, 2012, vol. 43, No. 1, pp. 183-186.

Maeda, S. et al., "A 20ns-Write 45ns-Read and 1014-Cycle Endurance Memory Module Composed of 60nm Crystalline OxideSemiconductor Transistors," ISSCC 2018 (Digest of Technical Papers. IEEE International Solid-State Circuits Conference), Feb. 11, 2018, pp. 484-486.

Akasawa, F. et al., "An Energy Efficient Normally-Off CPU with 2.4 pW Negative Voltage Generator Featuring 60-nm Crystalline Indium-Gallium-Zinc Oxide FETs in BEOL," SSDM 2019 (Extended Abstracts of The 2019 International Conference on Solid State Devices and Materials), Sep. 2, 2019, pp. 519-520.

* cited by examiner

100

100

OMC

OMC

OMC

100

110

100A

100A

100A

300A

FIG. 20A
| Amorphous | Intermediate state<br>New crystalline phase<br>Crystalline | Crystal |
|---|---|---|
| •completely amorphous | •CAAC<br>•nc<br>•CAC | •single crystal<br>•poly crystal |
FIG. 20B
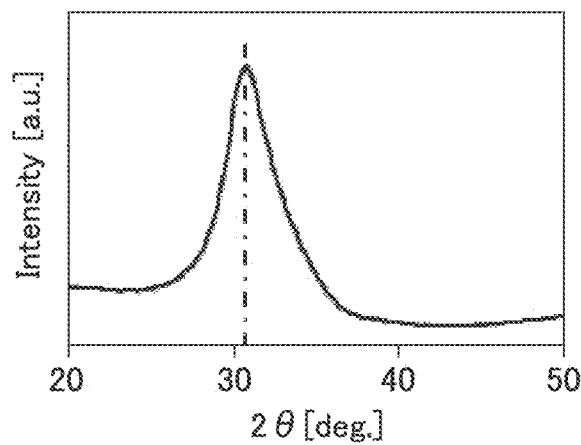
FIG. 20C
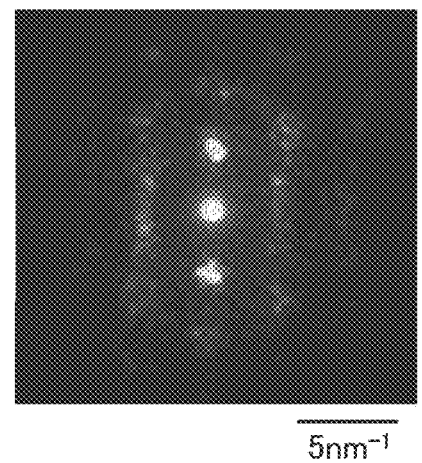

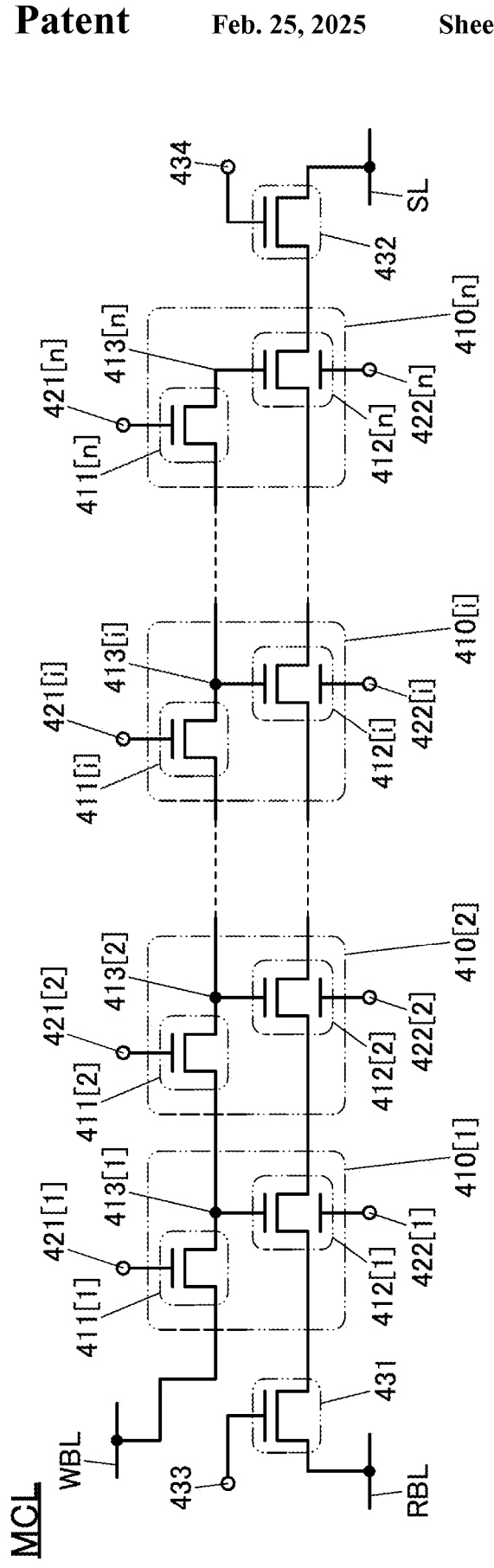
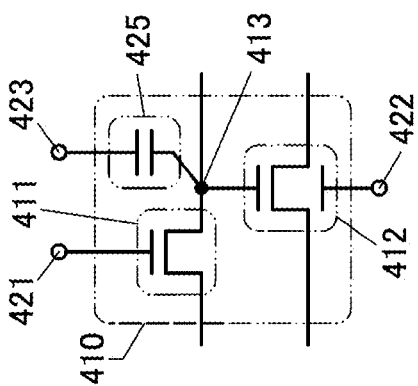
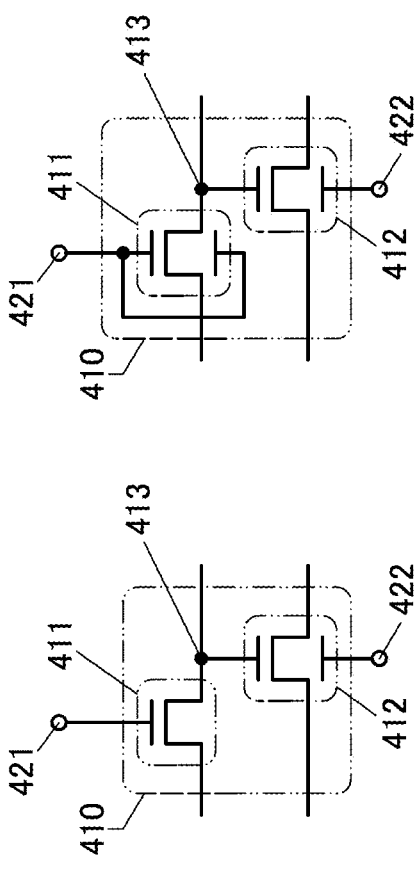

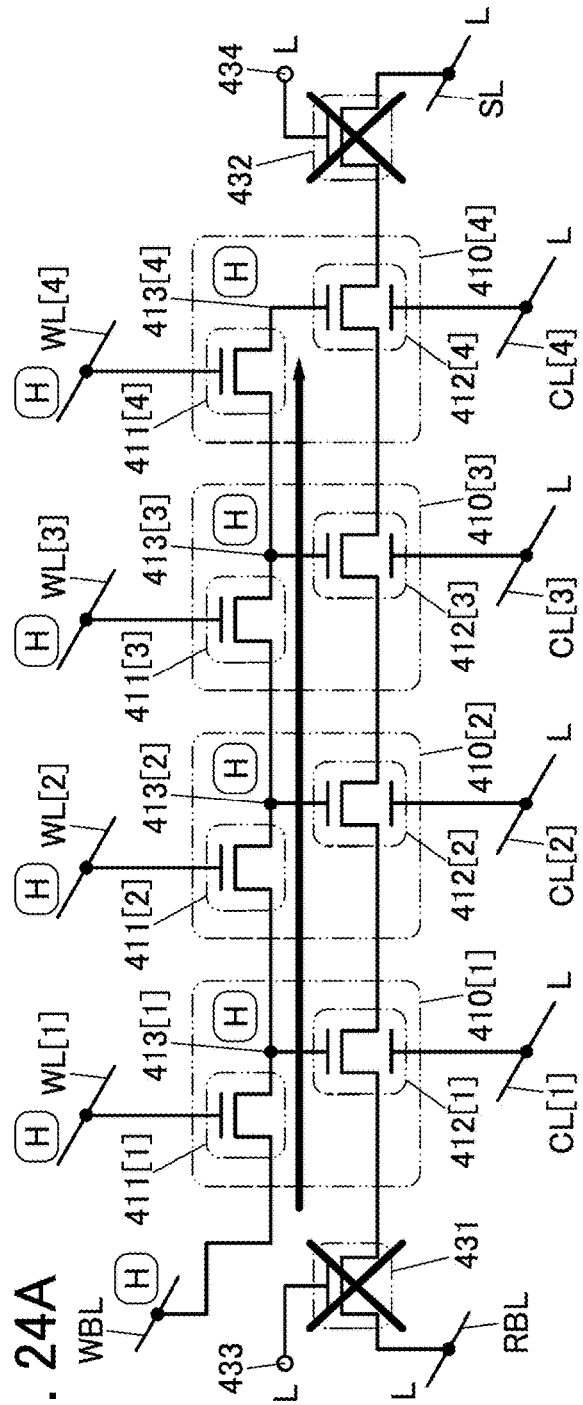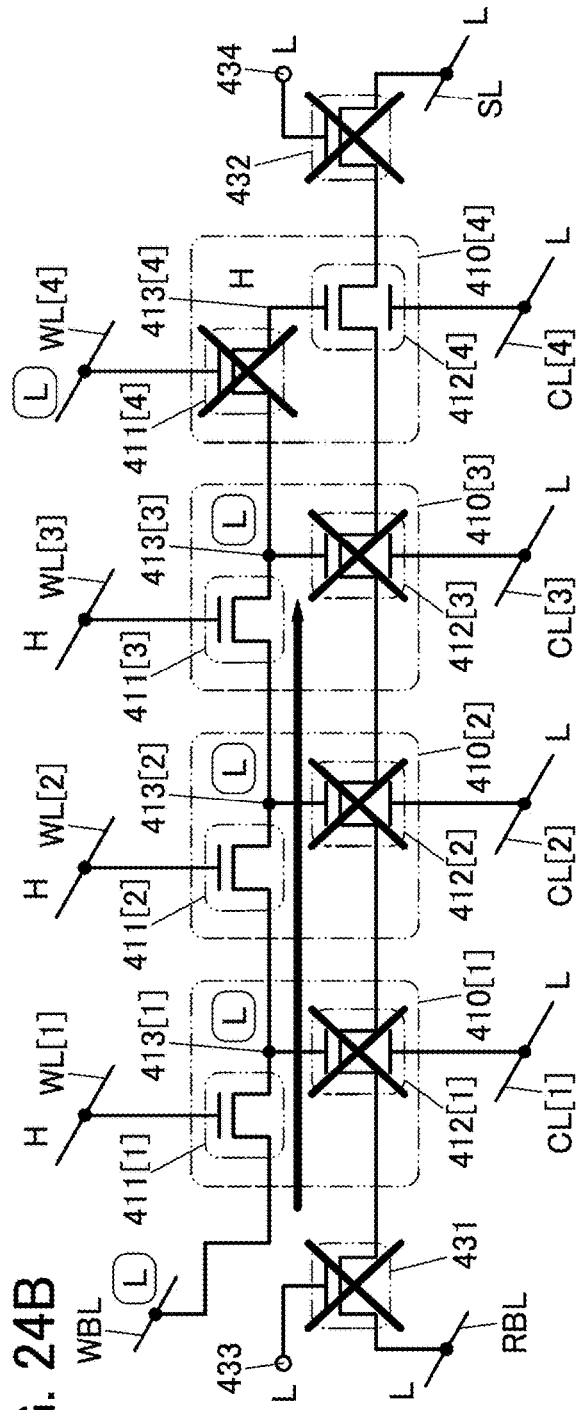

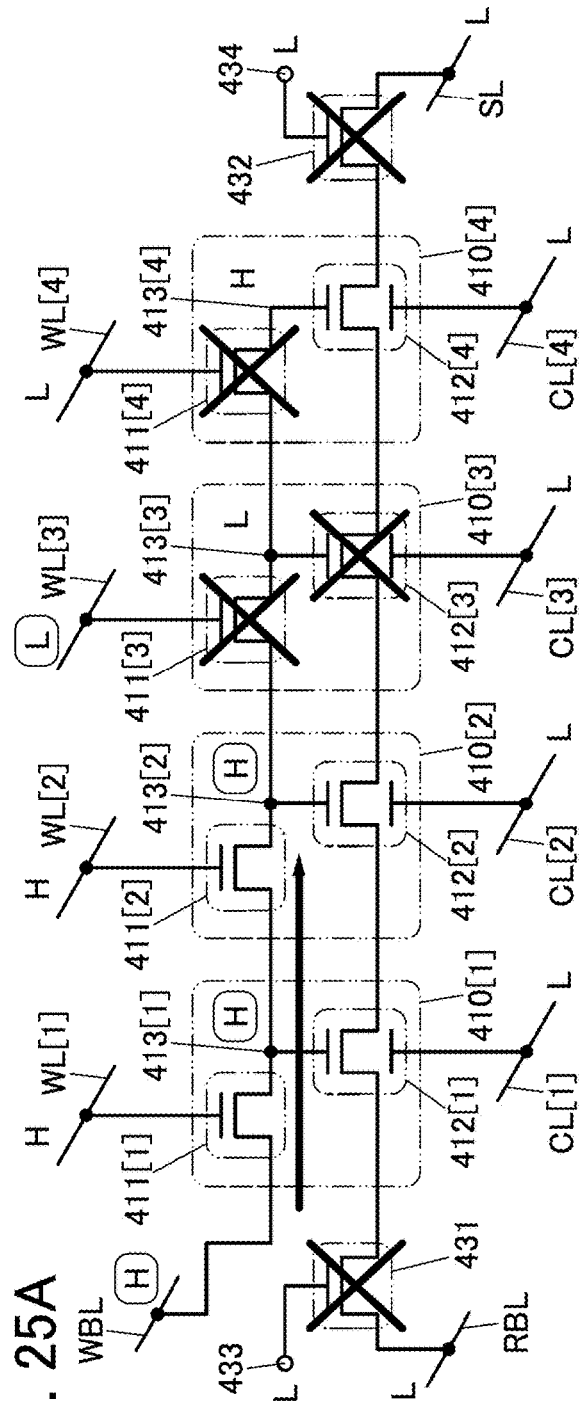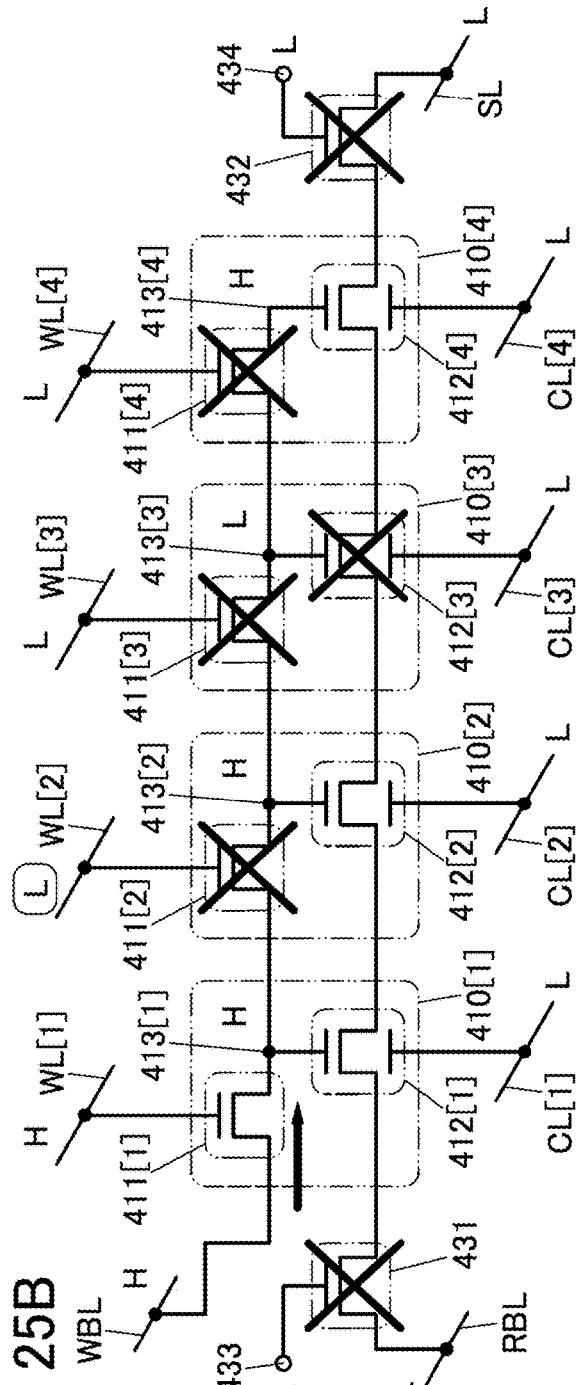

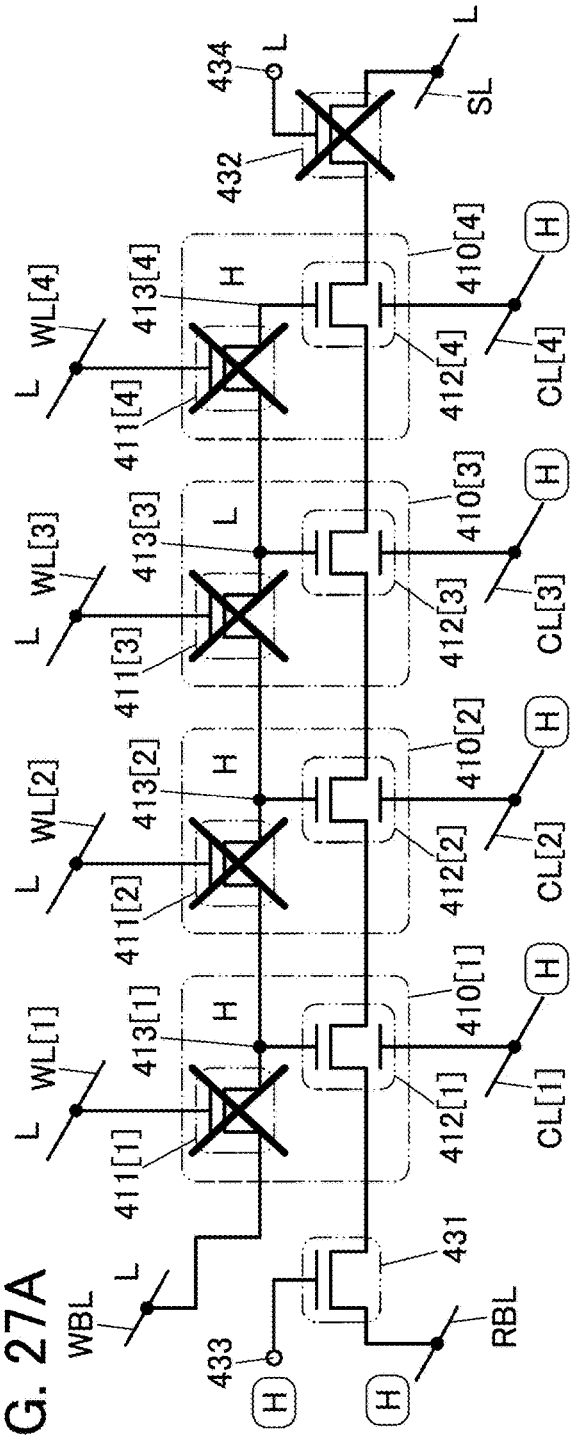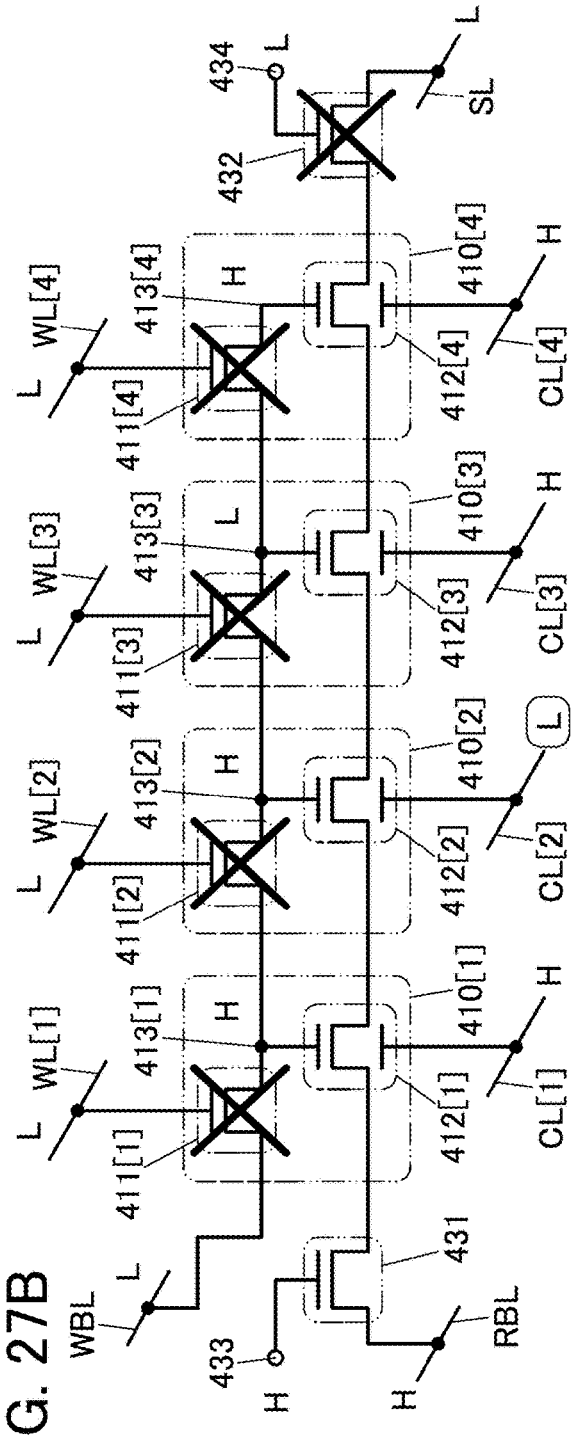

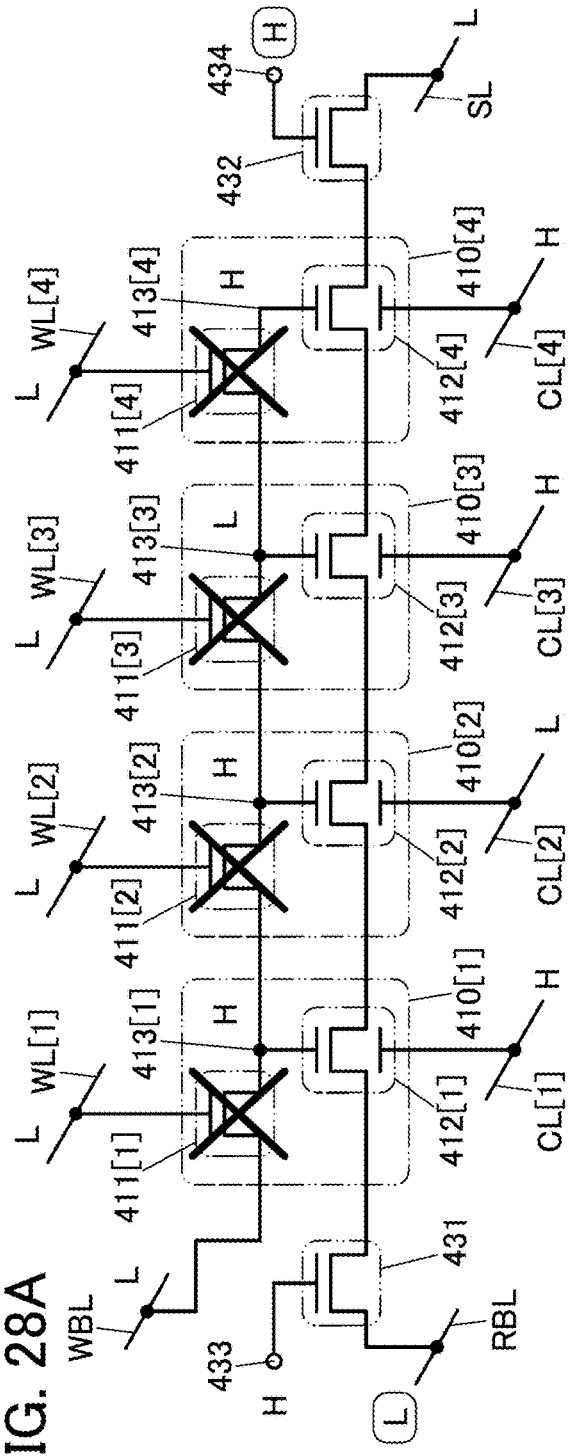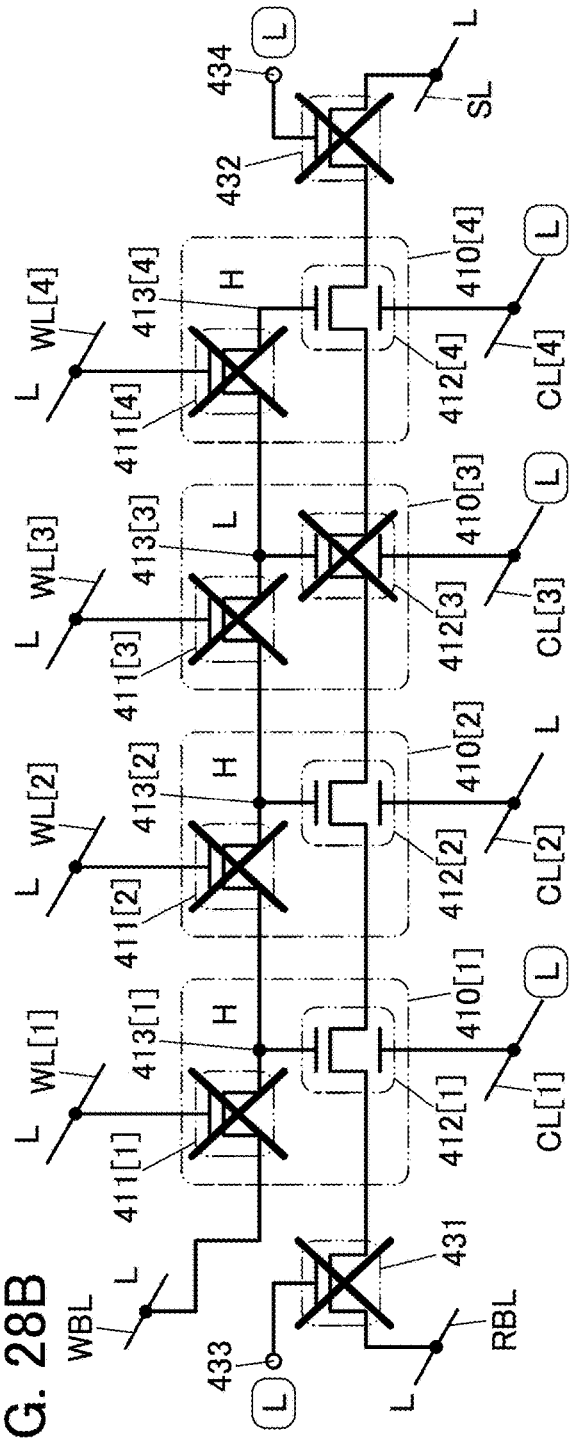

MEMORY DEVICE, OPERATION METHOD OF MEMORY DEVICE, DATA PROCESSING DEVICE, DATA PROCESSING SYSTEM, AND ELECTRONIC DEVICE

This application is a 371 of international application PCT/IB2020/059740 filed on Oct. 16, 2020 which is incorporated herein by reference.

TECHNICAL FIELD

The present invention relates to a memory device. In particular, the present invention relates to a memory device (also referred to as a semiconductor memory device or memory) utilizing semiconductor characteristics.

Note that one embodiment of the present invention is not limited to the above technical field. The technical field of the invention disclosed in this specification and the like relates to an object, a method, or a manufacturing method. One embodiment of the present invention relates to a process, a machine, manufacture, or a composition of matter.

BACKGROUND ART

Hard disc drives (HDDs) have mainly been used for a long time as nonvolatile memory devices used for data processing devices such as a personal computer (PC), a server, a data center, and the like. Recently, solid state drives (SSDs) that are lightweight, have no physical operation portions, perform high-speed data reading and writing have been widely spreading.

Many SSDs are formed using a NAND flash memory and a controller. A flash memory is a nonvolatile memory device that stores data electrically. An SSD sometimes includes a cache memory (also referred to as a buffer memory), which enables especially higher-speed data writing operation. A DRAM (Dynamic Random Access Memory), an SRAM (Static RAM), or the like is used as a cache memory of an SSD. A DRAM and an SRAM are volatile memory devices. Note that in this specification and the like, a memory device utilizing semiconductor characteristics, such as a DRAM, an SRAM, or a flash memory, is referred to as a semiconductor memory device (also referred to as memory).

Meanwhile, a transistor including an oxide semiconductor or a metal oxide in a channel formation region (also referred to as an oxide semiconductor (OS) transistor) is known. The OS transistor has a feature of extremely low drain current in an off-state (the current is also referred to as off-state current) (for example, see Non-Patent Documents 1 and 2), which has been attracting attention. The DRAM is a memory device that includes memory cells each being composed of one transistor and one capacitor and stores data by accumulating electric charge in the capacitor. Therefore, when the OS transistor is used in the memory cell of the DRAM, stored data can be retained for a long time.

In addition, a CAAC (c-axis aligned crystalline) structure and an nc (nanocrystalline) structure, which are neither single crystal nor amorphous, have been found in an oxide semiconductor (see Non-Patent Document 1 and Non-Patent Document 3). Non-Patent Document 1 and Non-Patent Document 3 also disclose a technique for fabricating a transistor using an oxide semiconductor having a CAAC structure.

REFERENCE

Non-Patent Document

[Non-Patent Document 1] S. Yamazaki et al., "Properties of crystalline In—Ga—Zn-oxide semiconductor and its transistor characteristics", Jpn. J. Appl. Phys., vol. 53, 04ED18 (2014).

[Non-Patent Document 2] K. Kato et al., "Evaluation of Off-State Current Characteristics of Transistor Using Oxide Semiconductor Material, Indium-Gallium-Zinc Oxide", Jpn. J. Appl. Phys., vol. 51, 021201 (2012).

[Non-Patent Document 3] S. Yamazaki et al., "SID Symposium Digest of Technical Papers", 2012, volume 43, issue 1, pp. 183-186.

[Non-Patent Document 4] S. Maeda et al., "A 20 ns-Write 45 ns-Read and $10^{14}$-Cycle Endurance Memory Module Composed of 60 nm Crystalline Oxide Semiconductor Transistors", ISSCC 2018, SESSION 30, EMERGING MEMORIES, 30.4, pp. 484-486.

SUMMARY OF THE INVENTION

Problems to be Solved by the Invention

An SSD is manufactured in such a manner that a NAND flash memory, a controller, and a cache memory are soldered to a printed circuit board as electronic components. That is, the NAND flash memory, the controller, and the cache memory are separate chips, which are electrically connected to each other with wirings provided for the printed circuit board.

However, there have been some problems in the wirings provided for the printed circuit board: the wirings provided for the printed circuit board are longer than wirings provided in the individual chips, signal transmission through the wirings provided in the printed circuit board has large delay, and power consumption is high due to parasitic capacitance or the like, for example. In particular, these problems have great influence between the NAND flash memory and the controller, and between the controller and the cache memory, where a massive amount of data is transferred and received. In addition, the NAND flash memory needs a high voltage in data writing and data erasing, and insulators have different thicknesses and the like; thus, it has been difficult to fabricate the NAND flash memory and the cache memory in one chip.

An object of one embodiment of the present invention is to provide a memory device in which a NAND flash memory and a controller are connected by a short wiring, and the controller and a cache memory are connected by a short wiring. Another object of one embodiment of the present invention is to provide a memory device in which a NAND flash memory and a cache memory are fabricated in one chip. Another object of one embodiment of the present invention is to provide a low-power SSD in which a NAND flash memory and a controller are connected by a short wiring and the controller and a cache memory are connected by a short wiring.

Note that one embodiment of the present invention does not necessarily have to achieve all the above-described objects and only needs to achieve at least one of the objects. The descriptions of the above objects do not preclude the existence of other objects. Objects other than these will be apparent from the descriptions of the specification, the claims, the drawings, and the like, and objects other than these can be derived from the descriptions of the specification, the claims, the drawings, and the like.

Means for Solving the Problems

One embodiment of the present invention is a data processing device including a first layer and a second layer. An arithmetic processing device is provided in the first layer, and a memory cell portion is provided in the second layer.

The arithmetic processing device has a function of performing arithmetic processing and a function of driving or controlling the memory cell portion. The memory cell portion has a function of retaining stored data in a state where no power is supplied. The memory cell portion has a random access function. At least part of the second layer is provided to be stacked over the first layer.

In the above embodiment, the first layer includes a single crystal silicon substrate, and the arithmetic processing device includes a first transistor formed with the single crystal silicon substrate. The memory cell portion includes a second transistor, and the second transistor includes a metal oxide in a channel formation region.

In the above embodiment, the first layer includes an SOI substrate, and the arithmetic processing device includes a first transistor formed with the SOI substrate. The memory cell portion includes a second transistor, and the second transistor includes a metal oxide in a channel formation region.

Another embodiment of the present invention is a memory device including a first layer, a second layer, and a third layer. A circuit is provided in the first layer, a first memory cell portion is provided in the second layer, and a second memory cell portion is provided in the third layer. The circuit has a function of driving or controlling the first memory cell portion and the second memory cell portion. The first memory cell portion has a function of retaining stored data for a longer time than the second memory cell portion, in a state where no power is supplied. The second memory cell portion has a function of performing data writing and data reading at higher speed than the first memory cell portion. At least part of the second layer is provided to be stacked over the first layer, and at least part of the third layer is provided to be stacked over the second layer.

In the above embodiment, the first layer includes a single crystal silicon substrate, and the circuit includes a first transistor formed with the single crystal silicon substrate. The second memory cell portion includes a second transistor, and the second transistor includes a metal oxide in a channel formation region.

In the above embodiment, the first layer includes an SOI substrate, and the circuit includes a first transistor formed with the SOI substrate. The second memory cell portion includes a second transistor, and the second transistor includes a metal oxide in a channel formation region.

Another embodiment of the present invention is an operation method of the memory device in the above embodiment. The circuit performs writing operation of storing data input to the memory device in the second memory cell portion, reads out the data stored in the second memory cell portion by the writing operation, and stores the data in the first memory cell portion.

Another embodiment of the present invention is a memory device including a first layer, a second layer, and a third layer. A circuit is provided in the first layer, a first memory cell portion is provided in the second layer, and a second memory cell portion is provided in the third layer. The circuit has a function of driving or controlling the first memory cell portion and the second memory cell portion. The first memory cell portion has a function of retaining stored data for a longer time than the second memory cell portion, in a state where no power is supplied. The second memory cell portion has a function of performing data writing and data reading at higher speed than the first memory cell portion. At least part of the second layer is provided to be stacked over the first layer, and at least part of the third layer is provided to be stacked over the second layer. The circuit has a function of performing a first operation in which data input to the memory device is stored in the second memory cell portion, and a function of performing a second operation in which the data stored in the second memory cell portion by the first operation is read out and stored in the first memory cell portion.

Another embodiment of the present invention is a memory device including a first layer, a second layer, and a third layer. A first circuit is provided in the first layer, a first memory cell portion is provided in the second layer, and a second memory cell portion is provided in the third layer. The second memory cell portion includes a second circuit and a memory cell array. The first circuit has a function of driving or controlling the first memory cell portion and the second circuit. The second circuit has a function of writing data to the memory cell array and a function of reading out data from the memory cell array. The first memory cell portion has a function of retaining stored data for a longer time than the second memory cell portion, in a state where no power is supplied. The second memory cell portion has a function of performing data writing and data reading at higher speed than the first memory cell portion. At least part of the second layer is provided to be stacked over the first layer, and at least part of the third layer is provided to be stacked over the second layer.

In the above embodiment, the first layer includes a single crystal silicon substrate, and the circuit includes a first transistor formed with the single crystal silicon substrate. The second memory cell portion includes a second transistor, and the second transistor includes a metal oxide in a channel formation region.

In the above embodiment, the first layer includes an SOI substrate, and the circuit includes a first transistor formed with the SOI substrate. The second memory cell portion includes a second transistor, and the second transistor includes a metal oxide in a channel formation region.

Another embodiment of the present invention is a memory device including a first layer, a second layer, and a third layer. A circuit is provided in the first layer, a memory cell portion is provided in the second layer, and a first RF block circuit is provided in the third layer. The circuit has a function of driving or controlling the memory cell portion and the first RF block circuit. The memory cell portion has a function of retaining stored data in a state where no power is supplied. At least part of the second layer is provided to be stacked over the first layer, and at least part of the third layer is provided to be stacked over the second layer.

Another embodiment of the present invention is a data processing system including the memory device in the above embodiment and a central management unit. The central management unit includes a central processing unit and a second RF block circuit. The memory device is electrically connected to the central processing unit through the first RF block circuit and the second RF block circuit.

Another embodiment of the present invention is an electronic device including the data processing device of the above embodiment.

Another embodiment of the present invention is an electronic device including the memory device of the above embodiment.

In the above embodiment, the electronic device is a computer, a supercomputer, a smartphone, or an IoT terminal device.

Effect of the Invention

According to one embodiment of the present invention, a memory device in which a NAND flash memory and a controller are connected by a short wiring, and the controller and a cache memory are connected by a short wiring can be provided. According to another embodiment of the present invention, a memory device in which a NAND flash memory and a cache memory are fabricated in one chip can be provided. According to another embodiment of the present invention, a low-power SSD in which a NAND flash memory and a controller are connected by a short wiring and the controller and a cache memory are connected by a short wiring can be provided.

Note that the descriptions of these effects do not preclude the existence of other effects. One embodiment of the present invention does not necessarily have to have all the effects. Effects other than these are apparent from the descriptions of the specification, the claims, the drawings, and the like, and effects other than these can be derived from the descriptions of the specification, the claims, the drawings, and the like.

BRIEF DESCRIPTION OF THE DRAWINGS

FIG. 20A is a table showing classifications of crystal structures of IGZO. FIG. 20B is a graph showing an XRD spectrum of a CAAC-IGZO film. FIG. 20C is an image showing nanobeam electron diffraction patterns of a CAAC-IGZO film.

FIG. 22A is a circuit diagram illustrating a structure example of a memory device. FIG. 22B to FIG. 22D are circuit diagrams each illustrating a structure example of a memory element.

FIG. 24A and FIG. 24B are circuit diagrams illustrating a writing operation.

FIG. 25A and FIG. 25B are circuit diagrams illustrating the writing operation.

FIG. 27A and FIG. 27B are circuit diagrams illustrating a reading operation.

FIG. 28A and FIG. 28B are circuit diagrams illustrating the reading operation.

MODE FOR CARRYING OUT THE INVENTION

Figure 1A:
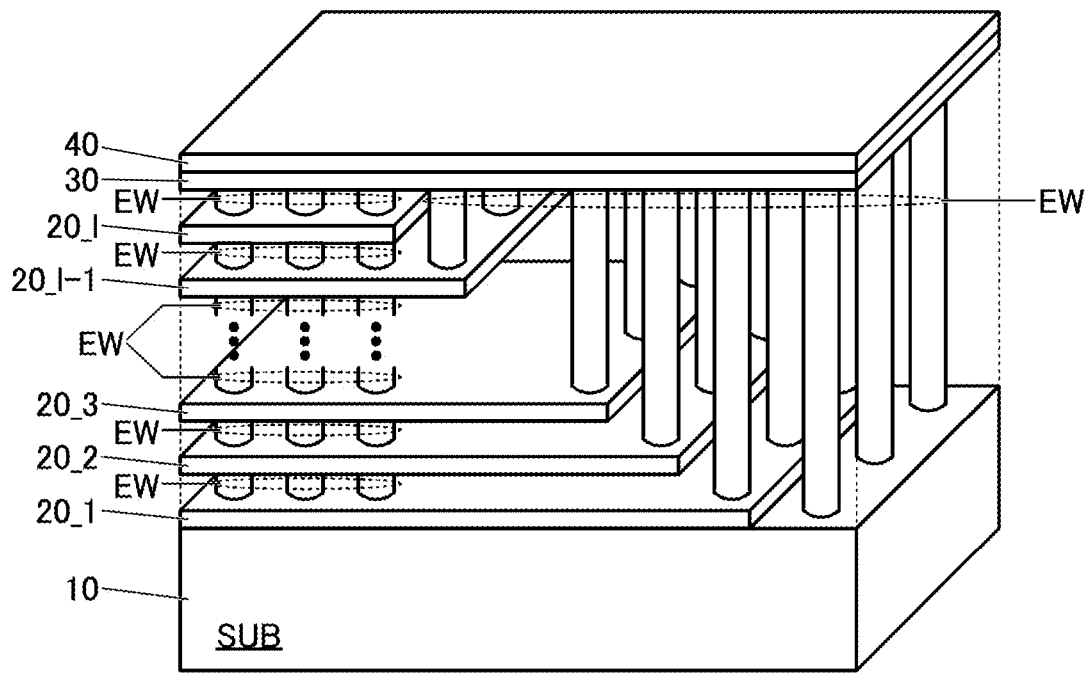
FIG. 1A and FIG. 1B are schematic perspective views illustrating a structure example of a memory device.

Embodiments will be described below with reference to the drawings. However, the embodiments can be implemented in many different modes, and it will be readily appreciated by those skilled in the art that modes and details thereof can be changed in various ways without departing from the spirit and scope thereof. Thus, the present invention should not be construed as being limited to the following description of the embodiments.

A plurality of embodiments described below can be combined as appropriate. In addition, in the case where a plurality of structure examples are described in one embodiment, the structure examples can be combined as appropriate.

Note that in the drawings attached to this specification, the block diagram in which components are classified according to their functions and shown as independent blocks is illustrated; however, it is difficult to completely separate actual components according to their functions, and it is possible for one component to relate to a plurality of functions.

In the drawings and the like, the size, the layer thickness, the region, or the like is exaggerated for clarity in some cases. Therefore, they are not limited to the illustrated scale. The drawings schematically show ideal examples, and shapes, values, or the like are not limited to shapes, values, or the like shown in the drawings.

In the drawings and the like, the same components, components having similar functions, components formed of the same material, components formed at the same time, or the like are sometimes denoted by the same reference numerals, and description thereof is not repeated in some cases.

In this specification and the like, the term "film" and the term "layer" can be interchanged with each other. For example, the term "conductive layer" can be changed into the term "conductive film" in some cases. As another example, the term "insulating film" can be changed into the term "insulating layer" in some cases.

In this specification and the like, the terms for describing arrangement such as "over" and "below" do not necessarily mean "directly over" and "directly below", respectively, in the positional relationship between components. For example, the expression "a gate electrode over a gate insulating layer" does not exclude the case where there is an additional component between the gate insulating layer and the gate electrode.

In this specification and the like, ordinal numbers such as "first", "second", and "third" are used in order to avoid confusion among components, and the terms do not limit the components numerically.

In this specification and the like, when a plurality of components are denoted by the same reference numerals, and in particular need to be distinguished from each other, an identification sign such as "_1", "_2", "[n]", or "[m, n]" is sometimes added to the reference numerals. For example, the second wiring GL is referred to as a wiring GL[2].

In this specification and the like, "electrically connected" includes the case where connection is made through an "object having any electric function". There is no particular limitation on the "object having any electric function" as long as electric signals can be transmitted and received between components that are connected through the object. Examples of the "object having any electric function" include a switching element such as a transistor, a resistor, an inductor, a capacitor, and other elements with a variety of functions as well as an electrode and a wiring. Furthermore, even when the expression "being electrically connected" is used, there is a case in which no physical connection portion is made and a wiring is just extended in an actual circuit.

In addition, in this specification and the like, the term "electrode" or "wiring" does not functionally limit these components. For example, an "electrode" is used as part of a "wiring" in some cases, and vice versa.

In this specification and the like, a "terminal" in an electric circuit refers to a portion where a current or a potential is input (or output) or a signal is received (or transmitted). Accordingly, part of a wiring or an electrode functions as a terminal in some cases.

In general, a "capacitor" has a structure in which two electrodes face each other with an insulator (dielectric) therebetween. Furthermore, in this specification and the like, cases where a "capacitor" is one having a structure in which two electrodes face each other with an insulator therebetween, one having a structure in which two wirings face each other with an insulator therebetween, or one in which two wirings are positioned with an insulator therebetween, are included.

In this specification and the like, a "voltage" often refers to a potential difference between a given potential and a reference potential (e.g., a ground potential). Thus, a voltage and a potential difference can be interchanged with each other.

In this specification and the like, a transistor is an element having at least three terminals of a source, a drain, and a gate. Further, a channel formation region is included between the source (a source terminal, a source region, or a source electrode) and the drain (a drain terminal, a drain region, or a drain electrode), and a current can flow between the source and the drain through the channel formation region. Note that in this specification and the like, a channel formation region refers to a region through which a current mainly flows.

Furthermore, functions of a source and a drain might be switched when a transistor of opposite polarity is employed or the direction of current flow is changed in circuit operation, for example. Thus, the terms of a source and a drain are interchangeable in this specification and the like.

Furthermore, unless otherwise specified, an off-state current in this specification and the like refers to a drain current of a transistor in an off state (also referred to as a non-conduction state or a cutoff state). Unless otherwise specified, the off state of an n-channel transistor refers to a state where the voltage Vgs of a gate with respect to a source is lower than a threshold voltage Vth, and the off state of a p-channel transistor refers to a state where the voltage Vgs of a gate with respect to a source is higher than a threshold voltage Vth. That is, the off-state current of an n-channel transistor sometimes refers to a drain current at the time when the voltage Vgs of a gate with respect to a source is lower than the threshold voltage Vth.

In the above description of the off-state current, the drain may be replaced with the source. That is, the off-state current sometimes refers to a source current when a transistor is in the off state. In addition, a leakage current sometimes expresses the same meaning as the off-state current. Furthermore, in this specification and the like, the off-state current sometimes refers to a current that flows between a source and a drain when a transistor is in the off state.

Furthermore, in this specification and the like, an on-state current sometimes refers to a current that flows between a source and a drain when a transistor is in the on state (also referred to as a conduction state).

In this specification and the like, a metal oxide means an oxide of metal in a broad sense. Metal oxides are classified into an oxide insulator, an oxide conductor (including a transparent oxide conductor), an oxide semiconductor, and the like.

For example, in the case where a metal oxide is used in a channel formation region of a transistor, the metal oxide is referred to as an oxide semiconductor in some cases. That is to say, in the case where a metal oxide has at least one of an amplifying function, a rectifying function, and a switching function, the metal oxide can be referred to as a metal oxide semiconductor. In other words, a transistor including a metal oxide in a channel formation region can be referred to as an "oxide semiconductor transistor" or an "OS transistor". Similarly, a "transistor using an oxide semiconductor" is also a transistor including a metal oxide in a channel formation region.

Furthermore, in this specification and the like, a metal oxide containing nitrogen is also referred to as a metal oxide in some cases. A metal oxide containing nitrogen may be referred to as a metal oxynitride. The details of a metal oxide will be described later.

Embodiment 1

In this embodiment, structure examples of a memory device of one embodiment of the present invention will be described.

<Structure Example of Memory Device>

FIG. 1A is a schematic perspective view illustrating a structure example of a memory device 100 of one embodiment of the present invention. The memory device 100 includes a layer 10, a layer 20_1 to a layer 20_*l* (*l* is an integer of 2 or more), a layer 30, a layer 40, and wirings EW.

Note that in this specification and the like, a reference numeral such as "_1" or "_2" is used to distinguish a plurality of components having similar functions. In other words, description is made using the reference numeral of the layer 20 when a given layer among the layer 20_1 to the layer 20_*l* is referred to, whereas description is made using the reference numeral of the layer 20_1, the layer 20_2, or the like when one of them needs to be specified.

As illustrated in FIG. 1A, the memory device 100 has a structure in which the layer 20_1 is stacked over the layer 10, the layer 20_*k*+1 is stacked over the layer 20_*k* (*k* is an integer of 1 or more and *l*−1 or less), the layer 30 is stacked over the layer 20_*l*, and the layer 40 is stacked over the layer 30.

In the memory device 100, a first memory device is formed of the layer 10, the layer 20_1 to the layer 20_*l*, and the layer 30, and a second memory device is formed of the layer 10, the layer 30, and the layer 40. Here, the first memory device can be a three-dimensional NAND flash memory, for example. In the second memory device, for example, an OS transistor can be used in a memory cell portion to be described later.

Note that the first memory device is not limited to the three-dimensional NAND flash memory, and may be a two-dimensional NAND flash memory or a NOR flash memory. Alternatively, the first memory device may be a memory device using a nonvolatile memory element such as an MRAM (Magnetoresistive RAM), a PRAM (Phase change RAM), an ReRAM (Resistive RAM), or an FeRAM (Ferroelectric RAM), or a combination of the above memory devices.

The layer 10, the layer 20_1 to the layer 20_*l*, and the layer 40 are each provided with a circuit that can function by utilizing semiconductor characteristics. A circuit OSC is provided in the layer 10, a memory cell portion MCL is provided in the layer 20_1 to the layer 20_*l*, and a memory cell portion OMCL is provided in the layer 40. The layer 30 is a wiring layer where wirings are formed. That is, the first memory device includes the memory cell portion MCL, and the second memory device includes the memory cell portion OMCL.

Figure 1B:
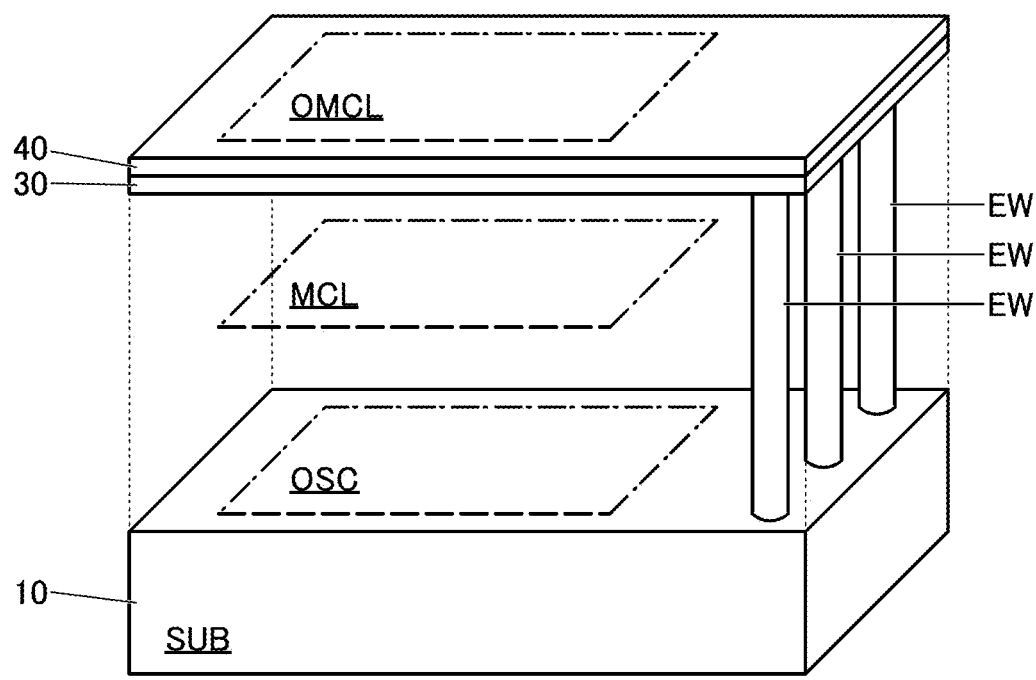

FIG. 1B is a schematic perspective view in which the layer 20_1 to the layer 20_*l* and the wirings EW connected to the layers 20 are omitted from FIG. 1A, and which illustrates the positional relationships between the circuit OSC, the memory cell portion MCL, and the memory cell portion OMCL. Note that in the drawings described in this specification and the like, the flow of main signals is indicated by an arrow or a line, and a power supply line and the like are omitted in some cases.

The circuit OSC has a function of a driver circuit or a control circuit of the memory cell portion MCL and the memory cell portion OMCL. The memory cell portion MCL includes a plurality of memory cells in the layer 20_1 to the layer 20_*l*, and data writing and data reading are performed by a write circuit, a read circuit, and the like included in the circuit OSC. Similarly, the memory cell portion OMCL includes a plurality of memory cells in the layer 40, and data writing and data reading are performed by the write circuit, the read circuit, and the like included in the circuit OSC.

The circuit OSC is formed using transistors formed with a substrate SUB. For example, a single crystal semiconductor substrate or a polycrystalline semiconductor substrate using silicon, silicon carbide, or the like as a material or a compound semiconductor substrate using silicon germanium or the like as a material can be used as the substrate SUB. Furthermore, an SOI substrate, a semiconductor substrate provided with a semiconductor element such as a strained transistor or a FIN-type transistor, a glass substrate of barium borosilicate glass, aluminoborosilicate glass, or the like, a ceramic substrate, a quartz substrate, a sapphire substrate, or the like may be used as the substrate SUB. Alternatively, a flexible substrate may be used as the substrate SUB. In this embodiment, a case in which a single crystal silicon substrate is used as the substrate SUB is described. Note that a transistor including silicon in a channel formation region is referred to as a Si transistor.

The circuit OSC and the memory cell portion MCL are electrically connected to each other through the wirings EW and the layer 30. The wiring EW has a function of electrically connecting the circuit OSC and the layer 30, and a function of electrically connecting the memory cells included in the memory cell portion MCL and the layer 30. Note that the wiring EW can be one or more kinds of wirings selected from a signal line, a power supply line for supplying a constant potential, a bit line (e.g., write bit line or read bit line), a word line, and the like. Similarly, the circuit OSC and the memory cell portion OMCL are electrically connected to each other through the wirings EW and the layer 30.

In the case where an OS transistor is used in the memory cell portion OMCL, the OS transistor can be formed by a method such as a thin-film method; thus, the memory cell portion OMCL can be provided to be stacked over the circuit OSC and the memory cell portion MCL. Specifically, the memory cell portion OMCL can be formed using an OS transistor over the circuit OSC and the memory cell portion MCL which are formed using Si transistors. Note that an OS transistor is a transistor including a metal oxide in a channel formation region.

The memory cell portion OMCL can be manufactured by a process different from those for manufacturing the circuit OSC and the memory cell portion MCL. An OS transistor has a lower formation temperature than a Si transistor; when the memory cell portion OMCL is formed using an OS transistor, heat effect on the Si transistors included in the circuit OSC and the memory cell portion MCL can be reduced. Moreover, since the memory cell portion OMCL is provided over the circuit OSC and the memory cell portion MCL to overlap with the circuit OSC and the memory cell portion MCL, the circuit area of the memory device 100 can be prevented from increasing.

Figure 2:
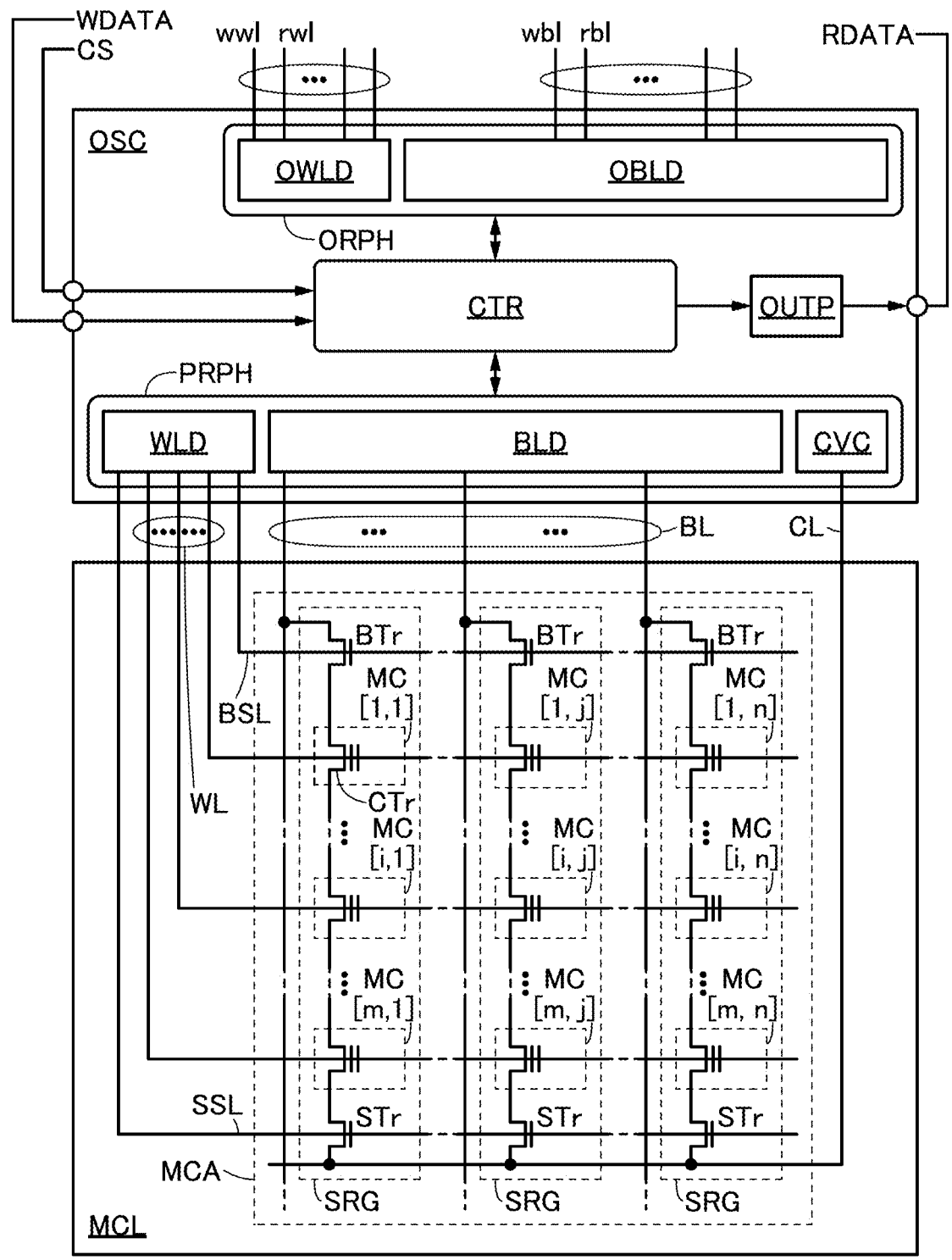
FIG. 2 is a block diagram illustrating a structure example of a circuit OSC and a memory cell portion MCL.

Next, a structure example of the circuit OSC and the memory cell portion MCL is described. FIG. 2 is a block diagram illustrating the structure example of the circuit OSC and the memory cell portion MCL.

<Memory Cell Portion MCL>

The memory cell portion MCL includes a memory cell array MCA. The memory cell array MCA includes a plurality of strings SRG. The strings SRG are electrically connected to wirings BL. Each string SRG includes a plurality of transistors CTr electrically connected in series, a selection transistor BTr, and a selection transistor STr. One transistor CTr functions as a cell transistor, which is included in a memory cell MC of the string SRG.

In general, a cell transistor is a transistor that operates with normally-on characteristics and includes a control gate and a charge accumulation layer. The charge accumulation layer is provided in a region overlapping with a channel formation region with a tunnel insulating film therebetween, and the control gate is provided in a region overlapping with the charge accumulation layer with a blocking film therebetween. In the cell transistor, a tunnel current occurs when a write potential is applied to the control gate and a predetermined potential is applied to a first terminal or a second terminal of the cell transistor; hence, electrons are injected from the channel formation region into the charge accumulation layer of the cell transistor. Thus, the threshold voltage of a cell transistor in which electrons are injected into its charge accumulation layer is increased. Note that a floating gate may be used instead of the charge accumulation layer.

A channel formation region of each of the transistor BTr, the transistor CTr, and the transistor STr preferably includes any one or more materials selected from, for example, silicon, germanium, gallium arsenide, silicon carbide (SiC), and a metal oxide that will be described in Embodiment 5.

Particularly in the case where the channel formation region includes a metal oxide of any one or more selected from indium, an element M (e.g., aluminum, gallium, yttrium, or tin can be given as the element M), and zinc, the metal oxide sometimes functions as a wide gap semiconductor; thus, the transistor BTr, the transistor CTr, and the transistor STr including the metal oxide in these channel formation regions have extremely low off-state current characteristics. That is, the leakage current of the transistor BTr, the transistor CTr, and the transistor STr in the off state can be reduced, so that power consumption of the memory device can be reduced in some cases.

Although FIG. 2 illustrates an example in which the transistor BTr and the transistor STr are formed in the memory cell portion MCL, the transistor BTr and the transistor STr may be formed in the circuit OSC.

The memory cell array MCA includes a plurality of memory cells MC in the strings SRG. The plurality of memory cells MC are arranged in a matrix. The memory cell array MCA in FIG. 2 includes m memory cells in one column and n memory cells in one row, that is, m×n memory cells MC in total (m and n are each an integer of 2 or more). The memory cell MC which is positioned at an i-th row and a j-th column (i is an integer of 1 or more and m or less, and j is an integer of 1 or more and n or less) is represented as a memory cell MC[i, j] in FIG. 2. FIG. 2 only shows a memory cell MC[1, 1], a memory cell MC[i, 1], a memory cell MC[m, 1], a memory cell MC[1, j], the memory cell MC[i, j], a memory cell MC[m, j], a memory cell MC[1, n], a memory cell MC[i, n], and a memory cell MC[m, n], and omits other memory cells MC.

Wirings WL, the wirings BL, a wiring CL, a wiring BSL, and a wiring SSL shown in FIG. 2 correspond to the wirings EW shown in FIG. 1. The wirings WL are a plurality of word lines, and the wirings WL are each electrically connected to memory cells MC row by row. The wirings BL are a plurality of bit lines, and the wirings BL are each electrically connected to memory cells MC column by column. The wiring CL is a power supply line.

Next, a connection structure of the string SRG electrically connected to the wiring BL is described. One of a source and a drain of the transistor BTr is electrically connected to the wiring BL, and one of a source and a drain of the transistor STr is electrically connected to the wiring CL. One end of the plurality of transistors CTr electrically connected in series is electrically connected to the other of the source and the drain of the transistor BTr, and the other end of the plurality of transistors CTr electrically connected in series is electrically connected to the other of the source and the drain of the transistor STr.

The wiring BSL and the wiring SSL function as wirings for selecting a string on which an operation such as writing, reading, or erasing is performed. The wiring BSL is electrically connected to gates of the transistors BTr included in the memory cell portion MCL, and the wiring SSL is electrically connected to gates of the transistors STr included in the memory cell portion MCL.

Figure 3:
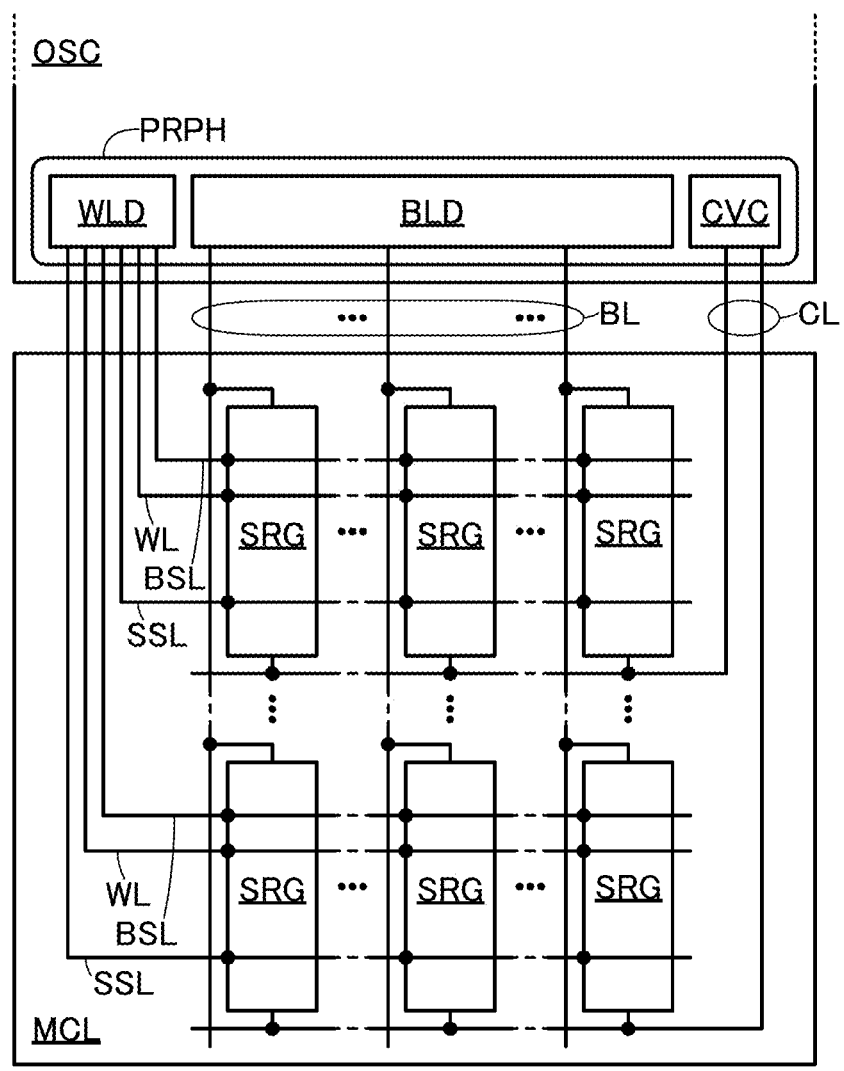
FIG. 3 is a block diagram illustrating a structure example of part of the circuit OSC and the memory cell portion MCL.

Although one wiring BL is electrically connected to one string SRG in the memory cell portion MCL in FIG. 2, one embodiment of the present invention is not limited thereto. For example, the memory cell portion MCL may have a structure in which one wiring BL is electrically connected to a plurality of strings SRG as illustrated in FIG. 3. Note that the block diagram of FIG. 3 illustrates the memory cell portion MCL and part of the circuit OSC.

<Circuit OSC>

The circuit OSC includes a control circuit CTR, a circuit PRPH, a circuit ORPH, and an output circuit OUTP. For example, control signals CS (e.g., a clock signal, a chip enable signal, a write enable signal, and an address signal) and a data signal WDATA are input to the control circuit CTR from the outside of the memory device 100.

The control circuit CTR has a function of accessing the circuit PRPH and writing data to the memory cell portion MCL and a function of reading out data from the memory cell portion MCL. In addition, the control circuit CTR has a function of accessing the circuit ORPH and writing data to the memory cell portion OMCL and a function of reading out data from the memory cell portion OMCL.

In the case where a write command by the control signal CS and the data signal WDATA are input to the control circuit CTR from the outside of the memory device 100, first, the data signal WDATA is written to the memory cell portion OMCL. Then, the written data is read out from the memory cell portion OMCL, and the read data is written to the memory cell portion MCL. That is, the memory cell portion OMCL has a function of a cache memory of the memory cell portion MCL. In the case where the data amount of the data signal WDATA is small, for example, the control circuit CTR may have a function of writing data directly to the memory cell portion MCL without through the memory cell portion OMCL.

In the case where a read command by the control signal CS is input to the control circuit CTR from the outside of the memory device 100, the control circuit CTR reads out data from the memory cell portion MCL (the control circuit CTR may read out data from the memory cell portion OMCL in the case where the data exists in the memory cell portion OMCL), and outputs the data to the output circuit OUTP. The output circuit OUTP outputs a data signal RDATA to the outside of the memory device 100. Note that the write command and the read command each include an address signal.

The control circuit CTR may have a function of detecting and correcting an error (also referred to as ECC: Error Check and Correct) in reading out data from the memory cell portion MCL. The memory cell portion OMCL can function as a cache memory when the control circuit CTR detects and corrects an error. The signals processed by the control circuit CTR and the functions of the control circuit CTR are not limited to the above; another signal may be input (or output) as necessary, and the control circuit CTR may have another function.

That is, the control circuit CTR writes the data signal WDATA input from the outside of the memory device 100 to the memory cell portion OMCL through the wiring EW, reads out the written data from the memory cell portion OMCL through the wiring EW, and writes the read data to the memory cell portion MCL also through the wiring EW. Since the data signal WDATA input from the outside of the memory device 100 transfers through the wiring EW in the memory device 100, the data transfer distance is short.

The memory device 100 includes the memory cell portion OMCL that can be used as a cache memory and has a short data transfer distance, and thus has the following features: high-speed operation is possible owing to small signal transmission delay, and an increase in power consumption due to parasitic capacitance or the like can be inhibited, for example.

The circuit PRPH includes a circuit WLD, a circuit BLD, and a circuit CVC, for example. The circuit WLD functions as a word line driver circuit and is electrically connected to the wirings WL. The circuit BLD functions as a bit line driver circuit and is electrically connected to the wirings BL. The circuit CVC functions as a power source that generates a constant potential and outputs the constant potential, and is electrically connected to the wiring CL. The circuit CVC is not necessarily included in the circuit PRPH; the circuit CVC may be provided outside the memory device 100, for example. In this case, the memory device 100 has a structure in which a constant potential is supplied to the memory cell portion MCL from the outside.

The circuit ORPH includes a circuit OWLD and a circuit OBLD, for example. The circuit OWLD functions as a word line driver circuit and is electrically connected to a wiring wwl and a wiring rwl. The circuit OBLD functions as a bit line driver circuit and is electrically connected to a wiring wbl and a wiring rbl.

<Memory Cell Portion OMCL>

Figure 4:
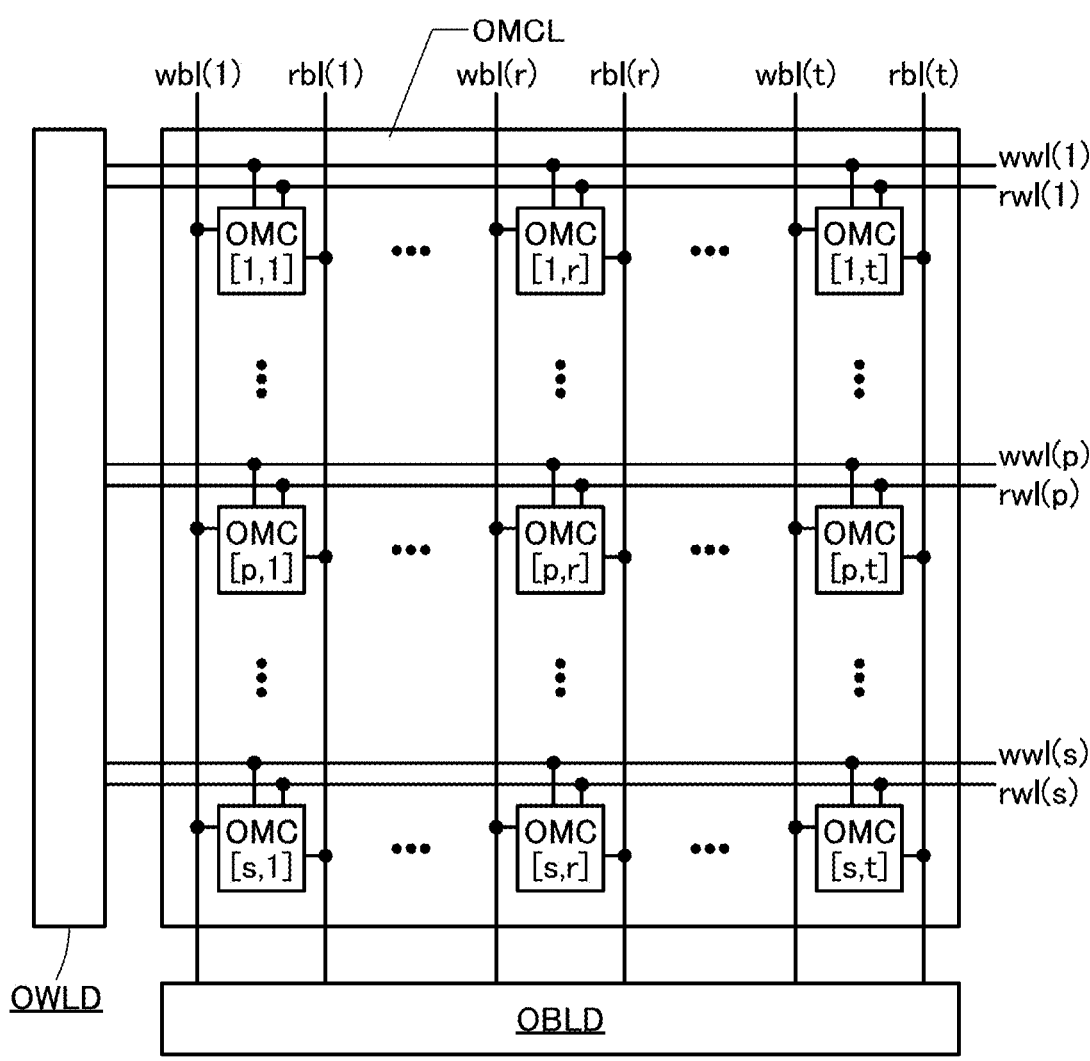
FIG. 4 is a block diagram illustrating a structure example of a memory cell portion OMCL.

Next, a structure example of the memory cell portion OMCL is described. FIG. 4 is a block diagram illustrating a structure example of the memory cell portion OMCL.

The memory cell portion OMCL includes s memory cells in one column and t memory cells in one row, that is, s×t memory cells OMC in total (s and t are each an integer of 2 or more). The memory cells OMC are arranged in a matrix. The memory cell OMC which is positioned at a p-th row and an r-th column (p is an integer of 1 or more and s or less, and r is an integer of 1 or more and t or less) is represented as a memory cell OMC[p, r] in FIG. 4. FIG. 4 only shows a memory cell OMC[1, 1], a memory cell OMC[p, 1], a memory cell OMC[s, 1], a memory cell OMC[1, r], the memory cell OMC[p, r], a memory cell OMC[s, r], a memory cell OMC[1, t], a memory cell OMC[p, t], and a memory cell OMC[s, t], and omits other memory cells OMC.

The wiring wwl and the wiring rwl correspond to the wiring EW shown in FIG. 1, and the wiring wwl and the wiring rwl are electrically connected to the memory cells OMC row by row. That is, the memory cell OMC[p, 1] to the memory cell OMC[p, t] are electrically connected to the circuit OWLD through the wiring wwl(p) and the wiring rwl(p). The wiring wbl and the wiring rbl correspond to the wiring EW shown in FIG. 1, and the wiring wbl and the wiring rbl are electrically connected to the memory cells OMC column by column. That is, the memory cell OMC[1, r] to the memory cell OMC[s, r] are electrically connected to the circuit OBLD through the wiring wbl(r) and the wiring rbl(r).

Figure 5A:
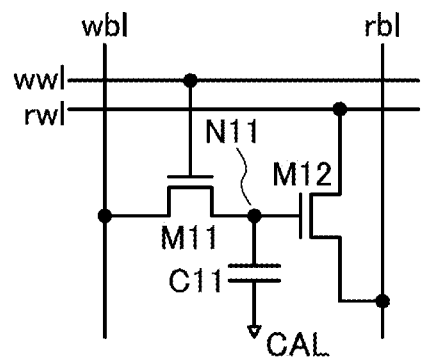
FIG. 5A to FIG. 5C are circuit diagrams each illustrating a structure example of a memory cell OMC.

FIG. 5A is a circuit diagram illustrating a structure example of the memory cell OMC. The memory cell OMC includes a transistor M11, a transistor M12, and a capacitor C11.

One of a source and a drain of the transistor M11 is electrically connected to a gate of the transistor M12 and one terminal of the capacitor C11, the other of the source and the drain of the transistor M11 is electrically connected to the wiring wbl, and a gate of the transistor M11 is electrically connected to the wiring wwl. One of a source and a drain of the transistor M12 is electrically connected to the wiring rbl, and the other of the source and the drain of the transistor M12 is electrically connected to the wiring rwl. The other terminal of the capacitor C11 is electrically connected to a wiring CAL. The wiring CAL functions as a wiring for applying a predetermined potential to the other terminal of the capacitor C11. A connection portion where the one of the source and the drain of the transistor M11, the gate of the transistor M12, and the one terminal of the capacitor C11 are electrically connected is referred to as a node N11.

In this specification and the like, expressions such as "terminal" are used in order to describe input and output of signals and potentials between components; however, in some cases, physical connecting portions such as "terminal" do not exist in the actual circuit and the components are just electrically connected to each other via wirings, electrodes, or the like.

In the memory cell OMC, the wiring wbl functions as a write bit line, the wiring rbl functions as a read bit line, the wiring wwl functions as a write word line, and the wiring rwl functions as a read word line. The transistor M11 has a function of a switch for controlling conduction or non-conduction between the node N11 and the wiring wbl.

Data writing is performed in such a manner that a high-level potential is applied to the wiring wwl to bring the transistor M11 into a conduction state, and thus the node N11 and the wiring wbl are electrically connected. Specifically, when the transistor M11 is in a conduction state, a potential corresponding to data written to the wiring wbl is applied, and the potential is written to the node N11. After that, a low-level potential is applied to the wiring wwl to bring the transistor M11 into a non-conduction state, whereby the potential of the node N11 is retained.

Data reading is performed in such a manner that a predetermined potential is applied to the wiring rbl, and after that, the wiring rbl is brought into an electrically floating state and a low-level potential is applied to the wiring rwl. Hereinafter, applying a predetermined potential to the wiring rbl to bring the wiring rbl into a floating state is expressed as precharging the wiring rbl.

For example, by precharging the wiring rbl with a potential Vdd, the transistor M12 has a potential difference between the source and the drain, and the current flowing between the source and the drain of the transistor M12 is determined depending on a potential retained at the node N11. Thus, the potential retained at the node N11 can be read by reading a change in the potential of the wiring rbl at the time when the wiring rbl is in a floating state.

A row where the memory cells OMC to which data is to be written are placed is selected by applying a high-level potential to the wiring wwl, and a row where the memory cells OMC from which data is to be read are placed is selected by applying a low-level potential to the wiring rwl. In contrast, a row where the memory cells OMC to which data is not written are placed can be in a non-selected state by applying a low-level potential to the wiring wwl, and a row where the memory cells OMC from which data is not read are placed can be in a non-selected state by applying, to the wiring rwl, the same potential as a potential with which the wiring rbl is precharged.

Figure 5B:
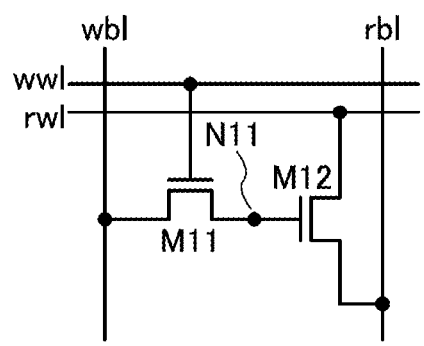

OS transistors can be used as the transistor M11 and the transistor M12. Since the OS transistor has an extremely low off-state current, a potential written to the node N11 can be retained for a long time when the OS transistor is used as the transistor M11. In other words, data written to the memory cell OMC can be retained for a long time. Alternatively, when the OS transistor is used as the transistor M11, the capacitance of the capacitor C11 may be made small in the memory cell OMC. Alternatively, when the OS transistor is used as the transistor M11, the memory cell OMC may have a structure without the capacitor C11 as illustrated in FIG. 5B. In the case where the memory cell OMC does not include the capacitor C11, a potential written to the node N11 is retained by the gate capacitance of the transistor M12, or the like.

The transistor M11 and the transistor M12 may each have a back gate (also referred to as a second gate or a bottom gate). In the case where the transistor M11 has a back gate, for example, the threshold voltage of the transistor M11 can be increased or decreased by application of a predetermined potential to the back gate of the transistor M11. Alternatively, when the back gate of the transistor M11 is electrically connected to the gate (also referred to as a first gate, a top gate, or a front gate with respect to the back gate) of the transistor M11, the on-state current of the transistor M11 can be increased.

Specifically, the threshold voltages negatively shift when a high potential is applied to the back gates of the transistor M11 and the transistor M12, and the threshold voltages positively shift when a low potential is applied to the back gates of the transistor M11 and the transistor M12. By shifting the threshold voltages negatively, the on-state current of the transistors can be increased, and the memory cell OMC can operate at high speed. By shifting the threshold voltages positively, the off-state current of the transistors can be decreased, and the memory cell OMC can retain data for a long time. Alternatively, different potentials may be applied to the back gates of the transistor M11 and the transistor M12. For example, the potential applied to the back gate of the transistor M11 may be low and the potential applied to the back gate of the transistor M12 may be high.

Alternatively, transistors other than the OS transistors may be used as the transistor M11 and the transistor M12. The transistor M11 and the transistor M12 are each preferably a transistor with a low off-state current, and for example, a transistor which includes a semiconductor with a wide band gap in a channel formation region can be used. The semiconductor with a wide band gap refers to a semiconductor whose band gap is larger than or equal to 2.2 eV in some cases, and examples thereof include silicon carbide, gallium nitride, and diamond.

The memory cell OMC is a gain-cell memory cell including two transistors and one capacitor, or including two transistors. A gain-cell memory cell can operate as a memory by amplifying accumulated electric charge by the closest transistor even when the capacity of accumulated electric charge is small. A gain-cell memory cell can read out retained data without destruction (non-destructive reading).

Alternatively, the memory cell OMC may have a structure composed of one transistor and one capacitor. The memory cell OMC illustrated in FIG. 5C includes a transistor M13 and a capacitor C12.

One of a source and a drain of the transistor M13 is electrically connected to one terminal of the capacitor C12, the other of the source and the drain of the transistor M13 is electrically connected to a wiring abl, and a gate of the transistor M13 is electrically connected to a wiring awl. The other terminal of the capacitor C12 is electrically connected to the wiring CAL. A connection portion where the one of the source and the drain of the transistor M13 and the one terminal of the capacitor C12 are electrically connected is referred to as a node N12.

An OS transistor can be used as the transistor M13 like the transistor M11 and the transistor M12. In the memory cell OMC illustrated in FIG. 5C, the wiring abl functions as a bit line and the wiring awl functions as a word line.

Figure 5C:
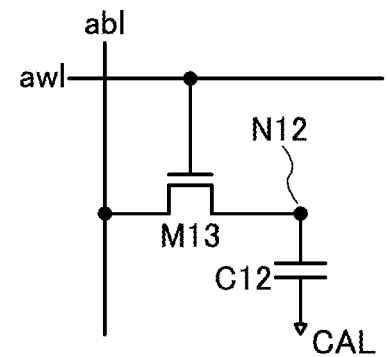

When the memory cell OMC has the structure illustrated in FIG. 5C, the arrangement density of the memory cells OMC can be improved, while data reading is destructive reading. The memory cell portion OMCL can perform random access to the memory cell OMC when the memory cell OMC included in the memory cell portion OMCL is the memory cell OMC illustrated in any of FIG. 5A, FIG. 5B, and FIG. 5C.

<Circuit BLD and Circuit OBLD>

Figure 6:
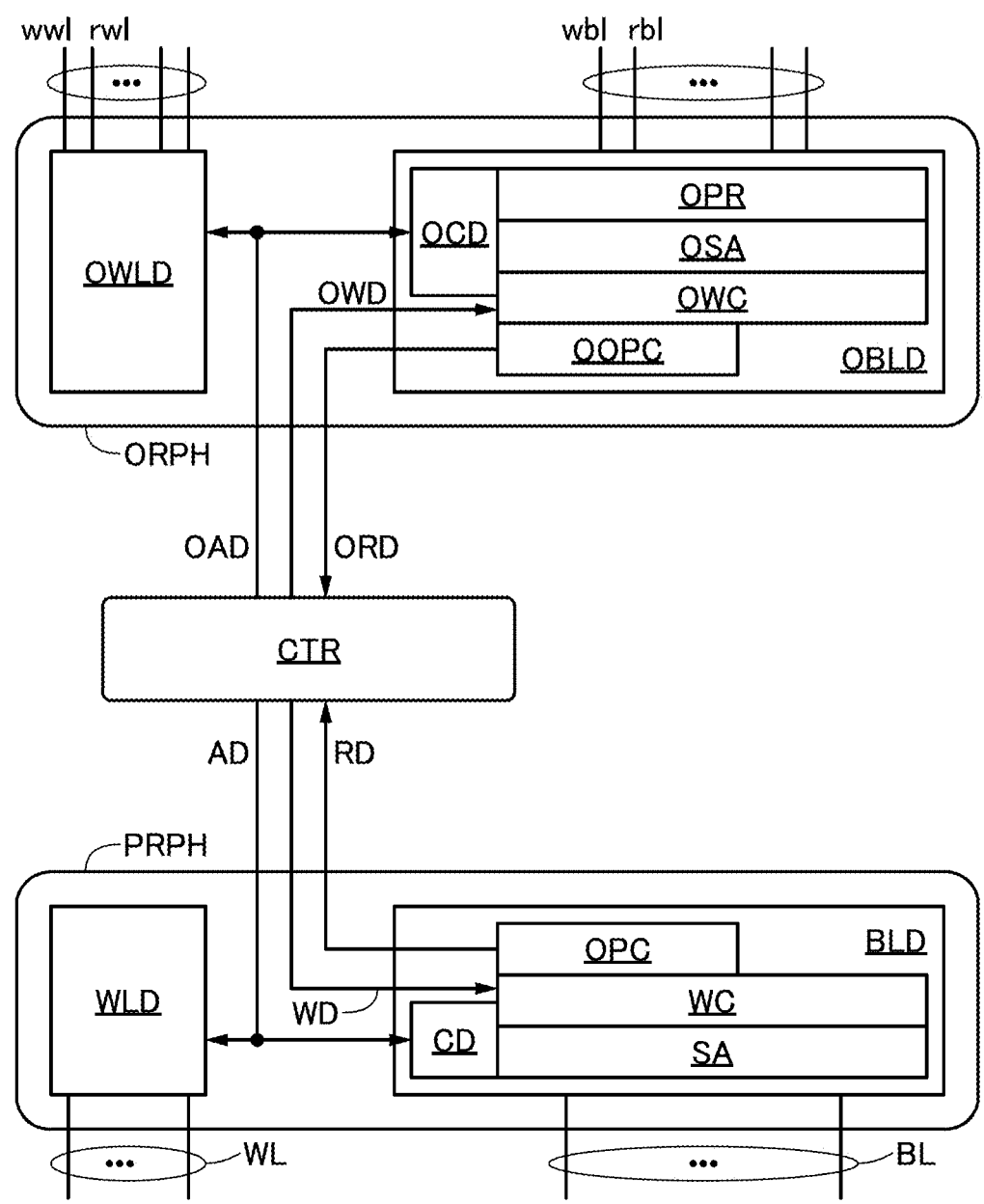
FIG. 6 is a block diagram illustrating a structure example of part of the circuit OSC.

The circuit BLD and the circuit OBLD included in the circuit OSC are specifically described. FIG. 6 is a block diagram illustrating a structure example of part of the circuit OSC. In FIG. 6, the output circuit OUTP, the circuit CVC, and the like are omitted from the circuit OSC illustrated in FIG. 2, and the structure example of the circuit BLD, the structure example of the circuit OBLD, and flow of signals in the circuit OSC are specifically shown.

The circuit BLD can have a structure including a column decoder CD, a write circuit WC, a sense amplifier SA, and an output circuit OPC, for example.

The column decoder CD has a function of selecting the wiring BL electrically connected to the memory cell MC on which data writing or data reading is to be performed in accordance with an address signal AD obtained from the control circuit CTR. Here, the address signal AD is an internal signal of the circuit OSC, and corresponds to an address signal included in the control signal CS. The address signal AD is also transmitted to the circuit WLD. The circuit WLD has a function of driving the wiring BSL, the wiring WL, and the wiring SSL and a function of selecting the wiring WL electrically connected to the memory cell MC on which data writing or data reading is to be performed in accordance with the address signal AD.

The write circuit WC has a function of supplying, to the wiring BL selected by the column decoder CD, a potential corresponding to the data signal WD supplied from the control circuit CTR. Here, the data signal WD is an internal signal of the circuit OSC and corresponds to a data signal ORD or the data signal WDATA.

The sense amplifier SA has a function of amplifying a data signal read out from the wiring BL. Note that the amplified data signal is output to the control circuit CTR through the output circuit OPC as a data signal RD. The control circuit CTR outputs a signal corresponding to the data signal RD to the output circuit OUTP.

The circuit OBLD can have a structure including a column decoder OCD, a write circuit OWC, a precharge circuit OPR, a sense amplifier OSA, and an output circuit OOPC, for example.

The column decoder OCD has a function of selecting the wiring wbl and the wiring rbl electrically connected to the memory cell OMC on which data writing or data reading is to be performed in accordance with an address signal OAD obtained from a control circuit CTR. Here, the address signal OAD is an internal signal of the circuit OSC. The address signal OAD is also transmitted to the circuit OWLD. The circuit OWLD has a function of driving the wiring wwl and the wiring rwl and a function of selecting the wiring wwl and the wiring rwl electrically connected to the memory cell OMC on which data writing or data reading is to be performed in accordance with the address signal OAD.

The write circuit OWC has a function of supplying, to the wiring wbl selected by the column decoder OCD, a potential corresponding to the data signal OWD supplied from the control circuit CTR. Here, the data signal OWD is an internal signal of the circuit OSC and corresponds to the data signal WDATA.

The precharge circuit OPR has a function of precharging the wiring rbl and the sense amplifier OSA has a function of amplifying a data signal read out from the wiring rbl. Note that the amplified data signal is output to the control circuit CTR through the output circuit OOPC as the data signal ORD. The control circuit CTR outputs a signal corresponding to the data signal ORD to the write circuit WC or the output circuit OUTP.

Note that the components of the circuit BLD and the circuit OBLD are not limited thereto; another component may be added if needed, or an unnecessary component may be omitted. The functions of the circuit BLD and the circuit OBLD are not limited thereto; another function may be added, or an unnecessary function may be omitted.

<Structure Example 2 of Memory Device>

In the above description of the memory device 100, the circuit OSC includes the control circuit CTR, the circuit PRPH, the circuit ORPH, and the output circuit OUTP (see FIG. 2) and the circuit OSC is provided in the layer 10; however, the circuit ORPH included in the circuit OSC may be provided in the layer 40.

Figure 7A:
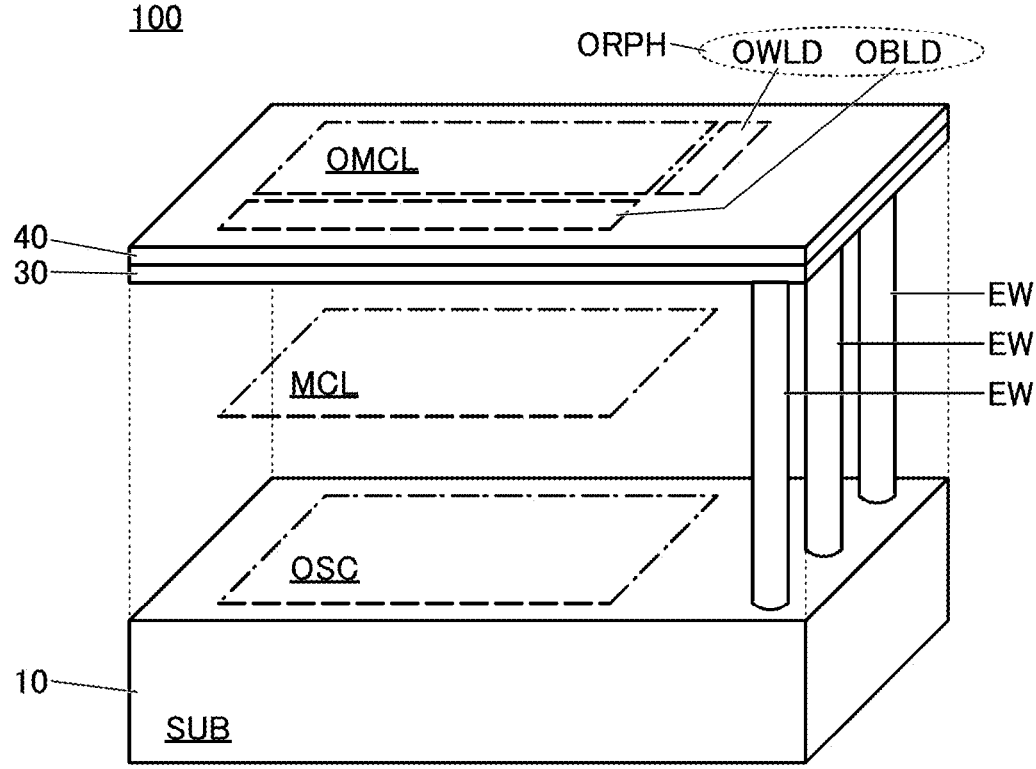
FIG. 7A and FIG. 7B are schematic perspective views illustrating structure examples of memory devices.

FIG. 7A is a schematic perspective view illustrating a structure example of the memory device 100 in which the circuit ORPH is provided in the layer 40. Note that in FIG. 7A, the layer 20_1 to the layer 20_l and the wirings EW connected to the layers 20 are omitted from FIG. 1A, as in FIG. 1B.

In FIG. 7A, the circuit OSC includes the control circuit CTR, the circuit PRPH, and the output circuit OUTP, the circuit ORPH includes the circuit OWLD and the circuit OBLD, and the circuit ORPH is provided in the layer 40 together with the memory cell portion OMCL.

In the case where the memory cell portion OMCL provided in the layer 40 is formed using an OS transistor, the circuit ORPH can also be formed using an OS transistor. An n-channel OS transistor has been practically used. In the case where the circuit ORPH is formed using an OS transistor, the circuit ORPH can be a single-polarity circuit using an n-channel transistor. Note that Non-Patent Document 4 can be referred to for a structure example in which the circuit ORPH is a single-polarity circuit using an n-channel transistor, for example.

In the case where the circuit ORPH is formed in the layer 40, the control circuit CTR can write the data signal WDATA input from the outside of the memory device 100 to the memory cell portion OMCL through the wiring EW, and write data read out from the memory cell portion OMCL to the memory cell portion MCL through the layer 30 and the wiring EW. That is, the number of times of data transfer through the wiring EW can be reduced, whereby the data transfer distance can be further shortened as compared to that in the memory device 100 illustrated in FIG. 1B.

<Structure Example 3 of Memory Device>

Figure 7B:
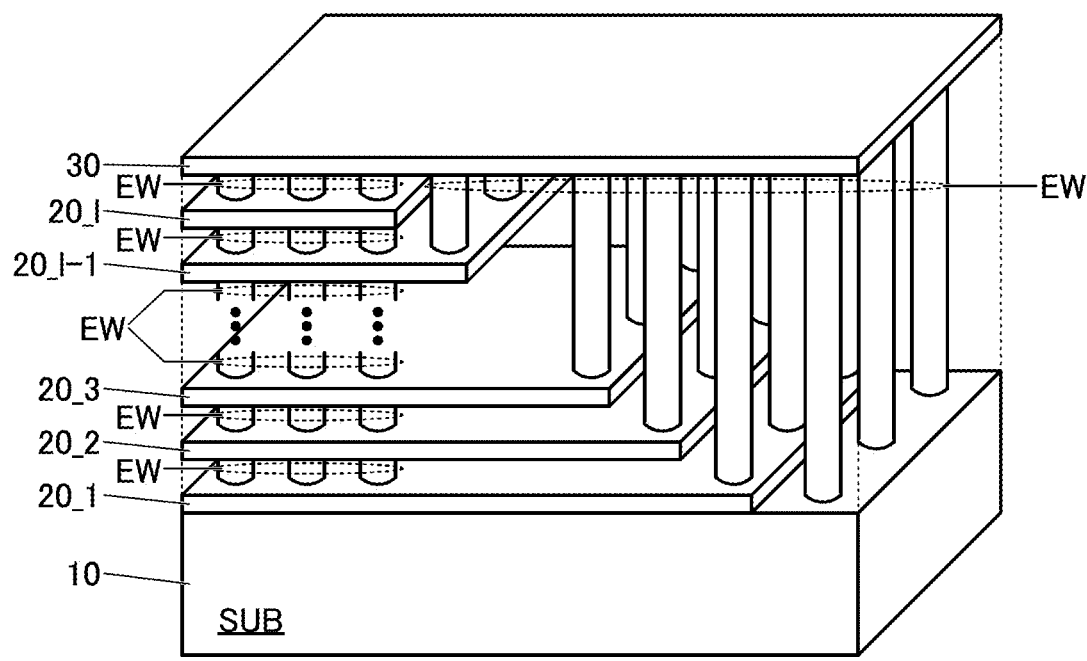

The above-described memory device 100 does not necessarily include the layer 40. FIG. 7B is a schematic perspective view illustrating a structure example of a memory device 110. The memory device 110 illustrated in FIG. 7B has a structure in which the layer 40 is omitted from the memory device 100 illustrated in FIG. 1A.

The memory device 110 does not include the layer 40 and thus has a structure without the memory cell portion OMCL. In the memory cell portion MCL of the memory device 110, the transistor BTr, the transistor CTr, and the transistor STr each include a metal oxide in a channel formation region. When the transistor BTr, the transistor CTr, and the transistor STr each include a metal oxide in a channel formation region, part of the first memory device can be used as a cache memory. Thus, the memory device 110 does not need the second memory device functioning as a cache memory and the memory device 110 can have a structure without the layer 40. Similarly, the memory device 110 can have a structure without the circuit ORPH.

Note that in this specification and the like, a three-dimensional NAND flash memory including a metal oxide in a channel formation region of each of the transistor BTr, the transistor CTr, and the transistor STr is referred to as a "3D OS NAND". Moreover, a three-dimensional NAND flash memory using Si transistors as the transistor BTr, the transistor CTr, and the transistor STr is referred to as a "3D NAND". For example, the above-described memory device 100 is a 3D NAND, and the above-described memory device 110 is a 3D OS NAND.

The 3D OS NAND, whose circuit structure example will be described later, is capable of random access, and has an extremely low off-state current of an OS transistor; thus, the 3D OS NAND can retain written data for one year or longer, furthermore, for 10 years or longer even after power supply is stopped. Hence, the 3D OS NAND can be regarded as a nonvolatile memory.

Since the amount of electric charge written to the 3D OS NAND hardly changes for a long period, multilevel (multi-bit) data as well as binary (1-bit) data can be retained in the 3D OS NAND.

Furthermore, the 3D OS NAND employs a method in which electric charge is written to a node through the OS transistor; hence, a high voltage, which a conventional flash memory requires, is unnecessary and a high-speed writing operation is possible. The 3D OS NAND does not require an erasing operation that is performed in a flash memory before data rewriting. Furthermore, the 3D OS NAND does not conduct charge injection and extraction to and from a floating gate or a charge-trap layer, substantially allowing an unlimited number of times of data writing and reading. The 3D OS NAND is less likely to degrade than a conventional flash memory and can have high reliability.

Unlike a magnetoresistive random access memory (MRAM), a resistive random access memory (ReRAM), and the like, the 3D OS NAND does not undergo a structure change at the atomic level. Hence, the 3D OS NAND has higher write endurance than a magnetoresistive random access memory and a resistive random access memory.

The off-state current of the OS transistor hardly increases even in a high-temperature environment. Specifically, the off-state current hardly increases even at an environment temperature of from room temperature to 200° C. In addition, the on-state current of the OS transistor is unlikely to decrease even in a high-temperature environment. A memory device including the OS memory achieves a stable operation and high reliability even in a high-temperature environment. Furthermore, the withstand voltage between the source and the drain of the OS transistor is high. When OS transistors are used as transistors included in a semiconductor device, the semiconductor device achieves a stable operation and high reliability even in a high-temperature environment.

Table 1 shows comparison of a 3D NAND memory device and a 3D OS NAND memory device.

TABLE 1

| Category | Item | 3D NAND | Comparison | 3D OS NAND | |
|---|---|---|---|---|---|
| 1. High-speed write or write/erase | Write speed per page | 300 μs/page | > | 1 to 3 μs/page (assuming 32 layers) | ○ |
| | Write/erase speed per block | 2 ms/block | >> | 2.6 μs/block (assuming 32 layers) | ◎ |
| 2. High-speed read | Read speed per page | 50 μs/page | = | 50 μs/page (assuming 32 layers) | — |
| 3. No high voltage | Programming voltage Vph | 12 to 20 V | >> | 3 to 5 V | ○ |
| | Programming voltage Vpl | 0 V | ≈ | −3 to 0 V | — |
| | Logic voltage Vc | 1.2 V | = | 1.2 V | — |
| 4. No rewrite degradation | Write endurance | $10^3$ to $10^5$ cycles | << | $10^{12}$ cycles or more | ◎ |
| 5. Erase operation per block | — | Necessary | | Not necessary | ○ |
| 6. Multilevel | How much levels are possible? | 4 bits/cell (16 levels) | | ≈4 bits/cell (16 levels) | — |
| 7. Applicable to non-von Neumann architecture | Ease of stacking, Ease of access | Need cache memory | | No need of external cache memory | ○ |
| 8. Power consumption | — | 8 W (for SSD) | >> | Much smaller than 3D NAND | ◎ |

× □worse, □better, □best

Figure 8:
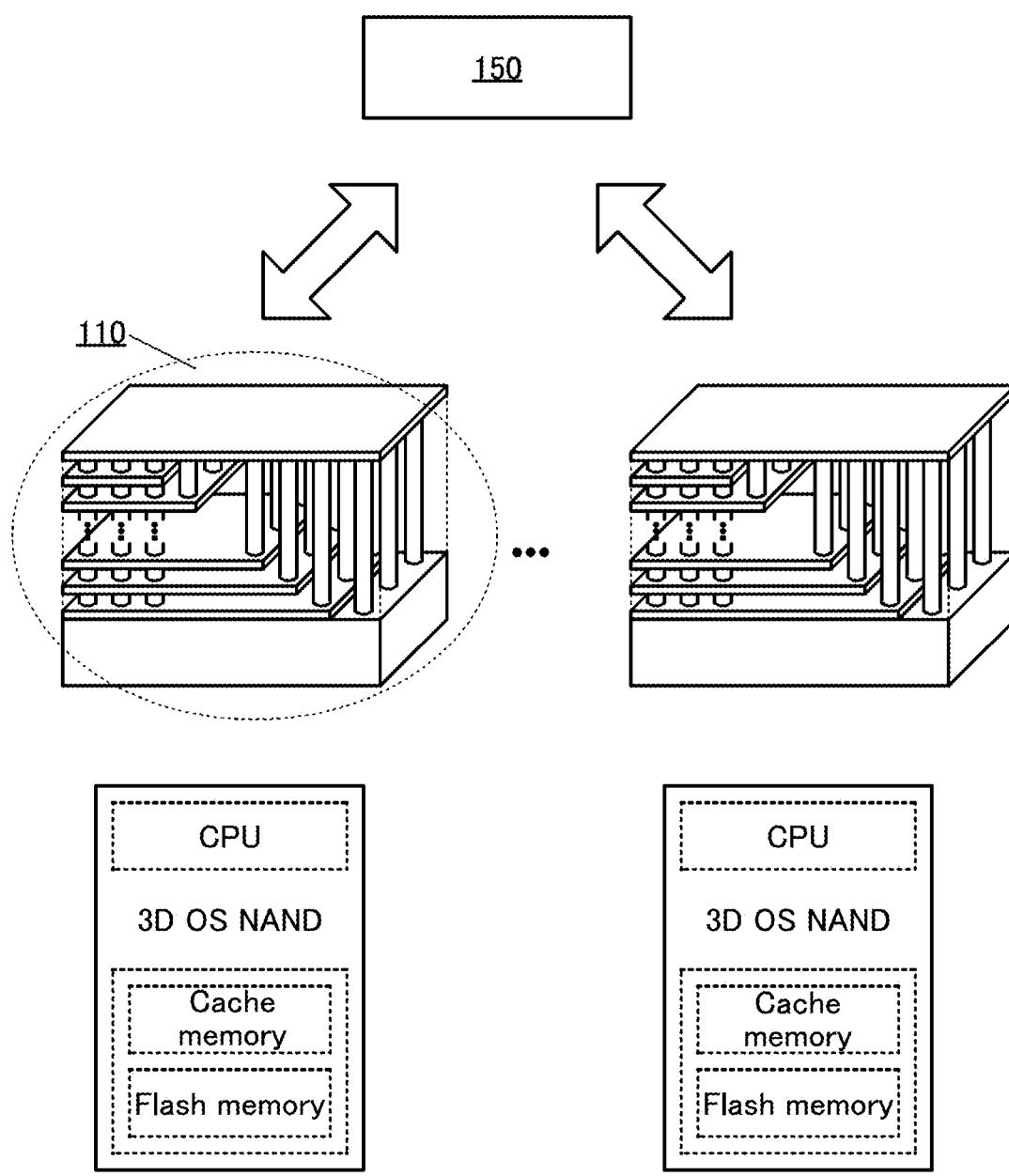
FIG. 8 illustrates an example of a data processing system constructed of a plurality of memory devices.

When the memory device 110 employs an arithmetic processing device such as a CPU (Central Processing Unit) or a GPU (Graphics Processing Unit) for the control circuit CTR included in the circuit OSC, the memory device 110 can serve as a flash memory having an arithmetic processing function. The memory device 110 illustrated in FIG. 8 is a 3D OS NAND (also referred to as a data processing device) having functions of a CPU, a NAND flash memory, and a cache memory. That is, functions of a CPU, a NAND flash memory, and a cache memory can be formed in one chip.

FIG. 8 illustrates the state where a plurality of memory devices 110 (3D OS NAND) are included and a host 150 manages the plurality of memory devices 110. Each memory device 110 has an arithmetic processing function, and can perform parallel writing and reading on the flash memory and the cache memory. That is, when the host 150 manages the plurality of memory devices 110 as illustrated in FIG. 8, a data processing system enabling non-von Neumann computing can be constructed.

Note that this embodiment can be implemented in appropriate combination with the other embodiments described in this specification.

Embodiment 2

In this embodiment, a structure example of a memory device of one embodiment of the present invention and a structure example of a data processing system including the memory device are described.

Figure 9A:
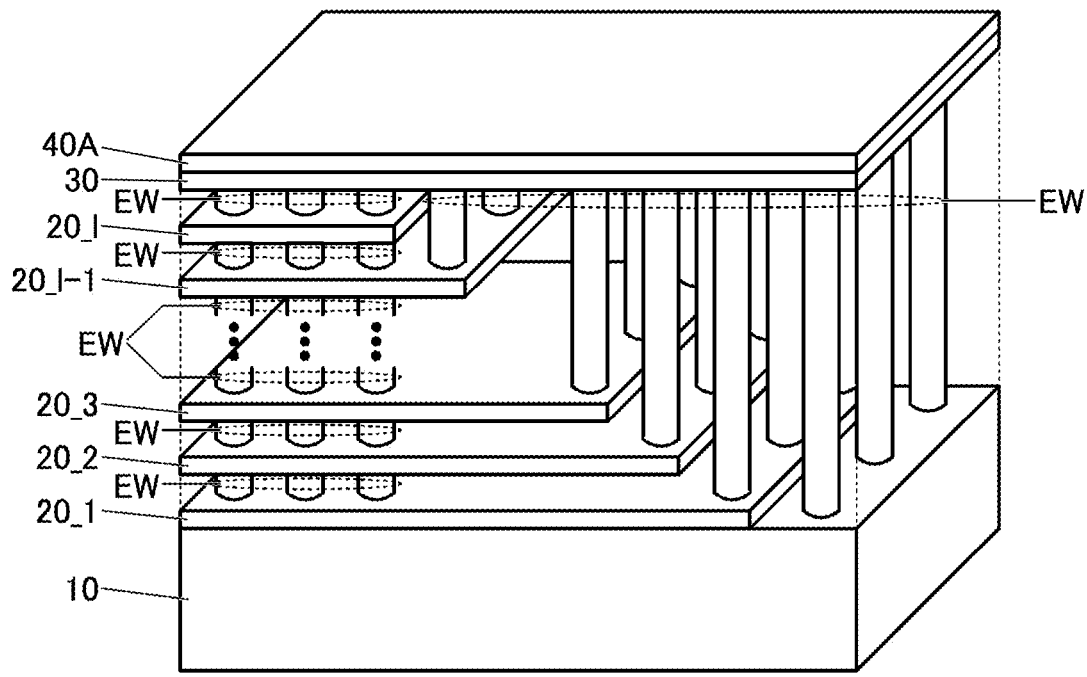
FIG. 9A and FIG. 9B are schematic perspective views illustrating a structure example of a memory device.

FIG. 9A is a schematic perspective view illustrating a structure example of a memory device 100A of one embodiment of the present invention. The memory device 100A includes the layer 10, the layer 20_1 to the layer 20_l (l is an integer of 2 or more), the layer 30, a layer 40A, and the wirings EW.

As illustrated in FIG. 9A, the memory device 100A has a structure in which the layer 20_1 is stacked over the layer 10, the layer 20_k+1 is stacked over the layer 20_k (k is an integer of 1 or more and l−1 or less), the layer 30 is stacked over the layer 20_l, and the layer 40A is stacked over the layer 30.

The structures of the layer 10, the layer 20_1 to the layer 20_l, the layer 30, and the wiring EW are similar to those in Embodiment 1, and thus detailed description thereof is omitted.

An OS transistor can be used in the layer 40A in the memory device 100A. Alternatively, a transistor including a compound semiconductor such as GaN can be used as the transistor included in the layer 40A.

The layer 10 and the layer 20_1 to the layer 20_l are each provided with a circuit that can function by utilizing semiconductor characteristics. The circuit OSC is provided in the layer 10. The memory cell portion MCL is provided in the layer 20_1 to the layer 20_l. The layer 30 is a wiring layer where wirings are formed. That is, the first memory device includes the memory cell portion MCL.

The layer 40A is provided with circuits each of which can function by utilizing semiconductor characteristics. The layer 40A is provided with an RF (Radio Frequency) block circuit RFBL and a coil (also referred to as an inductor) COIL.

The coil COIL has a function of performing high-frequency wireless communication by near-field magnetic field coupling. A spiral coil or the like can be used as the coil COIL, for example. The RF block circuit RFBL is a circuit having a function of transmitting and receiving data to and from another circuit block through the coil COIL. Note that in description of this embodiment, the RF block circuit RFBL includes the coil COIL in some cases.

Figure 9B:
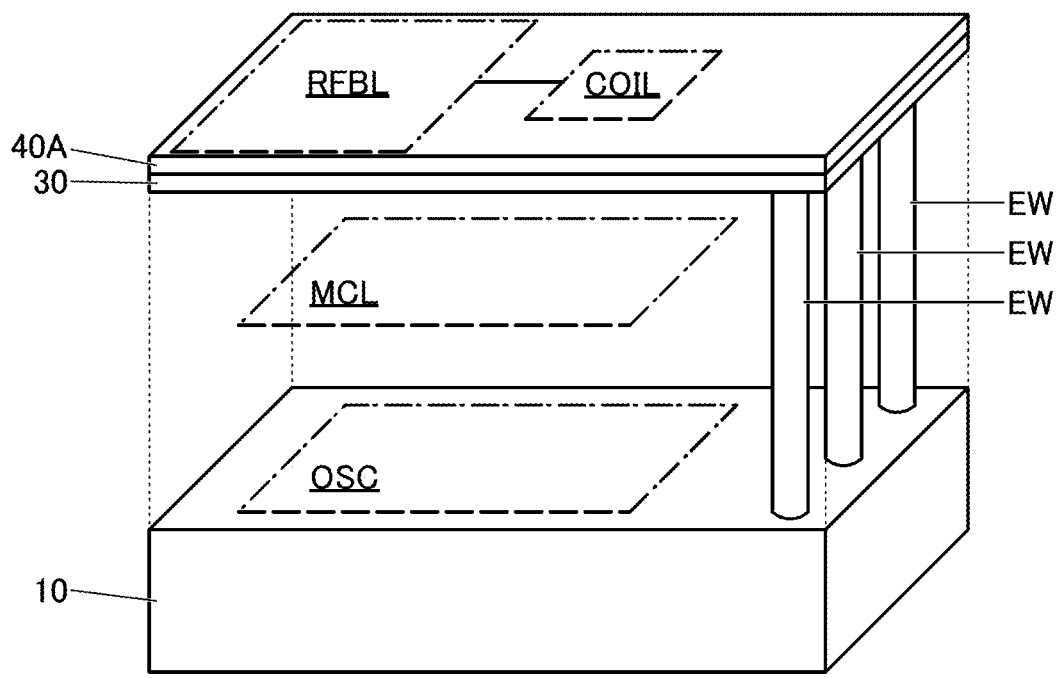

FIG. 9B is a schematic perspective view in which the layer 20_1 to the layer 20_l and the wirings EW connected to the layers 20 are omitted from FIG. 9A, and which illustrates the positional relationships between the circuit OSC, the memory cell portion MCL, the RF block circuit RFBL, and the coil COIL.

The structures of the circuit OSC and the memory cell portion MCL are similar to those in Embodiment 1, and thus detailed description thereof is omitted.

The RF block circuit RFBL and the coil COIL are electrically connected to the circuit OSC and the memory cell portion MCL by the wiring EW and the layer 30.

In the case where an OS transistor is used in the RF block circuit RFBL, the OS transistor is a thin-film transistor. The coil COIL is a conductor that can be used for a wiring or the like. Thus, the RF block circuit RFBL and the coil COIL can be provided to be stacked over the circuit OSC and the memory cell portion MCL. Specifically, the RF block circuit RFBL can be formed using an OS transistor over the circuit OSC and the memory cell portion MCL which are formed using Si transistors. Note that an OS transistor is a transistor including a metal oxide in a channel formation region.

The RF block circuit RFBL can be manufactured by a process different from those for manufacturing the circuit OSC and the memory cell portion MCL. An OS transistor has a lower formation temperature than a Si transistor; when the RF block circuit RFBL is formed using an OS transistor, heat effect on the Si transistors included in the circuit OSC and the memory cell portion MCL can be reduced. Moreover, since the RF block circuit RFBL and the coil COIL can be provided over the circuit OSC and the memory cell portion MCL to overlap with the circuit OSC and the memory cell portion MCL, the circuit area of the memory device 100A can be prevented from increasing.

Figure 10A:
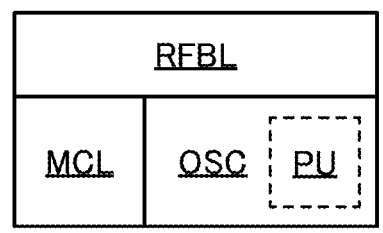
FIG. 10A is a block diagram illustrating a structure example of a memory device.

Next, a structure example of the memory device 100A including the RF block circuit RFBL is described. FIG. 10A is a block diagram illustrating a structure example of the memory device 100A.

In the block diagram of FIG. 10A, the memory device 100A includes the RF block circuit RFBL, the circuit OSC, and the memory cell portion MCL. As described in Embodiment 1, the circuit OSC has a function of performing arithmetic processing of data written to the memory cell portion MCL or data read from the memory cell portion MCL. In addition, the circuit OSC has a function of driving or controlling the RF block circuit RFBL. Thus, FIG. 10A also illustrates an arithmetic portion PU in the circuit OSC. The arithmetic portion PU includes a circuit corresponding to an FTL (Flash Translation Layer) or a circuit having a function of detecting and correcting an error (also referred to as ECC: Error Check and Correct).

The circuit block of the memory device 100A illustrated in FIG. 10A can transmit and receive data to and from a central processing unit CPU including the RF block circuit RFBL through the RF block circuit RFBL and the coil COIL (not illustrated). The memory device 100A has functions of data writing and data reading operation of the memory cell portion MCL, arithmetic operation of data of the memory cell portion MCL, and data wireless communication operation with an external device.

Figure 10B:
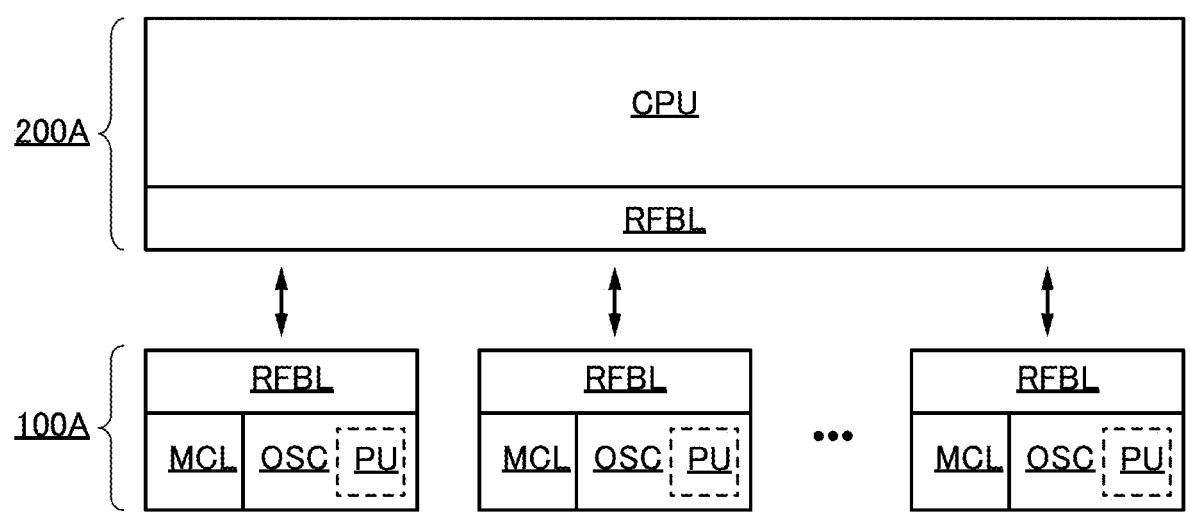
FIG. 10B is a block diagram illustrating a structure example of a central management unit.

When the memory device 100A of this embodiment is used in combination with a central management unit 200A including the central processing unit CPU and the RF block circuit RFBL illustrated in FIG. 10B, a data processing system 300A with reduced power consumption can be provided. The central management unit 200A has a function of controlling memory operations such as data reading and data writing to be performed in a distributed manner in a plurality of memory devices 100A.

In the data processing system 300A illustrated in FIG. 10B, data transmission and reception can be performed between the central management unit 200A and the plurality of memory devices 100A. In the case where the memory devices 100A each including the memory cell portion MCL and the arithmetic portion PU are arranged in a distributed manner, electric connection by near-field magnetic field using a coil can be performed between the distributed memory devices 100A and the central management unit 200A. The distributed memory devices 100A can perform memory operations such as data reading and data writing in a distributed manner.

In the structure of FIG. 10B, the distance between the central processing unit CPU and the memory device 100A can be shortened. The central processing unit CPU can be electrically connected to the plurality of memory devices 100A, and data transmission and reception can be performed. Since a serial bus is not needed between the central processing unit CPU and the plurality of memory devices 100A, the power consumption can be reduced as a whole. The central processing unit CPU and the memory device 100A can be electrically connected by using near-field magnetic field coupling, and thus the alignment accuracy that is required in the case where metal electrodes are connected by a micro-bump can be unnecessary.

Figure 11:
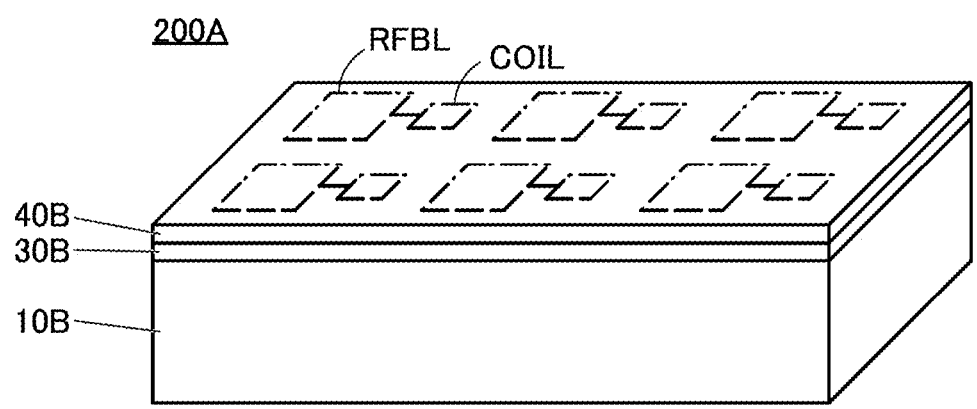
FIG. 11 is a schematic perspective view illustrating a structure example of a central management unit.

FIG. 11 is a schematic perspective view illustrating a structure example of the central management unit 200A. The central management unit 200A includes a layer 10B, a layer 30B, and a layer 40B.

As illustrated in FIG. 11, the central management unit 200A has a structure in which the layer 30B is provided to be stacked over the layer 10B and the layer 40B is provided to be stacked over the layer 30B.

In the central management unit 200A, an OS transistor can be used in the layer 40B. With the OS transistor, the central management unit 200A can include a memory cell portion functioning as a cache memory or a storage memory, like the memory device 100A. In addition, when the OS transistor is used in the layer 40B, the RF block circuit RFBL can be formed. Note that the RF block circuit RFBL may be formed using a transistor including a compound semiconductor such as GaN.

The layer 10B and the layer 30B are provided with circuits each of which can function by utilizing semiconductor characteristics, and the layer 10B is provided with a circuit functioning as the central processing unit CPU. The layer 10B is provided with the CPU formed using Si transistors. The layer 30B is a wiring layer where wirings are formed.

The layer 40B is provided with the RF block circuit RFBL and the coil COIL like the above-described layer 40A.

Figure 12A:
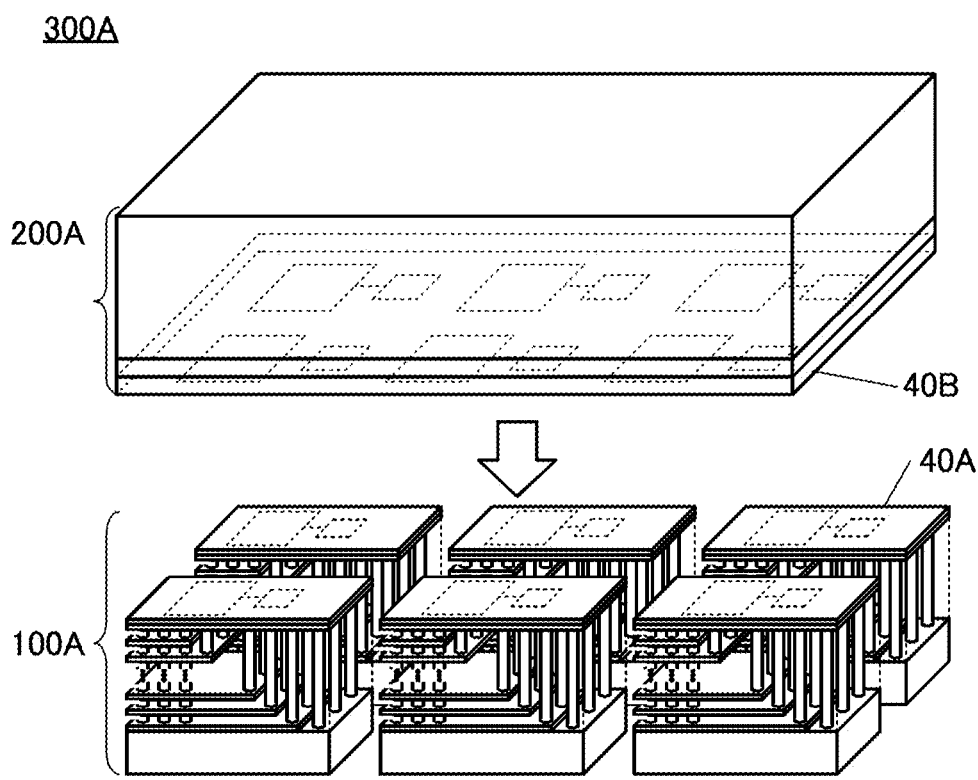
FIG. 12A and FIG. 12B are schematic perspective views illustrating a structure example of a data processing device.
Figure 12B:
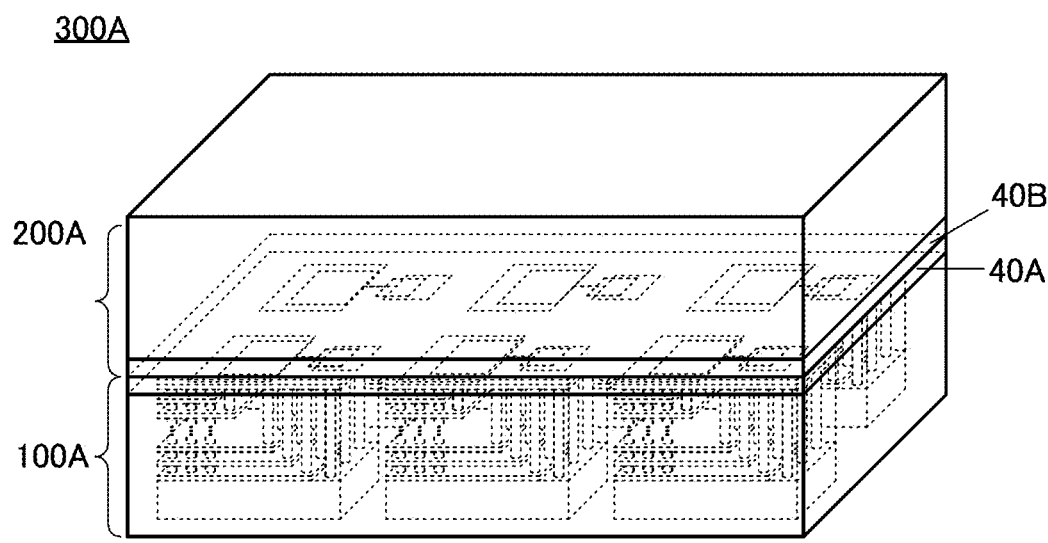

FIG. 12A and FIG. 12B are schematic perspective views illustrating a structure example of a data processing system 300A. The layer 40A of the memory device 100A and the layer 40B of the central management unit 200A are bonded to face each other as illustrated in FIG. 12A, and the memory device 100A and the central management unit 200A are integrated to form the data processing system 300A as illustrated in FIG. 12B. As described above, the central management unit 200A and the memory device 100A can be electrically connected by using near-field magnetic field coupling, and thus the alignment accuracy that is required in the case where metal electrodes are connected by a micro-bump can be unnecessary.

Note that this embodiment can be implemented in appropriate combination with the other embodiments described in this specification.

Embodiment 3

In this embodiment, a circuit structure example of the memory cell portion MCL of the memory device 110 of one embodiment of the present invention is described.

FIG. 22A shows a circuit diagram of the memory cell portion MCL of the memory device 110 of one embodiment of the present invention. The memory cell portion MCL includes a plurality of memory elements 410 between a transistor 431 and a transistor 432. FIG. 22B shows a circuit diagram of the memory element 410. The memory element 410 includes a transistor 411 and a transistor 412.

In this embodiment and the like, a first memory element 410 is denoted as a memory element 410[1] and an n-th (n is an integer of 3 or more) memory element 410 is denoted as a memory element 410[$n$]. An i-th (i is an integer greater than or equal to 2 and less than n) memory element 410 is denoted as a memory element 410[$i$]. Note that the "memory element 410" may be simply used in the case of description common to the memory element 410[1] to the memory element 410[$n$].

In this embodiment and the like, the transistor 411 included in the first memory element 410 is denoted as a transistor 411[1], the transistor 411 included in the i-th memory element 410 is denoted as a transistor 411[$i$], and the transistor 411 included in the n-th memory element 410 is denoted as a transistor 411[$n$]. Note that the "transistor 411" may be simply used in the case of description common to the transistor 411[1] to the transistor 411[$n$]. The transistor 412, a node 413 described later, and the like are also denoted in a manner similar to that of the transistor 411.

<Structure Example of Memory Device>

A circuit structure example of the memory cell portion MCL shown in FIG. 22A will be described in detail. One of a source and a drain of the transistor 411[1] included in the memory element 410[1] is electrically connected to a wiring WBL, and the other is electrically connected to a node 413[1]. A gate of the transistor 411[1] is electrically connected to a terminal 421[1]. One of a source and a drain of a transistor 412[1] is electrically connected to the transistor 431 and the other is electrically connected to one of a source and a drain of a transistor 412[2]. A gate of the transistor 412[1] is electrically connected to the node 413[1]. A back gate of the transistor 412[1] is electrically connected to a terminal 422[1].

One of a source and a drain of the transistor 431 is electrically connected to a wiring RBL and the other is electrically connected to the one of the source and the drain of the transistor 412[1]. A gate of the transistor 431 is electrically connected to a terminal 433. Note that the wiring WBL and the wiring RBL correspond to the wirings BL shown in FIG. 2; the wiring WBL is used in data writing, and the wiring RBL is used in data reading.

One of a source and a drain of a transistor 411[2] included in a memory element 410[2] is electrically connected to the node 413[1], and the other is electrically connected to a node 413[2]. A gate of the transistor 411[2] is electrically connected to a terminal 421[2]. The one of the source and the drain of the transistor 412[2] is electrically connected to the other of the source and the drain of the transistor 412[1], and a gate of the transistor 412[2] is electrically connected to the node 413[2]. A back gate of the transistor 412[2] is electrically connected to a terminal 422[2].

One of a source and a drain of the transistor 411[$i$] included in the memory element 410[$i$] is electrically connected to a node 413[$i$–1] (not illustrated), and the other is electrically connected to a node 413[$i$]. A gate of the transistor 411[$i$] is electrically connected to a terminal 421[$i$]. One of a source and a drain of a transistor 412[$i$] is electrically connected to one or the other of a source and a drain of a transistor 412[$i$–1] (not illustrated). A gate of the transistor 412[$i$] is electrically connected to the node 413[$i$] and a back gate of the transistor 412[$i$] is electrically connected to a terminal 422[$i$].

One of a source and a drain of the transistor 411[$n$] included in the memory element 410[$n$] is electrically connected to a node 413[$n$–1] (not illustrated). The other of the source and the drain of the transistor 411[$n$] is electrically connected to a node 413[$n$]. A gate of the transistor 411[$n$] is electrically connected to a terminal 421[$n$].

One of a source and a drain of a transistor 412[$n$] is electrically connected to a source or a drain of a transistor 412[$n$–1] (not illustrated). The other of the source and the drain of the transistor 412[$n$] is electrically connected to the transistor 432. A gate of the transistor 412[$n$] is electrically connected to the node 413[$n$] and a back gate of the transistor 412[$n$] is electrically connected to a terminal 422[$n$].

One of a source and a drain of the transistor 432 is electrically connected to the other of the source and the drain of the transistor 412[$n$]. The other of the source and the drain of the transistor 432 is electrically connected to a wiring SL. A gate of the transistor 432 is electrically connected to a terminal 434.

The memory cell portion MCL of the memory device 110 illustrated in FIG. 22A includes the n memory elements 410 between the transistor 431 and the transistor 432. The transistor 411[1] to the transistor 411[$n$] are connected in series while the source and the drain are shared by adjacent transistors. The transistor 412[1] to the transistor 412[$n$] are also connected in series while the source and the drain are shared by adjacent transistors Such a structure in which the memory elements 410 are connected while the source and the drain are shared by adjacent transistors is referred to as "string", "cell string", or "memory cell string" in some cases. For example, one memory cell portion MCL is sometimes referred to as "one string" or simply a "string". Note that "string", "cell string", and "memory cell string" are also used as units in some cases.

[Memory Element]

The memory element 410 (see FIG. 22B) has a function of retaining a potential (charge) written to the node 413. Specifically, a voltage for turning on the transistor 411 is supplied to a gate of the transistor 411, and charge for setting the node 413 to a predetermined voltage is supplied to the node 413 through a source and a drain of the transistor 411. Then, a voltage for turning off the transistor 411 is supplied to the gate of the transistor 411. The charge written to the node 413 can be retained when the transistor 411 is turned off.

For semiconductor layers of the transistor 411 and the transistor 412, a single crystal semiconductor, a polycrystalline semiconductor, a microcrystalline semiconductor, an amorphous semiconductor, or the like can be used alone or in combination. As a semiconductor material, silicon, germanium, or the like can be used. Alternatively, a compound semiconductor such as silicon germanium, silicon carbide, gallium arsenide, an oxide semiconductor, or a nitride semiconductor can be used. The same applies to the transistor 431 and the transistor 432.

Note that the semiconductor layers may be stacked in the transistor. In that case, the stacked semiconductor layers may include different semiconductor materials or semiconductors with different crystal states.

In particular, the transistor 411 is preferably an OS transistor. The oxide semiconductor has a band gap of 2 eV or more, achieving an extremely low off-state current. When the OS transistor is used as the transistor 411, the charge written to the node 413 can be retained for a long period. In the case where the OS transistor is used as the transistor 411, the memory element 410 can be referred to as an "OS memory".

The OS memory can retain information written thereto for a year or more, or ten years or more even after power supply is stopped. Hence, the OS memory can be regarded as a nonvolatile memory.

Since the amount of charge written to the OS memory hardly changes for a long period, multilevel (multi-bit) information as well as binary (1-bit) information can be retained in the OS memory.

Furthermore, an OS memory employs a method in which charge is written to a node through the OS transistor; hence, a high voltage, which a conventional flash memory requires, is unnecessary and a high-speed writing operation is possible. The OS memory does not require an erasing operation that is performed in a flash memory before data rewriting. Furthermore, the OS memory does not conduct charge injection and extraction to and from a floating gate or a charge-trap layer, substantially allowing an unlimited number of times of data writing and reading. The OS memory is less likely to degrade than a conventional flash memory and can have high reliability.

Unlike a magneto-resistive memory (MRAM), a resistance-change memory (ReRAM), and the like, the OS memory does not undergo a structure change at the atomic level. Hence, the OS memory has higher write endurance than the magneto-resistive memory and the resistance-change memory.

The off-state current of the OS transistor hardly increases even in a high-temperature environment. Specifically, the off-state current hardly increases even at an environment temperature of from room temperature to 200° C. In addition, the on-state current of the OS transistor is unlikely to decrease even in a high-temperature environment. A memory device including the OS memory achieves a stable operation and high reliability even in a high-temperature environment. Furthermore, the withstand voltage between the source and the drain of the OS transistor is high. When OS transistors are used as transistors included in a semiconductor device, the semiconductor device achieves a stable operation and high reliability even in a high-temperature environment.

As illustrated in FIG. 22C, a transistor having a back gate may be used as the transistor 411 included in the memory element 410. FIG. 22C shows an example in which the gate and the back gate of the transistor 411 are electrically connected.

As illustrated in FIG. 22D, a capacitor 425 may be provided between the node 413 and a terminal 423. In the case where the capacitor 425 is provided, a fixed potential is preferably supplied to the terminal 423. When the capacitor 425 is provided, the potential change of the node 413 can be inhibited and the reliability of the memory cell portion MCL can be increased. The memory element 410 is preferably provided with the capacitor 425 particularly when storing multilevel information.

Figure 36A:
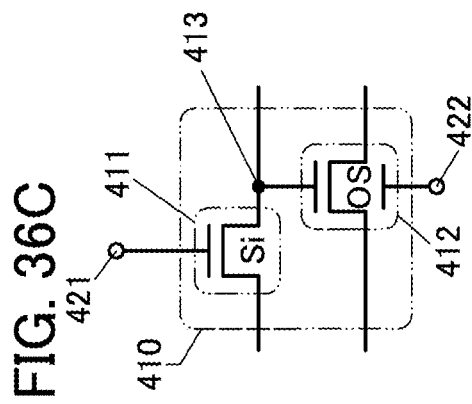
FIG. 36A to FIG. 36D are circuit diagrams each illustrating a structure example of a memory element.

In the memory element 410 illustrated in FIG. 22B, an OS transistor and a Si transistor can be used in combination as the transistor 411 and the transistor 412. FIG. 36A illustrates an example in which OS transistors are used as the transistor 411 and the transistor 412. In FIG. 36A to FIG. 36D, "OS" is written beside a circuit symbol of a transistor to clarify that the transistor is an OS transistor, and "Si" is written beside a circuit symbol of a transistor to clarify that the transistor is a Si transistor.

Figure 36B:
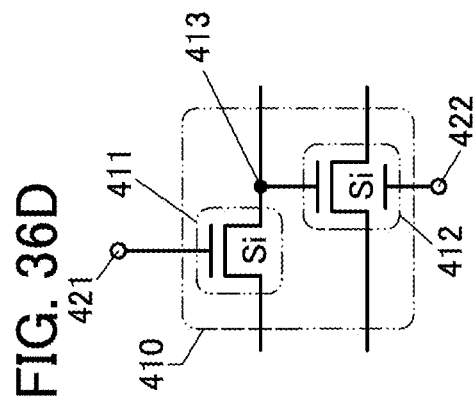

FIG. 36B illustrates an example in which an OS transistor is used as the transistor 411 and a Si transistor is used as the transistor 412. When an OS transistor is used as the transistor 411 in the memory elements 410 illustrated in FIG. 36A and FIG. 36B, as described above, written information can be retained for a long period even when power supply is stopped, not only binary data but also multilevel information can be retained, and high reliability can be obtained even in a high-temperature environment, for example. When a Si transistor is used as the transistor 412 in the memory element 410 illustrated in FIG. 36B, reading speed can be improved.

Figure 36C:
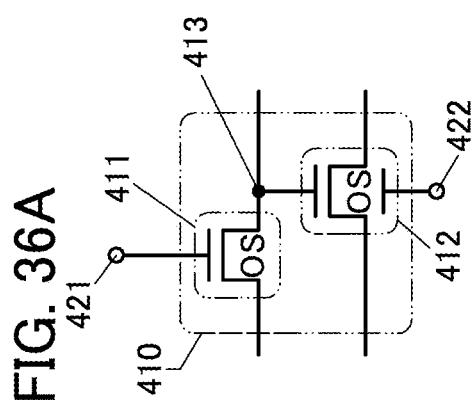
Figure 36D:
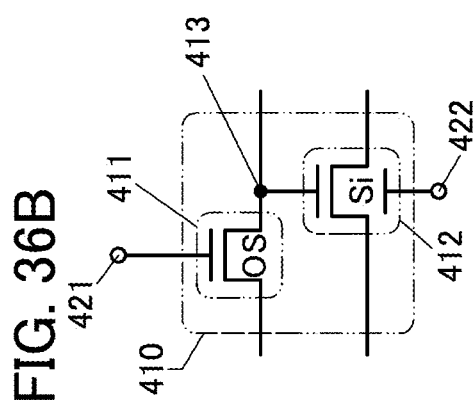

As illustrated in FIG. 36C, a Si transistor may be used as the transistor 411 and an OS transistor may be used as the transistor 412 depending on the purpose, application, or the like. As illustrated in FIG. 36D, Si transistors may be used as both the transistor 411 and the transistor 412 depending on the purpose, application, or the like.

<Operation Example of Memory Device>

An operation example of the memory cell portion MCL will be described with reference to drawings. In this embodiment, the description is made on an example of the memory cell portion MCL which includes four memory elements 410.

[Writing Operation]

Figure 23A:
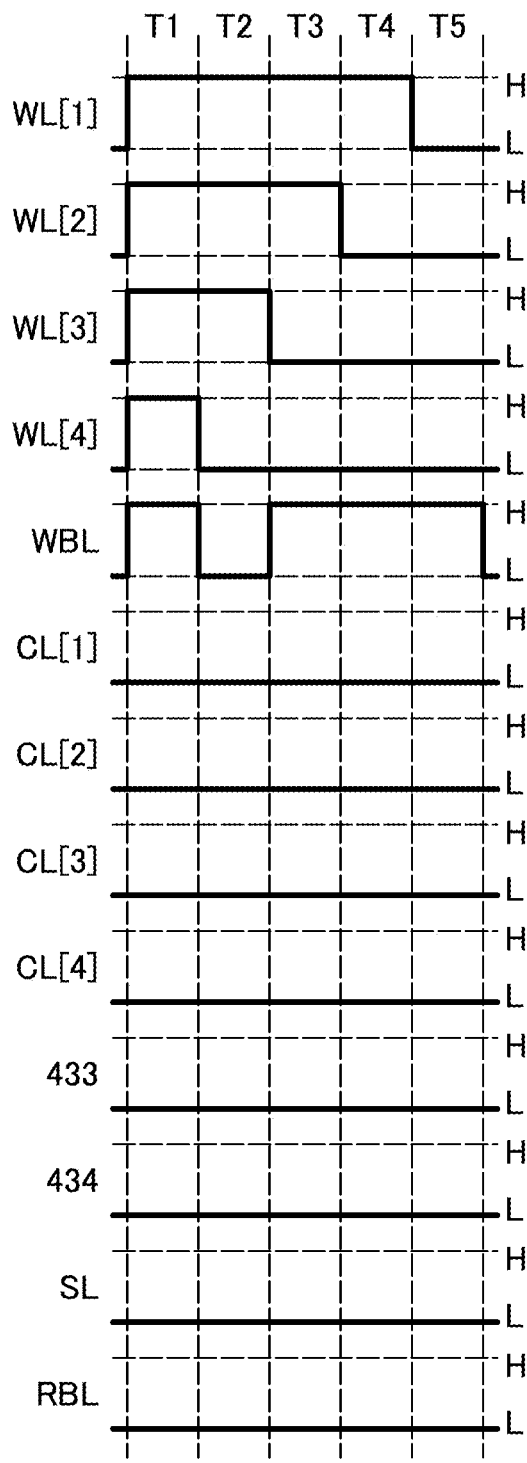
FIG. 23A is a timing chart showing a writing operation.

This embodiment shows an operation example where an H potential is written to the memory element 410[1], the memory element 410[2], and a memory element 410[4] whereas an L potential is written to a memory element 410[3]. FIG. 23A is a timing chart showing a writing operation. FIG. 24A, FIG. 24B, FIG. 25A, FIG. 25B, and FIG. 26 are circuit diagrams for showing the writing operation.

It is assumed that in the initial state, the L potential is written to the memory element 410[1] to the memory element 410[4]. It is also assumed that the L potential is supplied to the wiring WL[1] to the wiring WL[4], the wiring CL[1] to the wiring CL[4], the terminal 433, the terminal 434, the wiring SL, and the wiring RBL.

[Period T1]

In Period T1, the H potential is supplied to the wiring WL[1] to the wiring WL[4] and the wiring WBL (see FIG. 24A). Then, the node 413[1] to the node 413[4] have the H potential, so that the transistor 412[1] to a transistor 412[4] are turned on.

[Period T2]

In Period T2, the L potential is supplied to the wiring WL[4] (see FIG. 24B). Then, a transistor 411[4] is turned off and charge written to the node 413[4] is retained. Here, the charge equivalent to the H potential is retained. The L potential is supplied to the wiring WBL. Then, the node 413[1] to the node 413[3] have the L potential, so that the transistor 412[1] to the transistor 412[3] are turned off.

[Period T3]

In Period T3, the L potential is supplied to the wiring WL[3] (see FIG. 25A). Then, a transistor 411[3] is turned off and charge written to the node 413[3] is retained. Here, the charge equivalent to the L potential is retained. The H potential is supplied to the wiring WBL. Then, the node 413[1] and the node 413[2] have the H potential, so that the transistor 412[1] and the transistor 412[2] are turned on.

[Period T4]

In Period T4, the L potential is supplied to the wiring WL[2] (see FIG. 25B). Then, the transistor 411[2] is turned off and charge written to the node 413 [2] is retained. Here, the charge equivalent to the H potential is retained.

[Period T5]

Figure 26:
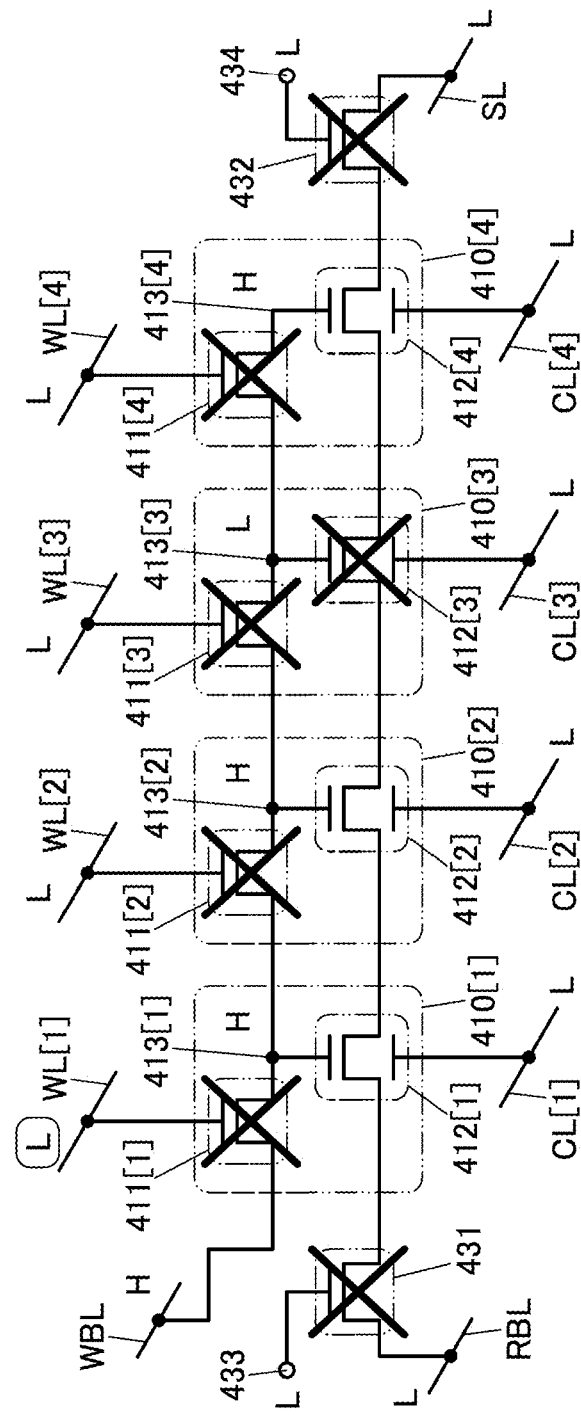
FIG. 26 is a circuit diagram illustrating the writing operation.

In Period T5, the L potential is supplied to the wiring WL[1] (see FIG. 26). Then, the transistor 411[1] is turned off and charge written to the node 413[1] is retained. Here, the charge equivalent to the H potential is retained. In this manner, information can be written to the memory element 410[1] to the memory element 410[4].

[Reading Operation]

Figure 23B:
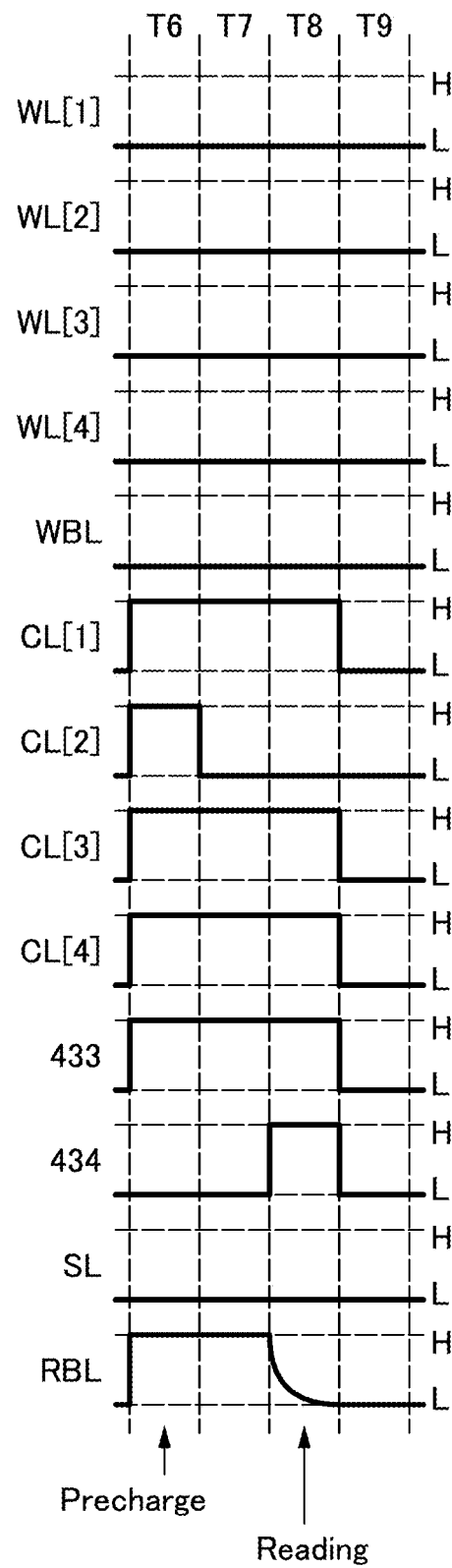
FIG. 23B is a timing chart showing a reading operation.

Described in this embodiment is an operation example of reading information retained in the memory element 410[2] among the information retained in the memory element 410[1] to the memory element 410[4]. It is assumed that an H potential is retained in the memory element 410[2]. FIG. 23B is a timing chart showing a reading operation. FIG. 27A, FIG. 27B, FIG. 28A, and FIG. 28B are circuit diagrams for describing the reading operation.

[Period T6]

In Period T6, the H potential is supplied to the wiring CL[1] to the wiring CL[4] and the terminal 433, so that the transistor 412[1] to the transistor 412[4] and the transistor 431 are turned on (see FIG. 27A). Furthermore, the wiring RBL is precharged to the H potential, and the wiring RBL is brought into a floating state.

[Period T7]

In Period T7, the L potential is supplied to the wiring CL[2] (see FIG. 27B). Since the H potential is retained in the node 413[2], the transistor 412[2] remains on.

[Period T8]

In Period T8, the H potential is supplied to the terminal 434, so that the transistor 432 is turned on (see FIG. 28A). The transistor 412[1] to the transistor 412[4] are all on; accordingly, the wiring RBL and the wiring SL are electrically connected and the potential of the wiring RBL is changed to the L potential.

Note that in the case where the node 413[2] has the L potential, the transistor 412[2] is turned off when the L potential is supplied to the wiring CL[2]. In that case, the potential of the wiring RBL remains H even when the transistor 432 is turned on. What information is retained in the memory element 410 is known from a change in the potential of the wiring RBL.

That is, in order to read information retained in the memory element 410, in Period T8, the L potential is supplied to the wiring CL corresponding to the memory element 410 from which the information is to be read.

[Period T9]

In Period T9, the L potential is supplied to the wiring CL[1] to the wiring CL[4], the terminal 433, and the terminal 434 (see FIG. 28B). Then, the transistor 412[1], the transistor 412[2], the transistor 412[4], the transistor 431, and the transistor 432 are turned off.

The memory cell portion MCL shown in this embodiment and the like serves as a NAND memory device.

Note that data that is rewritten frequently is stored in the memory element 410 close to the wiring WBL, so that the data can be written (rewritten) in a shorter time. That is, the speed of writing (rewriting) data can be increased. With such operation, the 3D OS NAND can operate like a RAM.

Note that this embodiment can be implemented in appropriate combination with the other embodiments described in this specification.

Embodiment 4

Figure 13:
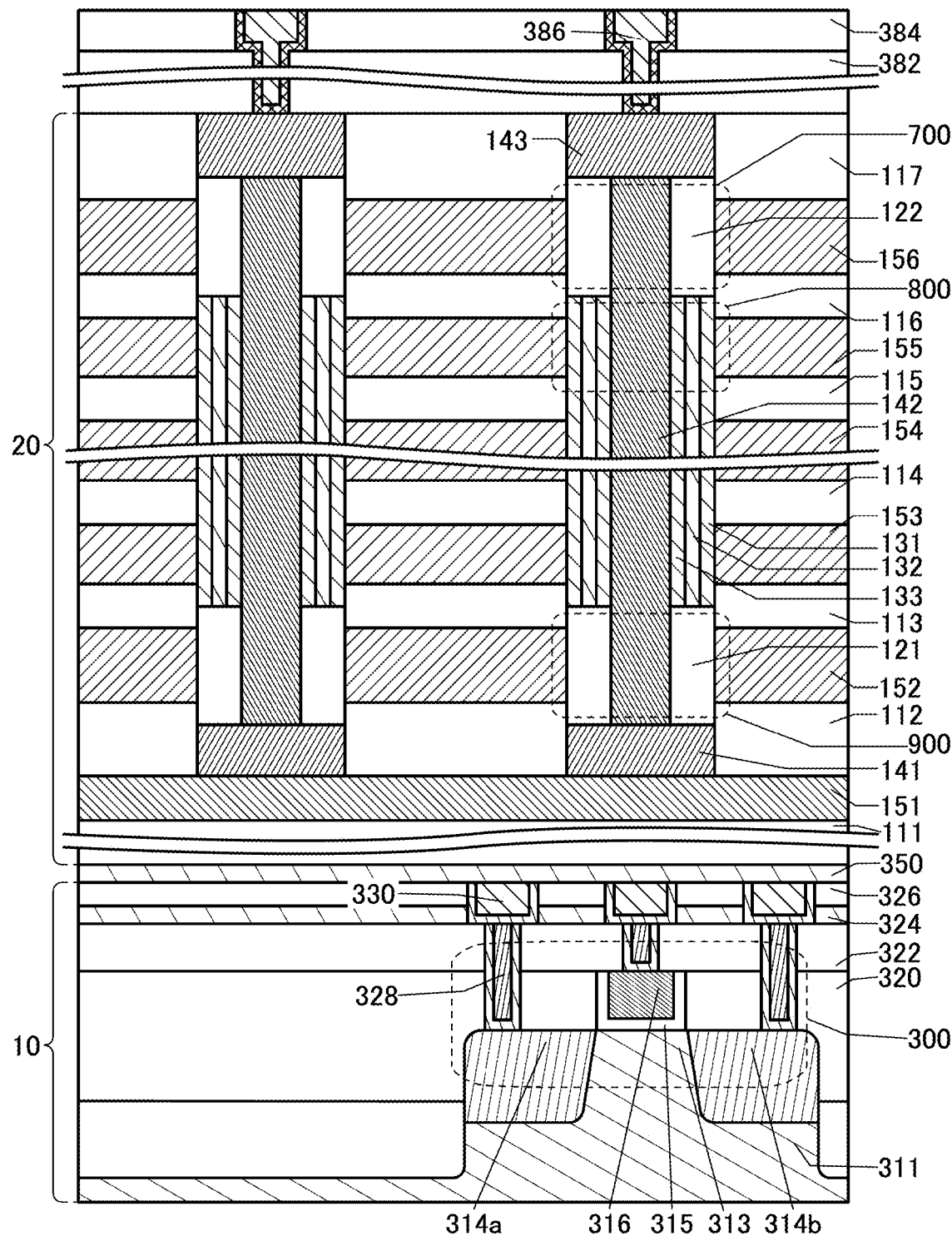
FIG. 13 is a cross-sectional view illustrating a structure example of a memory device.
Figure 14:
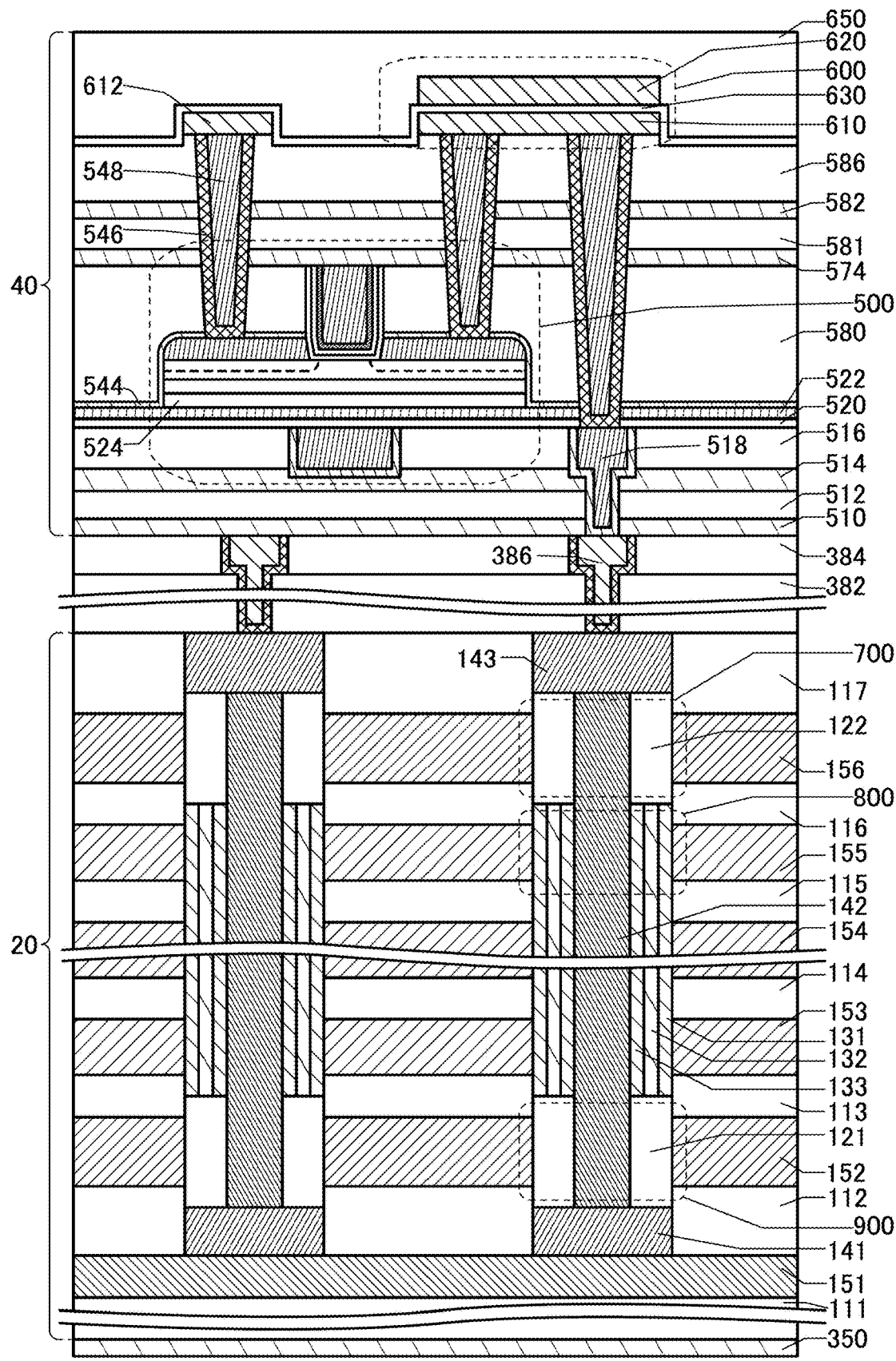
FIG. 14 is a cross-sectional view illustrating a structure example of a memory device.

In this embodiment, a structure example of a transistor included in the memory device 100 described in the above embodiment will be described. FIG. 13 illustrates a cross-sectional structure example of the layer 10 and the layer 20, and FIG. 14 illustrates a cross-sectional structure example of the layer 20 and the layer 40. Note that this embodiment describes the case where a single crystal silicon substrate is used as the substrate SUB, a three-dimensional NAND memory element is included in the layer 20, and an OS transistor is formed in the layer 40.

In FIG. 13 and FIG. 14, a transistor 300 is formed in the layer 10, a transistor 700, a plurality of transistors 800, and a transistor 900 are formed in the layer 20, and a transistor 500 is formed in the layer 40.

The transistor 700 corresponds to the transistor BTr in FIG. 2, the transistor 800 corresponds to the transistor CTr in FIG. 2, and the transistor 900 corresponds to the transistor STr in FIG. 2. The transistor 300 is one of the transistors included in the circuit OSC, the transistor 500 corresponds to the transistor M11, and a capacitor 600 corresponds to the capacitor C11.

The transistor 500 includes a second gate (also referred to as a bottom gate or a back gate) in addition to a first gate (also referred to as a top gate or a front gate, or simply a gate). The transistor 500 is a transistor including a metal oxide in a channel formation region (OS transistor). The transistor 500 has a characteristic of an extremely small off-state current; in the above embodiment, the transistor 500 is used as the transistor M11, enabling data written to the memory cell OMC to be retained for a long time.

Figure 15A:
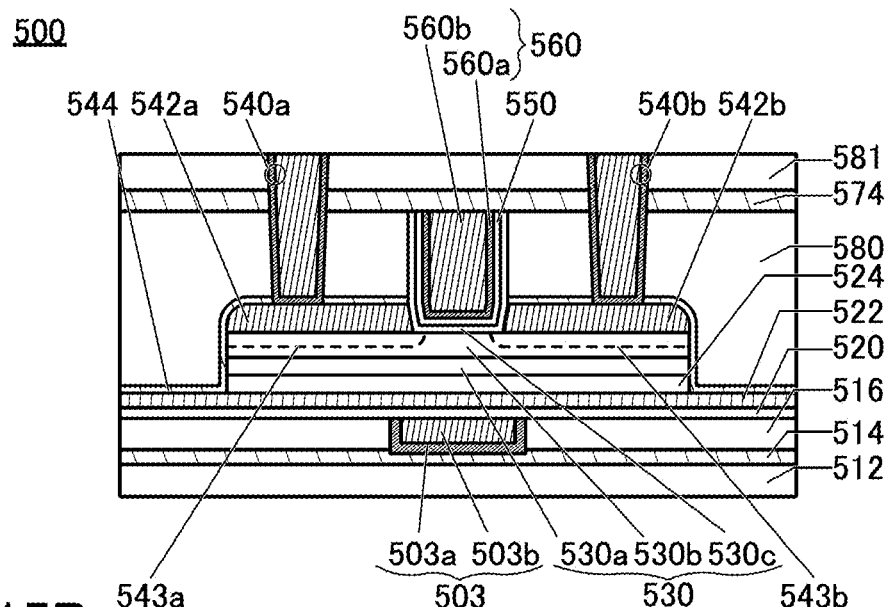
FIG. 15A to FIG. 15C are cross-sectional views illustrating a structure example of a transistor.
Figure 15B:
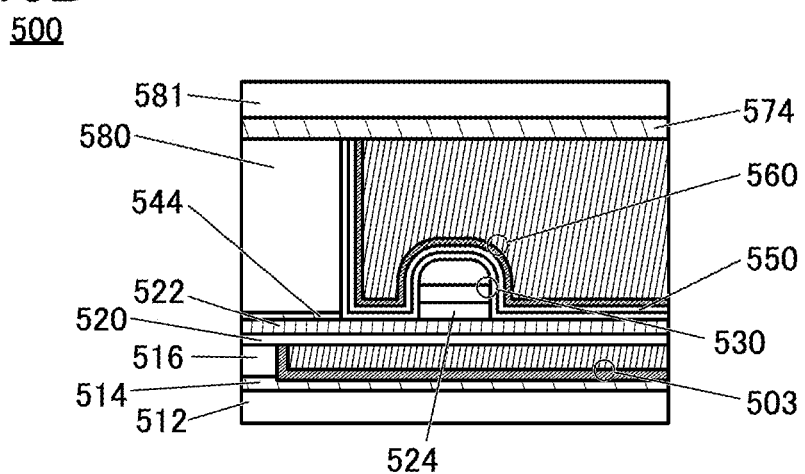
Figure 15C:
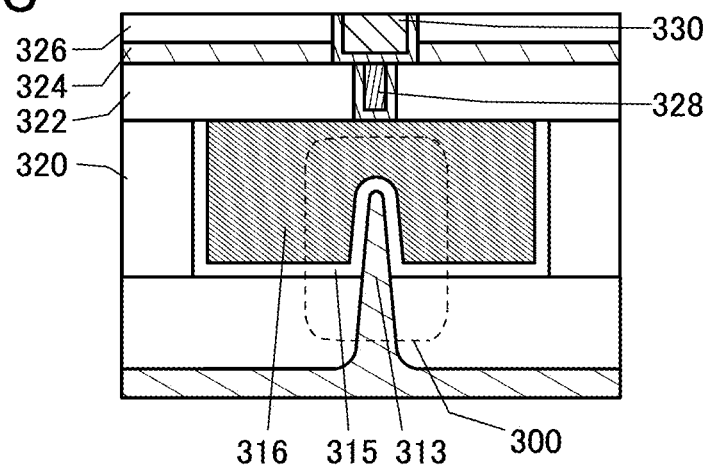

FIG. 15A is a cross-sectional view of the transistor 500 in the channel length direction, FIG. 15B is a cross-sectional view of the transistor 500 in the channel width direction, and FIG. 15C is a cross-sectional view of the transistor 300 in the channel width direction. As illustrated in FIG. 13 and FIG. 14, in the memory device 100 described in this embodiment, the layer 20 is provide over the layer 10, and the layer 40 is provided over the layer 20 and the layer 10.

<Structure Example of Layer 10>

The transistor 300 is provided on a substrate 311 and includes a conductor 316, an insulator 315, a semiconductor region 313 that is a part of the substrate 311, and a low-resistance region 314a and a low-resistance region 314b functioning as a source region and a drain region.

As shown in FIG. 15C, in the transistor 300, the top surface and the side surface in the channel width direction of the semiconductor region 313 are covered with the conductor 316 with the insulator 315 therebetween. Such a Fin-type transistor 300 can have an increased effective channel width, and thus the transistor 300 can have improved on-state characteristics. In addition, since contribution of an electric field of a gate electrode can be increased, the off-state characteristics of the transistor 300 can be improved.

Note that the transistor 300 can be either a p-channel transistor or an n-channel transistor.

It is preferable that a region of the semiconductor region 313 where a channel is formed, a region in the vicinity thereof, the low-resistance region 314a and the low-resistance region 314b functioning as the source region and the drain region, and the like contain a semiconductor such as a silicon-based semiconductor, further preferably single crystal silicon. Alternatively, these regions may be formed using a material containing Ge (germanium), SiGe (silicon germanium), GaAs (gallium arsenide), GaN (gallium nitride), GaAlAs (gallium aluminum arsenide), or the like. A structure using silicon whose effective mass is controlled by applying stress to the crystal lattice and changing the lattice spacing may be employed. Alternatively, the transistor 300 may be an HEMT (High Electron Mobility Transistor) with GaAs and GaAlAs, or the like.

The low-resistance region 314a and the low-resistance region 314b contain an element that imparts n-type conductivity, such as arsenic or phosphorus, or an element that imparts p-type conductivity, such as boron, in addition to the semiconductor material used for the semiconductor region 313.

The conductor 316 functioning as a gate electrode can be formed using a semiconductor material such as silicon containing an element that imparts n-type conductivity, such as arsenic or phosphorus, or an element that imparts p-type conductivity, such as boron, or using a conductive material such as a metal material, an alloy material, or a metal oxide material.

Note that since the work function of a conductor depends on a material of the conductor, Vth of the transistor can be adjusted by changing the material of the conductor. Specifically, it is preferable to use a material such as titanium nitride or tantalum nitride for the conductor. Moreover, in order to ensure both conductivity and embeddability, it is preferable to use stacked layers of metal materials such as tungsten and aluminum for the conductor, and it is particularly preferable to use tungsten in terms of heat resistance.

Note that the transistor 300 shown in FIG. 13 is an example and is not limited to the structure shown therein; an appropriate transistor is used in accordance with a circuit structure or a driving method.

An insulator 320, an insulator 322, an insulator 324, and an insulator 326 are stacked in this order to cover the transistor 300.

The insulator 320, the insulator 322, the insulator 324, and the insulator 326 can be formed using, for example, silicon oxide, silicon oxynitride, silicon nitride oxide, silicon nitride, aluminum oxide, aluminum oxynitride, aluminum nitride oxide, or aluminum nitride.

The insulator 322 may have a function of a planarization film for planarizing a level difference caused by the transistor 300 or the like provided below the insulator 322. For example, the top surface of the insulator 322 may be planarized by planarization treatment using a chemical mechanical polishing (CMP) method or the like to improve planarity.

The insulator 324 is preferably formed using a film having a barrier property that prevents diffusion of hydrogen or impurities from the substrate 311, the transistor 300, or the like into the region where the transistor 500 is provided.

For the film having a barrier property against hydrogen, silicon nitride formed by a chemical vapor deposition (CVD) method can be used, for example. Here, diffusion of hydrogen to a semiconductor element including an oxide semiconductor, such as the transistor 500, degrades the characteristics of the semiconductor element in some cases. Therefore, a film that inhibits hydrogen diffusion is preferably used between the transistor 500 and the transistor 300. The film that inhibits hydrogen diffusion is specifically a film from which a small amount of hydrogen is released.

The amount of released hydrogen can be measured by thermal desorption spectroscopy (TDS), for example. The amount of hydrogen released from the insulator 324 that is converted into hydrogen atoms per area of the insulator 324 is less than or equal to $10 \times 10^{15}$ atoms/cm$^2$, preferably less than or equal to $5 \times 10^{15}$ atoms/cm$^2$, in the TDS analysis in a film-surface temperature range of 50° C. to 500° C., for example.

Note that the permittivity of the insulator 326 is preferably lower than that of the insulator 324. For example, the relative permittivity of the insulator 326 is preferably lower than 4, further preferably lower than 3. The relative permittivity of the insulator 326 is, for example, preferably 0.7 times or less, further preferably 0.6 times or less the relative permittivity of the insulator 324. When a material with a low relative permittivity is used for an interlayer film, the parasitic capacitance generated between wirings can be reduced.

A conductor 328, a conductor 330, and the like are embedded in the insulator 320, the insulator 322, the insulator 324, and the insulator 326. Note that the conductor 328 and the conductor 330 have a function of a plug or a wiring. A plurality of conductors functioning as plugs or wirings are collectively denoted by the same reference numeral in some cases. Moreover, in this specification and the like, a wiring and a plug connected to the wiring may be a single component. That is, there are cases where a part of a conductor functions as a wiring and another part of the conductor functions as a plug.

As a material for each of plugs and wirings (the conductor 328, the conductor 330, and the like), a single layer or stacked layers of a conductive material such as a metal material, an alloy material, a metal nitride material, or a metal oxide material can be used. It is preferable to use a high-melting-point material that has both heat resistance and conductivity, such as tungsten or molybdenum, and it is preferable to use tungsten. Alternatively, it is preferable to use a low-resistance conductive material such as aluminum or copper. The use of a low-resistance conductive material can reduce wiring resistance.

Although not illustrated in FIG. 13, a wiring layer may be provided over the insulator 326 and the conductor 330. For example, it is preferable that an insulator having a barrier property against hydrogen like the insulator 324 be provided over the insulator 326 and the conductor 330 and a conductor having a barrier property against hydrogen be provided in the insulator. When the conductor having a barrier property against hydrogen is formed in an opening portion of the insulator having a barrier property against hydrogen, the transistor 300 and the transistor 500 can be separated from each other by the barrier layer, and hydrogen diffusion into the transistor 500 from the transistor 300 can be inhibited.

Note that for the conductor having a barrier property against hydrogen, tantalum nitride is preferably used, for example. In addition, the use of a stack including tantalum nitride and tungsten, which has high conductivity, can inhibit diffusion of hydrogen from the transistor 300 while the conductivity of a wiring is maintained. In that case, a structure is preferable in which a tantalum nitride layer having a barrier property against hydrogen is in contact with the insulator having a barrier property against hydrogen. Note that in FIG. 13, an insulator 350 having a barrier property against hydrogen is provided over the insulator 326 and the conductor 330.

<Structure Example of Layer 20>

The layer 20 illustrated in FIG. 13 is provided over the layer 10. The layer 20 includes an insulator 111 to an insulator 117, an insulator 121, an insulator 122, an insulator 131, an insulator 132, an insulator 133, a conductor 151 to a conductor 156, and a semiconductor 141 to a semiconductor 143 over the layer 10.

In the case where the insulator 111 is provide over the layer 10 and the insulator 111 has a function of a base film, the insulator 111 is preferably formed by a deposition method with good planarity, for example.

For the insulator 111, a material containing silicon oxide or silicon oxynitride can be used, for example. For example, a single layer or a stacked layer of an insulator including a material selected from boron, carbon, nitrogen, oxygen, fluorine, magnesium, aluminum, silicon, phosphorus, chlorine, argon, gallium, germanium, yttrium, zirconium, lanthanum, neodymium, hafnium, and tantalum can be used.

The conductor 151 is stacked over the insulator 111. The conductor 151 sometimes functions as the wiring CL in FIG. 2.

It is possible to use, for the conductor 151, a material containing one or more kinds of metal elements selected from aluminum, chromium, copper, silver, gold, platinum, tantalum, nickel, titanium, molybdenum, tungsten, hafnium, vanadium, niobium, manganese, magnesium, zirconium, beryllium, indium, and ruthenium, for example. A semiconductor having high electrical conductivity, typified by polycrystalline silicon containing an impurity element such as phosphorus, or silicide such as nickel silicide may be used. A conductive material containing oxygen and a metal element contained in a metal oxide described in Embodiment 5 may be used. A conductive material containing a metal element such as titanium or tantalum and nitrogen may be used. For example, a conductive material containing nitrogen, such as titanium nitride or tantalum nitride, may be used. Alternatively, indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon is added may be used, for example. Furthermore, indium gallium zinc oxide containing nitrogen may be used, for example. Using such a material sometimes allows capture of hydrogen or water entering from a surrounding insulator or the like.

There is no particular limitation on a formation method of the conductor 151. The conductor 151 can be deposited by a sputtering method, a CVD method (including a thermal CVD method, a metal organic chemical vapor deposition (MOCVD) method, a PECVD method, or the like), an MBE (Molecular Beam Epitaxy) method, an atomic layer deposition (ALD) method, or a PLD (Pulsed Laser Deposition) method, for example.

The insulator 112, the conductor 152, the insulator 113, the conductor 153, and the insulator 114 are stacked in this order over the conductor 151. The conductor 154, the insulator 115, the conductor 155, the insulator 116, the conductor 156, and the insulator 117 are provided over the insulator 114.

The insulator 112 to the insulator 117 can be formed using, for example, a material similar to that of the insulator 111. The insulator 112 to the insulator 117 are preferably formed using a material with a low permittivity, for example. When a material with a low permittivity is used for the insulator 112 to the insulator 117, the parasitic capacitances generated by the conductor 152 to the conductor 156 and by the insulator 112 to the insulator 117 can be reduced. This increases the driving speed of the memory cell portion MCL.

There is no particular limitation on a method of forming the insulator 112 to the insulator 117. The insulator 112 to the insulator 117 can be deposited by a sputtering method, a CVD method (including a thermal CVD method, an MOCVD method, a PECVD method, or the like), an MBE method, an ALD method, or a PLD method, for example.

The conductor 152 functions as a gate of the transistor 900 (the transistor STr in FIG. 2) and the wiring SSL in FIG. 2. The conductor 153 to the conductor 155 function as gates of the transistors 800 (the transistors CTr in FIG. 2) and the wirings WL in FIG. 2. The conductor 156 functions as a gate of the transistor 700 (the transistor BTr in FIG. 2) and the wiring BSL in FIG. 2.

The conductor 152 to the conductor 156 can be formed using a material similar to that of the conductor 151, for example. The conductor 152 to the conductor 156 can be formed by a formation method similar to that of the conductor 151.

In addition, an opening portion is provided in the insulator 112 to the insulator 117 and the conductor 152 to the conductor 156. In the opening portion, the insulator 121, the insulator 122, the insulator 131 to the insulator 133, and the semiconductor 141 to the semiconductor 143 are provided.

The semiconductor 141 is provided in contact with part of the side surfaces and the bottom surface of the opening portion. Specifically, the semiconductor 141 is provided over part of the conductor 151 and covers part of the insulator 112 on the side surfaces of the opening portion.

For the semiconductor 141, for example, silicon in which an impurity is diffused is preferably used. As the impurity, an n-type impurity (donor) can be used. As the n-type impurity, phosphorus or arsenic can be used, for example. As the impurity, a p-type impurity (accepter) can be used. As the p-type impurity, boron, aluminum, or gallium can be used, for example. As silicon, single crystal silicon, hydrogenated amorphous silicon, microcrystalline silicon, or polycrystalline silicon can be used, for example. The semiconductor 141 can also be formed using a metal oxide with a high carrier density other than silicon in some cases. Alternatively, Ge or a compound semiconductor such as ZnSe, CdS, GaAs, InP, GaN, SiGe, or the like can be used in some cases.

Note that materials used for the semiconductor 142 and the semiconductor 143 described later are preferably the same as the material of the semiconductor 141, and the carrier density of the semiconductor 142 is preferably lower than those of the semiconductor 141 and the semiconductor 143 in some cases.

For example, when silicon in which a p-type impurity is diffused is used for the semiconductor 141, it is preferable that the semiconductor 141 be formed over the conductor 151 and a p-type impurity such as boron, aluminum, or gallium be added to the semiconductor 141. This forms a p-type region in the semiconductor 141. For example, when silicon in which an n-type impurity is diffused is used, it is preferable that the semiconductor 141 be formed over the conductor 151 and an n-type impurity such as phosphorus or arsenic be added to the semiconductor 141. This forms an n-type region in the semiconductor 141.

When a metal oxide is used for the semiconductor 141, it is preferable that the semiconductor 141 be formed over the conductor 151 and a metal element or the like be added to the semiconductor 141, for example. This can increase carrier density of the semiconductor 141. In particular, when a metal oxide described in Embodiment 5 is used for the semiconductor 141, an n-type region ($n^+$ region) is formed in the semiconductor 141. Instead of adding a metal element or the like, water, hydrogen, or the like is added to the semiconductor 141 and then heat treatment is performed, whereby oxygen deficiency can be generated in the semiconductor 141. An n-type region is formed in a region where oxygen vacancy is generated in the semiconductor 141; the carrier density of the semiconductor 141 is increased as a result.

The insulator 121 is provided to be in contact with part of the side surface of the opening portion. Specifically, the insulator 121 is provided to cover part of the top of the semiconductor 141 and the conductor 152 on the side surfaces of the opening portion.

The insulator 121 functions as a gate insulating film of the transistor 900.

For the insulator 121, silicon oxide or silicon oxynitride can be used, for example. In particular, when a metal oxide is used for the semiconductor 142 described later, the insulator 121 is preferably a material which releases oxygen by heating. When the insulator 121 containing oxygen is provided in contact with the metal oxide used for the semiconductor 142, oxygen vacancies in the metal oxide can be reduced, which can improve the reliability of the transistor 900.

Although there is no particular limitation on the deposition method of the insulator 121, a deposition method of a film with good coverage is required since the insulator 121 is formed on the side surfaces of the opening portion provided in the insulator 112, the conductor 152, and the insulator 113. Examples of the deposition method of a film with good coverage include an ALD method.

The insulator 131 is provided to be in contact with part of the side surfaces of the opening portion. Specifically, the insulator 131 is provided to cover the conductor 153 to the conductor 155 on the side surfaces of the opening portion. Thus, the insulator 131 is provided to cover the insulator 114 and the insulator 115 on the side surfaces of the opening portion.

The insulator 132 is provided to be in contact with the insulator 131. The insulator 133 is provided to be in contact with the insulator 132. That is, the insulator 131 to the insulator 133 are sequentially stacked in this order from the side surfaces to the center of the opening portion.

The insulator 131 functions as a gate insulating film of the transistor 800. The insulator 132 functions as a charge accumulation layer of the transistor 800. The insulator 133 functions as a tunnel insulating film of the transistor 800.

It is preferable to use silicon oxide or silicon oxynitride for the insulator 131, for example. Alternatively, for the insulator 131, aluminum oxide, hafnium oxide, or an oxide containing aluminum and hafnium can be used, for example. The insulator 131 may be an insulator including a stack of any of the above. When the insulator 131 is made thicker than the insulator 133, charge can be moved from the semiconductor 142 described later to the insulator 132 through the insulator 133.

It is possible to use silicon nitride or silicon nitride oxide for the insulator 132, for example. Note that a material which can be used for the insulator 132 is not limited thereto.

It is preferable to use silicon oxide or silicon oxynitride for the insulator 133, for example. Alternatively, for the insulator 133, aluminum oxide, hafnium oxide, or an oxide containing aluminum and hafnium may be used, for example. The insulator 133 may be an insulator including a stack of any of the above.

Note that in this specification, silicon oxynitride refers to a material that has a higher oxygen content than a nitrogen content, and silicon nitride oxide refers to a material that has a higher nitrogen content than an oxygen content. Moreover, in this specification, aluminum oxynitride refers to a material that has a higher oxygen content than a nitrogen content, and aluminum nitride oxide refers to a material that has a higher nitrogen content than an oxygen content.

The insulator 122 is provided to be in contact with part of the side surfaces of the opening portion. Specifically, the insulator 122 is provided to cover the conductor 156 on the side surfaces of the opening portion.

The insulator 122 functions as a gate insulating film of the transistor 700.

The insulator 122 can be formed using a material similar to that of the insulator 121, for example. The insulator 122 can be formed by a method similar to that of the insulator 121.

The semiconductor 142 is provided in contact with the side surfaces of the insulator 121, the insulator 133, and the insulator 122 in the opening portion.

The semiconductor 142 functions as a channel formation region of each of the transistor 700, the transistor 800, and the transistor 900 and a wiring electrically connecting the transistor 700, the transistor 800, and the transistor 900 in series.

For the semiconductor 142, silicon is preferably used, for example. As silicon, single crystal silicon, hydrogenated amorphous silicon, microcrystalline silicon, or polycrystalline silicon can be used, for example. For the semiconductor 142, a metal oxide can be used other than silicon in some cases. Alternatively, Ge or a compound semiconductor such as ZnSe, CdS, GaAs, InP, GaN, SiGe, or the like can be used in some cases.

The semiconductor 143 is provided to fill the opening portion after the semiconductor 141, the semiconductor 142, the insulator 121, the insulator 122, the insulator 131, the insulator 132, and the insulator 133 are formed in the opening portion. Specifically, the semiconductor 143 is provided to be on the insulator 122 and the semiconductor 142, and to be in contact with the side surfaces of the insulator 117.

The semiconductor 143 is preferably a material similar to that of the semiconductor 141, for example. Thus, the polarity of the semiconductor 141 and the polarity of the semiconductor 143 are preferably the same with each other.

The structure of the memory device 100 of one embodiment of the present invention is not limited that of the NAND memory element included in the memory cell portion MCL illustrated in FIG. 13. The NAND memory element used in the memory device 100 may have a structure different from that of the NAND memory element illustrated in FIG. 13.

<Structure Example 2 of Layer 20>

Figure 21:
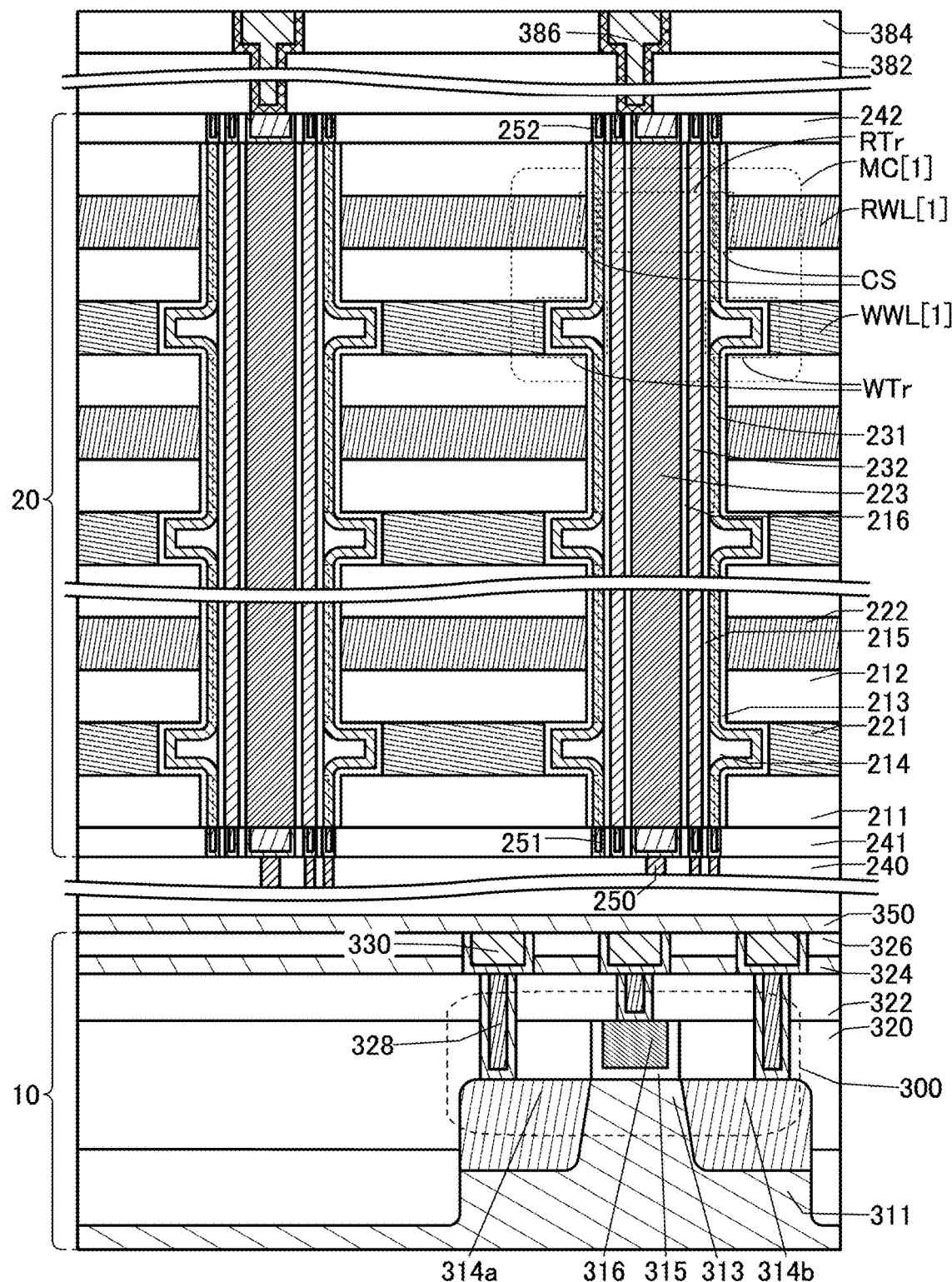
FIG. 21 is a cross-sectional view illustrating a structure example of a memory device.

A cross-sectional structure example of the layer 10 and the layer 20 illustrated in FIG. 21 is a structure example in which the layer 20 in FIG. 13 is changed. Specifically, the layer 20 illustrated in FIG. 21 is a structure example of the memory device 110 (3D OS NAND) described in Embodiment 1.

In the layer 20 illustrated in FIG. 21, the memory cell MC included in the three-dimensional NAND memory element includes a transistor RTr, a transistor WTr, and a capacitor CS as an example.

Like the layer 20 in FIG. 13, the layer 20 illustrated in FIG. 21 is provided over the layer 10. The layer 20 includes an insulator 211 to an insulator 216, an insulator 240 to an insulator 242, a conductor 221, a conductor 222, a conductor 250 to a conductor 252, a semiconductor 231, and a semiconductor 232 over the layer 10.

The insulator 240 is provided over the layer 10. Thus, the insulator 350 positioned under the insulator 240 is preferably formed by a deposition method with good planarity. The insulator 350 is preferably subjected to CMP treatment.

Any of the materials that can be for the insulator 111 can be used for the insulator 240, for example.

The insulator 241 is provided to be stacked over the insulator 240. Like the insulator 240, the insulator 241 can be formed using any of the materials that can be used for the insulator 111, for example.

The conductor 250 is embedded in the insulator 240, and the conductor 251 is embedded in the insulator 241. Note that the conductor 250 and the conductor 251 each have a function of a plug or a wiring. Furthermore, as in FIG. 13, a plurality of conductors functioning as plugs or wirings illustrated in FIG. 21 are collectively denoted by the same reference numeral in some cases. Moreover, in this specification and the like, a wiring and a plug connected to the wiring may be a single component. That is, there are cases where a part of a conductor functions as a wiring and another part of the conductor functions as a plug.

For the conductor 250 and the conductor 251, any of the materials that can be used for the conductor 328 and the conductor 330 can be used, for example.

The insulator 211 is provided over the insulator 241. The conductor 221 is provided over the insulator 211. The insulator 212 is provided over the conductor 221. In addition, the conductor 222 is provided over the insulator 212. That is, the insulator 211, the conductor 221, the insulator 212, and the conductor 222 are stacked in this order (they are referred to as a stacked body). The layer 20 illustrated in FIG. 21 includes the same number of the stacked bodies as the number of the memory cells MC included in one string.

In the manufacturing process of the memory device in FIG. 21, an opening portion is provided in the insulator 211, the conductor 221, the insulator 212, and the conductor 222 through the formation of a resist mask, etching treatment, or the like. At this time, the conductor 221 is selectively removed, and a depression portion is formed by the insulator 211, the conductor 221, and the insulator 212. In this case, the conductor 221 is preferably formed using a material having a higher etching rate than the insulator 211, the insulator 212, and the conductor 222.

The formation of the resist mask can be performed, for example, by a lithography method, a printing method, an inkjet method, or the like as appropriate. Formation of the resist mask by an inkjet method needs no photomask; thus, fabrication cost can be reduced. For the etching treatment, either a dry etching method or a wet etching method or both of them may be used.

The insulator 213, the semiconductor 231, the insulator 214, the insulator 215, the semiconductor 232, and the conductor 223 are formed in this order in the opening portion formed by the etching treatment, which will be described in detail later.

A film having a barrier property which prevents diffusion of hydrogen or impurities is preferably used as the insulator 211 and the insulator 212, for example. Thus, the insulator 211 and the insulator 212 can be formed using, for example, a material similar to that of the insulator 111.

For the conductor 221 and the conductor 222, for example, the material that can be used for the conductor 151 is preferably used. In particular, a conductive material having a function of inhibiting transmission of impurities such as water or hydrogen is preferably used for the conductor 221 and the conductor 222.

The insulator 213 and the semiconductor 231 are formed in this order on the side surface of the above-described opening portion formed by the etching treatment. The insulator 214 is formed to fill the depression portion of the opening portion.

As a formation method of the insulator 214, for example, the insulator 214 is formed on the side surface of the opening portion such that the depression portion of the opening portion is filled, and then, part of the insulator 214 is removed by etching treatment so that the insulator 214 remains in the depression portion and the semiconductor 231 is exposed.

For the insulator 213, silicon oxide or silicon oxynitride can be used, for example. Alternatively, for the insulator 213, aluminum oxide, hafnium oxide, or oxide containing aluminum and hafnium can be used, for example. The insulator 213 may be an insulator including a stack of any of the above.

A metal oxide described in Embodiment 5 is preferably used for the semiconductor 231. In the following description in this embodiment, a metal oxide is used for the semiconductor 231.

When the formed semiconductor 231 is subjected to heat treatment in an oxygen atmosphere before formation of the insulator 214, oxygen can be supplied to the metal oxide of the semiconductor 231. Then, treatment for supplying an impurity or the like to the metal oxide of the semiconductor 231 is performed after the formation of the insulator 214, whereby the resistance of the exposed region of the semiconductor 231 can be reduced. That is, a region of the semiconductor 231 in contact with the insulator 214 becomes a high-resistance region, and a region of the semiconductor 231 not in contact with the insulator 214 becomes a low-resistance region.

As the treatment for supplying an impurity or the like to the metal oxide of the semiconductor 231, for example, the following can be given: formation of a conductor on the side surface of the opening portion and removal of the conductor after the insulator 214 fills the depression portion of the opening portion. When the conductive film is in contact with the metal oxide of the semiconductor 231, a metal element contained in the conductive film is diffused into the semiconductor 231 to form a metal compound with a constitute element of the semiconductor 231 in some cases. The metal compound forms the low-resistance region in the semiconductor 231.

It is preferable that the insulator 214 not include a component forming a compound with a component included in the semiconductor 231 at the interface with the semiconductor 231 that has already been formed and in the vicinity of the interface. Specifically, silicon oxide or the like can be used for the insulator 214, for example.

After that, the insulator 215, the semiconductor 232, the insulator 216, and the conductor 223 are formed in this order over the formation surface of the insulator 213 and the insulator 214. By the formation of the conductor 223, the opening portion provided in the stacked body is filled.

For the insulator 215 and the insulator 216, the material that can be used for the insulator 213 is preferably used, for example.

Like the semiconductor 231, the semiconductor 232 is preferably formed using a metal oxide described in Embodiment 5. In particular, a CAAC-OS to be described later is suitable as the metal oxide. For example, in the case where polycrystalline silicon is used for the semiconductor 231 and the semiconductor 232, the electron trap density might increase due to a grain boundary that might be formed in the polycrystalline silicon and the transistor characteristics might greatly vary. Meanwhile, no clear crystal grain boundary is observed in CAAC-OS, and thus variation in the transistor characteristics can be suppressed.

The material that can be used for the conductor 151 is preferably used for the conductor 223, for example. In particular, a conductive material having a function of inhibiting transmission of impurities such as water or hydrogen is preferably used for the conductor 223.

The insulator 242 is provided in the upper portion of the formed string. The material that can be used for the insulator 111 can be used for the insulator 242, for example.

The conductor 252 is embedded in the insulator 242. The conductor 252 has a function of a plug or a wiring. For the conductor 252, any of the materials that can be used for the conductor 328 and the conductor 330 can be used, for example.

Through the above process, the layer 20 of the memory device 110 described in Embodiment 1 can be manufactured.

Note that the wiring WL illustrated in FIG. 2 corresponds to the conductor 221 and the conductor 222; the conductor 221 is used in data writing, and the conductor 222 is used in data reading.

Accordingly, the capacitor CS is formed in which the conductor 222 serves as one electrode, a region of the insulator 213 in contact with the conductor 222 serves as a dielectric, and a region of the semiconductor 231 overlapping with the conductor 222 serves as the other electrode. In addition, the transistor RTr is formed in which a region of the semiconductor 231 overlapping with the conductor 222 serves as a gate, a region of the insulator 215 overlapping with the conductor 222 serves as a gate insulating film, a region of the semiconductor 232 overlapping with the conductor 222 serves as a channel formation region, a region of the insulator 216 overlapping with the conductor 222 serves as a gate insulating film, and a region of the conductor 223 overlapping with the conductor 222 serves as a back gate. Furthermore, the transistor WTr is formed in which the conductor 221 serves as a gate, the insulator 213 overlapping with the conductor 221 serves as a gate insulating film, and a region of the semiconductor 231 overlapping with the conductor 221 serves as a channel formation region.

Note that the insulators, the conductors, the semiconductors, and the like disclosed in this specification and the like can be formed by a PVD (Physical Vapor Deposition) method or a CVD method. Examples of the PVD method include a sputtering method, a resistance heating evaporation method, an electron beam evaporation method, and a PLD method. Examples of the CVD method include a plasma CVD method and a thermal CVD method. In particular, examples of the thermal CVD method include an MOCVD method and an ALD method.

A thermal CVD method, which is a deposition method not using plasma, has an advantage that no defect due to plasma damage is generated. Deposition by a thermal CVD method may be performed in such a manner that a source gas and an oxidizer are supplied to a chamber at a time and made to react with each other in the vicinity of a substrate or over the substrate, and the reactant is deposited on the substrate while the pressure in the chamber is set to an atmospheric pressure or a reduced pressure.

Deposition by an ALD method may be performed in such a manner that the pressure in a chamber is set to an atmospheric pressure or a reduced pressure, source gases for reaction are sequentially introduced into the chamber, and then the sequence of the gas introduction is repeated. For example, two or more kinds of source gases are sequentially supplied to the chamber by switching respective switching valves (also referred to as high-speed valves); in order to avoid mixing of the plurality of kinds of source gases, an inert gas (argon, nitrogen, or the like) or the like is introduced at the same time as or after the introduction of a first source gas and then a second source gas is introduced. Note that in the case where the first source gas and the inert gas are introduced at a time, the inert gas serves as a carrier gas, and the inert gas may also be introduced at the same time as the introduction of the second source gas. Alternatively, the second source gas may be introduced after the first source gas is exhausted by vacuum evacuation instead of the introduction of the inert gas. The first source gas is adsorbed on the surface of the substrate to form a first thin layer; then the second source gas is introduced to react with the first thin layer; as a result, a second thin layer is stacked over the first thin layer, so that a thin film is formed. The sequence of the gas introduction is controlled and repeated a plurality of times until a desired thickness is obtained, whereby a thin film with excellent step coverage can be formed. The thickness of the thin film can be adjusted by the number of repetition times of the sequence of the gas introduction; therefore, an ALD method makes it possible to accurately adjust a film thickness and is thus suitable for manufacturing a minute FET.

A variety of films such as the metal film, the semiconductor film, and the inorganic insulating film disclosed in the above-described embodiments can be formed by a thermal CVD method such as an MOCVD method or an ALD method; for example, in the case of forming an In—Ga—Zn—O film, trimethylindium ($In(CH_3)_3$), trimethylgallium ($Ga(CH_3)_3$), and dimethylzinc ($Zn(CH_3)_2$) are used. Without limitation to the above combination, triethylgallium ($Ga(C_2H_5)_3$) can also be used instead of trimethylgallium, and diethylzinc ($Zn(C_2H_5)_2$) can also be used instead of dimethylzinc.

For example, in the case where a hafnium oxide film is formed with a deposition apparatus using ALD, two kinds of gases, ozone ($O_3$) as an oxidizer and a source gas which is obtained by vaporizing liquid containing a solvent and a hafnium precursor compound (hafnium alkoxide or hafnium amide such as tetrakis(dimethylamide)hafnium (TDMAH, $Hf[N(CH_3)_2]_4$)), are used. Furthermore, examples of another material include tetrakis(ethylmethylamide)hafnium.

For example, in the case where an aluminum oxide film is formed with a deposition apparatus using ALD, two kinds of gases, $H_2O$ as an oxidizer and a source gas which is obtained by vaporizing liquid containing a solvent and an aluminum precursor compound (trimethylaluminum (TMA, $Al(CH_3)_3$) or the like) are used. Furthermore, examples of another material include tris(dimethylamide)aluminum, triisobutylaluminum, and aluminum tris(2,2,6,6-tetramethyl-3,5-heptanedionate).

For example, in the case where a silicon oxide film is formed with a deposition apparatus using ALD, hexachlorodisilane is adsorbed on a surface on which a film is to be formed, and radicals of an oxidizing gas ($O_2$ or dinitrogen monoxide) are supplied to react with the adsorbate.

For example, in the case where a tungsten film is deposited with a deposition apparatus using ALD, a $WF_6$ gas and a $B_2H_6$ gas are sequentially and repeatedly introduced to form an initial tungsten film, and then a $WF_6$ gas and an $H_2$ gas are sequentially and repeatedly introduced to form a tungsten film. Note that an $SiH_4$ gas may be used instead of a $B_2H_6$ gas.

For example, in the case where an oxide semiconductor film, for example, an In—Ga—Zn—O film, is deposited with a deposition apparatus using ALD, an $In(CH_3)_3$ gas and an $O_3$ gas) are sequentially and repeatedly introduced to form an In—O layer, a $Ga(CH_3)_3$ gas and an $O_3$ gas) are sequentially and repeatedly introduced to form a GaO layer, and then a $Zn(CH_3)_2$ gas and an $O_3$ gas) are sequentially and repeatedly introduced to form a ZnO layer. Note that the order of these layers is not limited to this example. A mixed oxide layer such as an In—Ga—O layer, an In—Zn—O layer, or a Ga—Zn—O layer may be formed with the use of these gases. Note that although an $H_2O$ gas which is obtained by bubbling water with an inert gas such as Ar may be used instead of an $O_3$ gas), it is preferable to use an $O_3$ gas) which does not contain H. Furthermore, instead of an $In(CH_3)_3$ gas, an $In(C_2H_5)_3$ gas may be used. Furthermore, instead of a $Ga(CH_3)_3$ gas, a $Ga(C_2H_5)_3$ gas may be used. Furthermore, a $Zn(CH_3)_2$ gas may be used.

<Structure Example of Layer 40>

An insulator 382 and an insulator 384 are provided to be stacked in this order over the insulator 117 (see FIG. 13 or FIG. 14). Furthermore, a conductor 386 is formed in the insulator 382 and the insulator 384. The conductor 386 has a function of a plug or a wiring. Note that the conductor 386 can be provided using a material similar to those of the conductor 328 and the conductor 330.

An insulator 510, an insulator 512, an insulator 514, and an insulator 516 are provided to be stacked in this order over the insulator 384. A substance having a barrier property against oxygen or hydrogen is preferably used for any of the insulator 510, the insulator 512, the insulator 514, and the insulator 516.

The insulator 510 and the insulator 514 are preferably formed using, for example, a film having a barrier property that prevents diffusion of hydrogen or impurities from the substrate 311, the region where the transistor 300 is provided, or the like into the region where the transistor 500 is provided. Thus, a material similar to that of the insulator 324 can be used.

For the film having a barrier property against hydrogen, silicon nitride formed by a CVD method can be used, for example. Here, diffusion of hydrogen to a semiconductor element including an oxide semiconductor, such as the transistor 500, degrades the characteristics of the semiconductor element in some cases. Therefore, a film that inhibits hydrogen diffusion is preferably used between the transistor 500 and the transistor 300. The film that inhibits hydrogen diffusion is specifically a film from which a small amount of hydrogen is released.

For the film having a barrier property against hydrogen used for the insulator 510 and the insulator 514, for example, a metal oxide such as aluminum oxide, hafnium oxide, or tantalum oxide is preferably used.

In particular, aluminum oxide has a high blocking effect that inhibits the passage of both oxygen and impurities such as hydrogen and moisture which are factors of a change in electrical characteristics of the transistor. Thus, aluminum oxide can prevent the entry of impurities such as hydrogen and moisture into the transistor 500 in the fabrication process and after the fabrication of the transistor. In addition, release of oxygen from the oxide included in the transistor 500 can be inhibited. Therefore, aluminum oxide is suitably used for a protective film of the transistor 500.

The insulator 512 and the insulator 516 can be formed using a material similar to that of the insulator 320, for example. When a material with a relatively low permittivity is used for an interlayer film, the parasitic capacitance between wirings can be reduced. Silicon oxide films, silicon oxynitride films, or the like can be used as the insulator 512 and the insulator 516, for example.

A conductor 518, a conductor included in the transistor 500 (a conductor 503), and the like are embedded in the insulator 510, the insulator 512, the insulator 514, and the insulator 516. Note that the conductor 518 has a function of a plug or a wiring that is connected to the capacitor 600. The conductor 518 can be provided using a material similar to the materials of the conductor 328 and the conductor 330.

In particular, the conductor 518 in a region in contact with the insulator 510 and the insulator 514 is preferably a conductor having a barrier property against oxygen, hydrogen, and water. With this structure, the transistor 300 and the transistor 500 can be separated by the layer having a barrier property against oxygen, hydrogen, and water; thus, the diffusion of hydrogen from the transistor 300 into the transistor 500 can be inhibited.

The transistor 500 is provided over the insulator 516.

As shown in FIG. 15A and FIG. 15B, the transistor 500 includes the conductor 503 positioned to be embedded in the insulator 514 and the insulator 516; an insulator 520 positioned over the insulator 516 and the conductor 503; an insulator 522 positioned over the insulator 520; an insulator 524 positioned over the insulator 522; an oxide 530a positioned over the insulator 524; an oxide 530b positioned over the oxide 530a; a conductor 542a and a conductor 542b positioned apart from each other over the oxide 530b; an insulator 580 that is positioned over the conductor 542a and the conductor 542b and is provided with an opening formed to overlap with a region between the conductor 542a and the conductor 542b; a conductor 560 positioned in the opening; an insulator 550 positioned between the conductor 560 and the oxide 530b, the conductor 542a, the conductor 542b, and the insulator 580; and an oxide 530c positioned between the insulator 550 and the oxide 530b, the conductor 542a, the conductor 542b, and the insulator 580.

As shown in FIG. 15A and FIG. 15B, an insulator 544 is preferably positioned between the insulator 580 and the oxide 530a, the oxide 530b, the conductor 542a, and the conductor 542b. In addition, as shown in FIG. 15A and FIG. 15B, the conductor 560 preferably includes a conductor 560a provided inside the insulator 550 and a conductor 560b provided to be embedded inside the conductor 560a. As shown in FIG. 15A and FIG. 15B, an insulator 574 is preferably positioned over the insulator 580, the conductor 560, and the insulator 550.

Hereinafter, the oxide 530a, the oxide 530b, and the oxide 530c may be collectively referred to as an oxide 530. The conductor 542a and the conductor 542b may be collectively referred to as a conductor 542.

Note that the transistor 500 having a structure in which three layers of the oxide 530a, the oxide 530b, and the oxide 530c are stacked in the region where a channel is formed and its vicinity is illustrated; however, the present invention is not limited thereto. For example, a single layer of the oxide 530b, a two-layer structure of the oxide 530b and the oxide 530a, a two-layer structure of the oxide 530b and the oxide 530c, or a stacked-layer structure of four or more layers may be employed. Furthermore, although the conductor 560 having a stacked-layer structure of two layers in the transistor 500 is illustrated, the present invention is not limited thereto. For example, the conductor 560 may have a single-layer structure or a stacked-layer structure of three or more layers. The transistor 500 shown in FIG. 14, FIG. 15A, and FIG. 15B is an example, and the structure is not limited thereto; an appropriate transistor is used in accordance with a circuit structure or a driving method.

Here, the conductor 560 functions as a gate electrode of the transistor, and the conductor 542a and the conductor 542b function as a source electrode and a drain electrode. As described above, the conductor 560 is formed to be embedded in the opening of the insulator 580 and the region between the conductor 542a and the conductor 542b. The positions of the conductor 560, the conductor 542a, and the conductor 542b are selected in a self-aligned manner with respect to the opening of the insulator 580. That is, in the transistor 500, the gate electrode can be positioned between the source electrode and the drain electrode in a self-aligned manner. Thus, the conductor 560 can be formed without an alignment margin, resulting in a reduction in the area occupied by the transistor 500. Accordingly, miniaturization and high integration of the memory device can be achieved.

In addition, since the conductor 560 is formed in the region between the conductor 542a and the conductor 542b in a self-aligned manner, the conductor 560 does not include a region overlapping with the conductor 542a or the conductor 542b. Thus, parasitic capacitance formed between the conductor 560 and each of the conductor 542a and the conductor 542b can be reduced. As a result, the switching speed of the transistor 500 can be improved, and the transistor 500 can have high frequency characteristics.

The conductor 560 sometimes functions as a first gate electrode. In addition, the conductor 503 sometimes functions as a second gate electrode. In that case, Vth of the transistor 500 can be controlled by changing a potential applied to the conductor 503 independently of a potential applied to the conductor 560. In particular, Vth of the transistor 500 can be higher than 0 V and the off-state current can be reduced by applying a negative potential to the conductor 503. Thus, a drain current at the time when a potential applied to the conductor 560 is 0 V can be lower in the case where a negative potential is applied to the conductor 503 than in the case where a negative potential is not applied to the conductor 503.

The conductor 503 is positioned to overlap with the oxide 530 and the conductor 560. Thus, when potentials are applied to the conductor 560 and the conductor 503, an electric field generated from the conductor 560 and an electric field generated from the conductor 503 are connected, so that the channel formation region formed in the oxide 530 can be covered. In this specification and the like, a transistor structure in which a channel formation region is electrically surrounded by electric fields of a first gate electrode and a second gate electrode is referred to as a surrounded channel (S-channel) structure.

Furthermore, in this specification and the like, the S-channel structure has a feature that the side surface and the vicinity of the oxide 530 in contact with the conductor 542a and the conductor 542b functioning as the source electrode and the drain electrode are of i-type like the channel formation region. The side surface and the vicinity of the oxide 530 in contact with the conductor 542a and the conductor 542b are in contact with the insulator 544 and thus can be of i-type like the channel formation region. Note that in this specification and the like, "i-type" can be equated with "highly purified intrinsic" to be described later. The S-channel structure disclosed in this specification and the like is different from a Fin-type structure and a planar structure. With the S-channel structure, resistance to a short-channel effect can be enhanced, that is, a transistor in which a short-channel effect is less likely to occur can be provided.

The conductor 503 has a structure similar to that of the conductor 518; a conductor 503a is formed in contact with an inner wall of an opening in the insulator 514 and the insulator 516, and a conductor 503b is formed on the inner side.

The insulator 520, the insulator 522, the insulator 524, and the insulator 550 each have a function of a gate insulating film.

Here, for the insulator 524 in contact with the oxide 530, an insulator that contains oxygen more than oxygen in the stoichiometric composition is preferably used. That is, an excess-oxygen region is preferably formed in the insulator 524. When such an insulator containing excess oxygen is provided in contact with the oxide 530, oxygen vacancies in the oxide 530 can be reduced and the reliability of the transistor 500 can be improved.

As the insulator including an excess-oxygen region, specifically, an oxide material from which part of oxygen is released by heating is preferably used. An oxide from which oxygen is released by heating is an oxide film in which the amount of released oxygen converted into oxygen atoms is greater than or equal to $1.0 \times 10^{18}$ atoms/cm$^3$, preferably greater than or equal to $1.0 \times 10^{19}$ atoms/cm$^3$, further preferably greater than or equal to $2.0 \times 10^{19}$ atoms/cm$^3$ or greater than or equal to $3.0 \times 10^{20}$ atoms/cm$^3$ in TDS analysis. Note that the temperature of the film surface in the TDS analysis is preferably within the range of 100° C. to 700° C., or 100° C. to 400° C.

When the insulator 524 includes an excess-oxygen region, it is preferable that the insulator 522 have a function of inhibiting diffusion of oxygen (e.g., oxygen atoms and oxygen molecules) (or that the above oxygen be less likely to pass through the insulator 522).

When the insulator 522 has a function of inhibiting diffusion of oxygen or impurities, oxygen contained in the oxide 530 is not diffused to the insulator 520 side, which is preferable. Furthermore, the conductor 503 can be inhibited from reacting with oxygen contained in the insulator 524 or the oxide 530.

For example, the insulator 522 is preferably formed using a single layer or stacked layers of an insulator containing aluminum oxide, hafnium oxide, tantalum oxide, zirconium oxide, lead zirconate titanate (PZT), strontium titanate (SrTiO$_3$), (Ba,Sr)TiO$_3$ (BST), or the like. With miniaturization and high integration of transistors, a problem such as leakage current might arise because of a thinner gate insulating film. When a high-k material is used for the insulator functioning as the gate insulating film, a gate potential at the time when the transistor operates can be reduced while the physical thickness is maintained.

It is particularly preferable to use an insulator containing an oxide of one or both of aluminum and hafnium, which is an insulating material having a function of inhibiting diffusion of impurities, oxygen, and the like (through which the above oxygen is less likely to pass). As the insulator containing an oxide of one or both of aluminum and hafnium, aluminum oxide, hafnium oxide, an oxide containing aluminum and hafnium (hafnium aluminate), or the like is preferably used. In the case where the insulator 522 is formed using such a material, the insulator 522 functions as a layer that inhibits release of oxygen from the oxide 530 and mixing of impurities such as hydrogen from the periphery of the transistor 500 into the oxide 530.

Alternatively, aluminum oxide, bismuth oxide, germanium oxide, niobium oxide, silicon oxide, titanium oxide, tungsten oxide, yttrium oxide, or zirconium oxide may be added to these insulators, for example. Alternatively, these insulators may be subjected to nitriding treatment. Silicon oxide, silicon oxynitride, or silicon nitride may be stacked over the insulator.

It is preferable that the insulator 520 be thermally stable. For example, silicon oxide and silicon oxynitride, which have thermal stability, are preferable. Furthermore, when an insulator that is a high-k material is combined with silicon oxide or silicon oxynitride, the insulator 520 having a stacked-layer structure that has thermal stability and a high relative permittivity can be obtained.

Note that the insulator 520, the insulator 522, and the insulator 524 may each have a stacked-layer structure of two or more layers. In that case, without limitation to a stacked-layer structure formed of the same material, a stacked-layer structure formed of different materials may be employed.

In the transistor 500, a metal oxide functioning as an oxide semiconductor is preferably used for the oxide 530 including the channel formation region. For example, for the oxide 530, a metal oxide such as an In-M-Zn oxide (the element M is one or more kinds selected from aluminum, gallium, yttrium, copper, vanadium, beryllium, boron, tin, titanium, iron, nickel, germanium, zirconium, molybdenum, lanthanum, cerium, neodymium, hafnium, tantalum, tungsten, magnesium, and the like) is preferably used. Furthermore, for the oxide 530, an In—Ga oxide or an In—Zn oxide may be used.

The metal oxide functioning as an oxide semiconductor may be formed by a sputtering method, an ALD method, or a CVD method such as an MOCVD method. The metal oxide functioning as an oxide semiconductor will be described in another embodiment.

Furthermore, a metal oxide with a low carrier density is preferably used in the transistor 500. In order to reduce the carrier density of the metal oxide, the concentration of impurities in the metal oxide is reduced so that the density of defect states can be reduced. In this specification and the like, a state with a low impurity concentration and a low density of defect states is referred to as a highly purified intrinsic or substantially highly purified intrinsic state. Examples of impurities in a metal oxide include hydrogen, nitrogen, alkali metal, alkaline earth metal, iron, nickel, and silicon.

In particular, hydrogen contained in a metal oxide reacts with oxygen bonded to a metal atom to be water, and thus forms oxygen vacancies in the metal oxide in some cases. If the channel formation region in the metal oxide includes oxygen vacancies, the transistor sometimes has normally-on characteristics. In some cases, a defect that is an oxygen vacancy into which hydrogen has entered functions as a donor and generates an electron serving as a carrier. In other cases, bonding of part of hydrogen to oxygen bonded to a metal atom generates electrons serving as carriers. Thus, a transistor using a metal oxide containing a large amount of hydrogen is likely to have normally-on characteristics.

A defect that is an oxygen vacancy into which hydrogen has entered can function as a donor of a metal oxide. However, it is difficult to evaluate the defects quantitatively. Thus, the metal oxide is sometimes evaluated by not its donor concentration but its carrier density. Therefore, in this specification and the like, as the parameter of the metal oxide, the carrier density assuming the state where an electric field is not applied is sometimes used instead of the donor concentration. That is, "carrier density" in this specification and the like can be replaced with "donor concentration" in some cases.

Consequently, when a metal oxide is used for the oxide 530, hydrogen in the metal oxide is preferably reduced as much as possible. Specifically, the hydrogen concentration of the metal oxide, which is measured by secondary ion mass spectrometry (SIMS), is lower than $1\times10^{20}$ atoms/cm$^3$, preferably lower than $1\times10^{19}$ atoms/cm$^3$, further preferably lower than $5\times10^{18}$ atoms/cm$^3$, and still further preferably lower than $1\times10^{18}$ atoms/cm$^3$. When a metal oxide with a sufficiently low concentration of impurities such as hydrogen is used for a channel formation region of a transistor, the transistor can have stable electrical characteristics.

When a metal oxide is used for the oxide 530, the carrier density of the metal oxide in the channel formation region is preferably lower than or equal to $1\times10^{18}$ cm$^{-3}$, further preferably lower than $1\times10^{17}$ cm$^{-3}$, still further preferably lower than $1\times10^{16}$ cm$^{-3}$, yet further preferably lower than $1\times10^{13}$ cm$^{-3}$, yet still further preferably lower than $1\times10^{12}$ cm$^{-3}$. Note that the lower limit of the carrier density of the metal oxide in the channel formation region is not particularly limited and can be, for example, $1\times10^{-9}$ cm$^{-3}$.

When a metal oxide is used for the oxide 530, contact between the conductor 542 (the conductor 542a and the conductor 542b) and the oxide 530 may make oxygen in the oxide 530 diffuse into the conductor 542, resulting in oxidation of the conductor 542. It is highly possible that oxidation of the conductor 542 lowers the conductivity of the conductor 542. Note that diffusion of oxygen in the oxide 530 into the conductor 542 can be interpreted as absorption of oxygen in the oxide 530 by the conductor 542.

When oxygen in the oxide 530 is diffused into the conductor 542 (the conductor 542a and the conductor 542b), a layer is sometimes formed between the conductor 542a and the oxide 530b, and between the conductor 542b and the oxide 530b. The layer contains more oxygen than the conductor 542 does, and thus presumably has an insulating property. In this case, a three-layer structure of the conductor 542, the layer, and the oxide 530b can be regarded as a three-layer structure of a metal, an insulator, and a semiconductor and is sometimes referred to as an MIS (Metal-Insulator-Semiconductor) structure or a diode junction structure having an MIS structure as its main part.

The above layer is not necessarily formed between the conductor 542 and the oxide 530b, but the layer may be formed between the conductor 542 and the oxide 530c, or formed between the conductor 542 and the oxide 530b and between the conductor 542 and the oxide 530c.

The metal oxide functioning as the channel formation region in the oxide 530 has a band gap of preferably 2 eV or larger, further preferably 2.5 eV or larger. With the use of a metal oxide having such a wide band gap, the off-state current of the transistor can be reduced.

Semiconductor materials that can be used for the oxide 530 are not limited to the above metal oxides. A semiconductor material having a band gap (a semiconductor material that is not a zero-gap semiconductor) may be used for the oxide 530. For example, a single element semiconductor such as silicon, a compound semiconductor such as gallium arsenide, or a layered material functioning as a semiconductor (also referred to as an atomic layer material or a two-dimensional material) is preferably used as a semiconductor material. In particular, a layered material functioning as a semiconductor is preferably used as a semiconductor material.

Here, in this specification and the like, the layered material is a general term of a group of materials having a layered crystal structure. In the layered crystal structure, layers formed by covalent bonding or ionic bonding are stacked with bonding such as the Van der Waals force, which is weaker than covalent bonding or ionic bonding. The layered material has high electrical conductivity in a monolayer, that is, high two-dimensional electrical conductivity. When a material functioning as a semiconductor and having high two-dimensional electrical conductivity is used for a channel formation region, a transistor having a high on-state current can be provided.

Examples of the layered material include graphene, silicene, and chalcogenide. Chalcogenide is a compound containing chalcogen. Chalcogen is a general term of elements belonging to Group 16, which includes oxygen, sulfur, selenium, tellurium, polonium, and livermorium. Examples of chalcogenide include transition metal chalcogenide and chalcogenide of Group 13 elements.

For the oxide 530, a transition metal chalcogenide functioning as a semiconductor is preferably used, for example. Specific examples of the transition metal chalcogenide which can be used for the oxide 530 include molybdenum sulfide (typically $MoS_2$), molybdenum selenide (typically $MoSe_2$), molybdenum telluride (typically $MoTe_2$), tungsten sulfide (typically $WS_2$), tungsten selenide (typically $WSe_2$), tungsten telluride (typically $WTe_2$), hafnium sulfide (typically $HfS_2$), hafnium selenide (typically $HfSe_2$), zirconium sulfide (typically $ZrS_2$), and zirconium selenide (typically $ZrSe_2$).

When the oxide 530 includes the oxide 530a under the oxide 530b, it is possible to inhibit diffusion of impurities into the oxide 530b from the components formed below the oxide 530a. Moreover, including the oxide 530c over the oxide 530b makes it possible to inhibit diffusion of impurities into the oxide 530b from the components formed above the oxide 530c.

Note that the oxide 530 preferably has a stacked-layer structure of a plurality of oxide layers that differ in the atomic ratio of metal atoms. Specifically, the atomic proportion of the element M in the constituent elements in the metal oxide used for the oxide 530a is preferably higher than the atomic proportion of the element M in the constituent elements in the metal oxide used for the oxide 530b. In addition, the atomic ratio of the element M to In in the metal oxide used for the oxide 530a is preferably higher than the atomic ratio of the element M to In in the metal oxide used for the oxide 530b. Furthermore, the atomic ratio of In to the element M in the metal oxide used for the oxide 530b is preferably higher than the atomic ratio of In to the element M in the metal oxide used for the oxide 530a. A metal oxide that can be used for the oxide 530a or the oxide 530b can be used for the oxide 530c.

The energy of the conduction band minimum of each of the oxide 530a and the oxide 530c is preferably higher than the energy of the conduction band minimum of the oxide 530b. In other words, the electron affinity of each of the oxide 530a and the oxide 530c is preferably smaller than the electron affinity of the oxide 530b.

The energy level of the conduction band minimum gradually changes at junction portions of the oxide 530a, the oxide 530b, and the oxide 530c. In other words, the energy level of the conduction band minimum at the junction portions of the oxide 530a, the oxide 530b, and the oxide 530c continuously changes or is continuously connected. To obtain this, the density of defect states in a mixed layer formed at the interface between the oxide 530a and the oxide 530b and the interface between the oxide 530b and the oxide 530c is preferably made low.

Specifically, when the oxide 530a and the oxide 530b or the oxide 530b and the oxide 530c contain a common element (as a main component) in addition to oxygen, a mixed layer with a low density of defect states can be formed. For example, in the case where the oxide 530b is an In—Ga—Zn oxide, an In—Ga—Zn oxide, a Ga—Zn oxide, gallium oxide, or the like is preferably used for the oxide 530a and the oxide 530c.

At this time, the oxide 530b serves as a main carrier path. When the oxide 530a and the oxide 530c have the above structure, the density of defect states at the interface between the oxide 530a and the oxide 530b and the interface between the oxide 530b and the oxide 530c can be made low. Thus, the influence of interface scattering on carrier conduction is small, and the transistor 500 can have a high on-state current.

The conductor 542 (the conductor 542a and the conductor 542b) functioning as the source electrode and the drain electrode is provided over the oxide 530b. For the conductor 542, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, and lanthanum; an alloy containing any of the above metal elements as its component; an alloy containing a combination of the above metal elements; or the like. For example, it is preferable to use tantalum nitride, titanium nitride, tungsten, a nitride containing titanium and aluminum, a nitride containing tantalum and aluminum, ruthenium oxide, ruthenium nitride, an oxide containing strontium and ruthenium, an oxide containing lanthanum and nickel, or the like. Tantalum nitride, titanium nitride, a nitride containing titanium and aluminum, a nitride containing tantalum and aluminum, ruthenium oxide, ruthenium nitride, an oxide containing strontium and ruthenium, and an oxide containing lanthanum and nickel are preferable because they are oxidation-resistant conductive materials or materials that retain their conductivity even after absorbing oxygen.

As shown in FIG. 15A, a region 543 (a region 543a and a region 543b) is sometimes formed as a low-resistance region at and near the interface between the oxide 530 and the conductor 542. In that case, the region 543a functions as one of a source region and a drain region, and the region 543b functions as the other of the source region and the drain region. Furthermore, the channel formation region is formed in a region between the region 543a and the region 543b.

When the conductor 542 is provided in contact with the oxide 530, the oxygen concentration in the region 543 sometimes decreases. In addition, a metal compound layer that contains the metal contained in the conductor 542 and the component of the oxide 530 is sometimes formed in the region 543. In such a case, the carrier density of the region 543 increases, and the region 543 becomes a low-resistance region.

The insulator 544 is provided to cover the conductor 542 and inhibits oxidation of the conductor 542. At this time, the insulator 544 is provided to cover the side surface of the oxide 530 and the side surface of the insulator 524 and to be in contact with the insulator 522. Alternatively, the insulator 544 is not necessarily in contact with the insulator 522, and the insulator 524 may be provided between the insulator 522 and the insulator 544. In this case, the insulator 544 is provided to cover the side surface of the oxide 530 and to be in contact with the insulator 524.

A metal oxide containing one or more kinds selected from hafnium, aluminum, gallium, yttrium, zirconium, tungsten, titanium, tantalum, nickel, germanium, magnesium, and the like can be used for the insulator 544. Alternatively, silicon nitride may be used for the insulator 544.

For the insulator 544, it is particularly preferable to use an insulator containing an oxide of one or both of aluminum and hafnium, for example, aluminum oxide, hafnium oxide, or an oxide containing aluminum and hafnium (hafnium aluminate). In particular, hafnium aluminate has higher heat resistance than a hafnium oxide film. Therefore, hafnium aluminate is preferable because it is unlikely to be crystallized by heat treatment in a later step. Note that the insulator 544 is not an essential component when the conductor 542 is an oxidation-resistant material or is a material that does not significantly lose its conductivity even after absorbing oxygen. Design is appropriately set in consideration of required transistor characteristics.

The insulator 550 functions as a gate insulating film. The insulator 550 is preferably positioned in contact with the inner side (the top surface and the side surface) of the oxide 530c. The insulator 550 is preferably formed using an insulator from which oxygen is released by heating. For example, the insulator 550 is an oxide film in which the amount of released oxygen converted into oxygen atoms is greater than or equal to $1.0 \times 10^{18}$ atoms/cm³, preferably greater than or equal to $1.0 \times 10^{19}$ atoms/cm³, further preferably greater than or equal to $2.0 \times 10^{19}$ atoms/cm³ or greater than or equal to $3.0 \times 10^{20}$ atoms/cm³ in TDS analysis. Note that the temperature of the film surface in the TDS analysis is preferably within the range of 100° C. to 700° C.

Specifically, silicon oxide containing excess oxygen, silicon oxynitride, silicon nitride oxide, silicon nitride, silicon oxide to which fluorine is added, silicon oxide to which carbon is added, silicon oxide to which carbon and nitrogen are added, or porous silicon oxide can be used. In particular, silicon oxide and silicon oxynitride, which have thermal stability, are preferable.

When an insulator from which oxygen is released by heating is provided for the insulator 550 in contact with the top surface of the oxide 530c, oxygen can be effectively supplied from the insulator 550 to the channel formation region of the oxide 530b through the oxide 530c. Furthermore, as in the insulator 524, the concentration of impurities such as water or hydrogen in the insulator 550 is preferably reduced. The thickness of the insulator 550 is preferably greater than or equal to 1 nm and less than or equal to 20 nm.

To efficiently supply excess oxygen contained in the insulator 550 to the oxide 530, a metal oxide may be provided between the insulator 550 and the conductor 560. The metal oxide preferably inhibits diffusion of oxygen from the insulator 550 into the conductor 560. Providing the metal oxide that inhibits diffusion of oxygen inhibits diffusion of excess oxygen from the insulator 550 into the conductor 560. That is, a reduction in the amount of excess oxygen supplied to the oxide 530 can be inhibited. Moreover, oxidation of the conductor 560 due to excess oxygen can be inhibited. For the metal oxide, a material that can be used for the insulator 544 is used.

Although the conductor 560 functioning as the first gate electrode has a two-layer structure in FIG. 15A and FIG. 15B, the conductor 560 may have a single-layer structure or a stacked-layer structure of three or more layers.

For the conductor 560a, it is preferable to use a conductive material having a function of inhibiting diffusion of impurities such as a hydrogen atom, a hydrogen molecule, a water molecule, a nitrogen atom, a nitrogen molecule, a nitrogen oxide molecule ($N_2O$, NO, $NO_2$, and the like), and a copper atom. Alternatively, it is preferable to use a conductive material having a function of inhibiting diffusion of oxygen (e.g., at least one of an oxygen atom, an oxygen molecule, and the like). When the conductor 560a has a function of inhibiting diffusion of oxygen, it is possible to inhibit a reduction in conductivity of the conductor 560b due to oxidation caused by oxygen contained in the insulator 550. As a conductive material having a function of inhibiting diffusion of oxygen, for example, tantalum, tantalum nitride, ruthenium, ruthenium oxide, or the like is preferably used.

The conductor 560b is preferably formed using a conductive material containing tungsten, copper, or aluminum as its main component. Furthermore, the conductor 560b also functions as a wiring and thus is preferably a conductor having high conductivity. For example, a conductive material containing tungsten, copper, or aluminum as its main component can be used. The conductor 560b may have a stacked-layer structure, for example, a stacked-layer structure of any of the above conductive materials and titanium or titanium nitride.

The insulator 580 is provided over the conductor 542 with the insulator 544 therebetween. The insulator 580 preferably includes an excess-oxygen region. For example, the insulator 580 preferably contains silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, a resin, or the like. In particular, silicon oxide and silicon oxynitride, which have thermal stability, are preferable. In particular, silicon oxide and porous silicon oxide are preferable because an excess-oxygen region can be easily formed in a later step.

When the insulator 580 from which oxygen is released by heating is provided in contact with the oxide 530c, oxygen in the insulator 580 can be efficiently supplied to the oxide 530 through the oxide 530c. Note that the concentration of impurities such as water or hydrogen in the insulator 580 is preferably reduced.

The opening in the insulator 580 is formed to overlap with the region between the conductor 542a and the conductor 542b. Accordingly, the conductor 560 is formed to be embedded in the opening in the insulator 580 and the region between the conductor 542a and the conductor 542b.

The gate length needs to be short for miniaturization of the memory device, but it is necessary to prevent a reduction in conductivity of the conductor 560. When the conductor 560 is made thick to achieve this, the conductor 560 might have a shape with a high aspect ratio. In this embodiment, the conductor 560 is provided to be embedded in the opening in the insulator 580; thus, even when the conductor 560 has a shape with a high aspect ratio, the conductor 560 can be formed without collapsing during the process.

The insulator 574 is preferably provided in contact with the top surface of the insulator 580, the top surface of the conductor 560, and the top surface of the insulator 550. When the insulator 574 is deposited by a sputtering method, an excess-oxygen region can be provided in the insulator 550 and the insulator 580. Thus, oxygen can be supplied from the excess-oxygen region to the oxide 530.

For the insulator 574, a metal oxide containing one or more kinds selected from hafnium, aluminum, gallium, yttrium, zirconium, tungsten, titanium, tantalum, nickel, germanium, magnesium, and the like can be used, for example.

In particular, aluminum oxide has a high barrier property, and even a thin aluminum oxide film having a thickness greater than or equal to 0.5 nm and less than or equal to 3.0 nm can inhibit diffusion of hydrogen and nitrogen. Thus, aluminum oxide deposited by a sputtering method serves as an oxygen supply source and can also have a function of a barrier film against impurities such as hydrogen.

An insulator 581 functioning as an interlayer film is preferably provided over the insulator 574. As in the insulator 524 and the like, the concentration of impurities such as water or hydrogen in the insulator 581 is preferably reduced.

A conductor 540a and a conductor 540b are positioned in openings formed in the insulator 581, the insulator 574, the insulator 580, and the insulator 544. The conductor 540a and the conductor 540b are provided to face each other with the conductor 560 therebetween. The structures of the conductor

540*a* and the conductor 540*b* are similar to the structures of a conductor 546 and a conductor 548 that will be described later.

An insulator 582 is provided over the insulator 581. A substance having a barrier property against oxygen or hydrogen is preferably used for the insulator 582. Therefore, a material similar to that of the insulator 514 can be used for the insulator 582. For the insulator 582, a metal oxide such as aluminum oxide, hafnium oxide, or tantalum oxide is preferably used, for example.

In particular, aluminum oxide has a high blocking effect that inhibits the passage of both oxygen and impurities such as hydrogen and moisture which are factors of a change in electrical characteristics of the transistor. Thus, aluminum oxide can prevent the entry of impurities such as hydrogen and moisture into the transistor 500 in the fabrication process and after the fabrication of the transistor. In addition, release of oxygen from the oxide included in the transistor 500 can be inhibited. Therefore, aluminum oxide is suitably used for a protective film of the transistor 500.

An insulator 586 is provided over the insulator 582. For the insulator 586, a material similar to that of the insulator 320 can be used. When a material with a relatively low permittivity is used for the interlayer film, the parasitic capacitance between wirings can be reduced. A silicon oxide film, a silicon oxynitride film, or the like can be used for the insulator 586, for example.

The conductor 546, the conductor 548, and the like are embedded in the insulator 520, the insulator 522, the insulator 544, the insulator 580, the insulator 574, the insulator 581, the insulator 582, and the insulator 586.

The conductor 546 and the conductor 548 have functions of plugs or wirings that are connected to the capacitor 600 and the transistor 500. The conductor 546 and the conductor 548 can be provided using materials similar to the materials of the conductor 328 and the conductor 330.

Next, the capacitor 600 is provided above the transistor 500. The capacitor 600 includes a conductor 610, a conductor 620, and an insulator 630.

A conductor 612 may be provided over the conductor 546 and the conductor 548. The conductor 612 has a function of a plug or a wiring that is connected to the transistor 500. The conductor 610 has a function of an electrode of the capacitor 600. The conductor 612 and the conductor 610 can be formed at the same time.

The conductor 612 and the conductor 610 can be formed using a metal film containing an element selected from molybdenum, titanium, tantalum, tungsten, aluminum, copper, chromium, neodymium, and scandium; a metal nitride film containing any of the above elements as its component (a tantalum nitride film, a titanium nitride film, a molybdenum nitride film, or a tungsten nitride film); or the like. Alternatively, it is possible to use a conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added.

Although the conductor 612 and the conductor 610 having a single-layer structure are illustrated in FIG. 14, the structure is not limited thereto, and a stacked-layer structure of two or more layers may be employed. For example, between a conductor having a barrier property and a conductor having high conductivity, a conductor that is highly adhesive to the conductor having a barrier property and the conductor having high conductivity may be formed.

The conductor 620 is provided to overlap with the conductor 610 with the insulator 630 therebetween. Note that the conductor 620 can be formed using a conductive material such as a metal material, an alloy material, or a metal oxide material. It is preferable to use a high-melting-point material that has both heat resistance and conductivity, such as tungsten or molybdenum, and it is particularly preferable to use tungsten. In addition, in the case where the conductor 620 is formed concurrently with another component such as a conductor, Cu (copper), Al (aluminum), or the like, which is a low-resistance metal material, is used.

An insulator 650 is provided over the conductor 620 and the insulator 630. The insulator 650 can be provided using a material similar to that of the insulator 320. The insulator 650 may function as a planarization film that covers an uneven shape thereunder.

With the use of this structure, a change in electrical characteristics can be inhibited and reliability can be improved in a memory device including an OS transistor. Alternatively, an OS transistor having a high on-state current can be provided. Alternatively, an OS transistor having a low off-state current can be provided. Alternatively, a memory device including an OS transistor can be miniaturized or highly integrated.

<Structure Example of Transistor>

Note that the structure of the transistor 500 described in this embodiment is not limited to the above. Examples of structures that can be used for the transistor 500 will be described below.

<Structure Example 1 of Transistor>

Figure 16A:
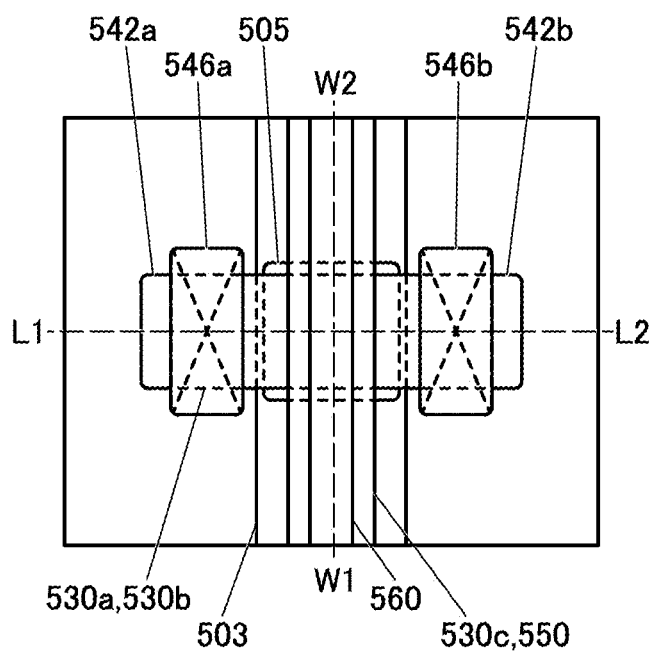
FIG. 16A is a top view illustrating a structure example of a transistor.
Figure 16C:
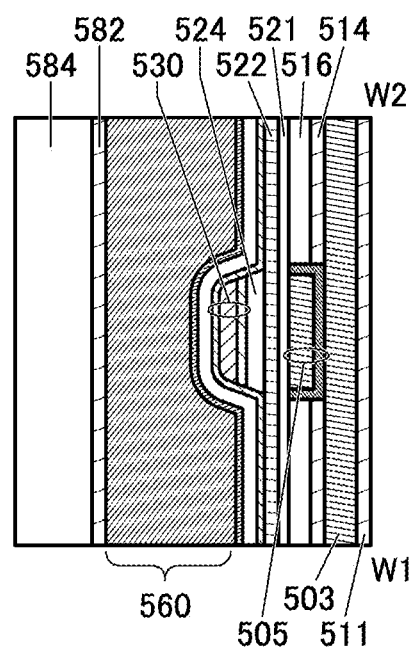
FIG. 16B and FIG. 16C are cross-sectional views illustrating the structure example of the transistor.
Figure 16B:
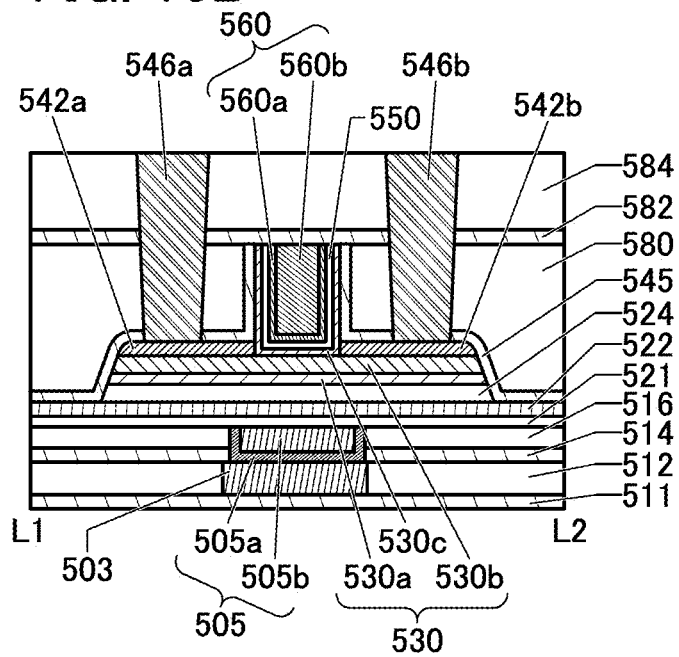

A structure example of a transistor 510A is described with reference to FIG. 16A, FIG. 16B, and FIG. 16C. FIG. 16A is a top view of the transistor 510A. FIG. 16B is a cross-sectional view of a portion indicated by dashed-dotted line L1-L2 in FIG. 16A. FIG. 16C is a cross-sectional view of a portion indicated by dashed-dotted line W1-W2 in FIG. 16A. Note that for clarity of the drawing, some components are not illustrated in the top view of FIG. 16A.

FIG. 16A, FIG. 16B, and FIG. 16C show the transistor 510A and an insulator 511, the insulator 512, the insulator 514, the insulator 516, the insulator 580, the insulator 582, and an insulator 584 that function as interlayer films. In addition, the conductor 546 (a conductor 546*a* and a conductor 546*b*) that is electrically connected to the transistor 510A and functions as a contact plug, and the conductor 503 functioning as a wiring are illustrated.

The transistor 510A includes the conductor 560 (the conductor 560*a* and the conductor 560*b*) functioning as a first gate electrode; a conductor 505 (a conductor 505*a* and a conductor 505*b*) functioning as a second gate electrode; the insulator 550 functioning as a first gate insulating film; an insulator 521, the insulator 522, and the insulator 524 that function as a second gate insulating film; the oxide 530 (the oxide 530*a*, the oxide 530*b*, and the oxide 530*c*) including a region where a channel is formed; the conductor 542*a* functioning as one of a source and a drain; the conductor 542*b* functioning as the other of the source and the drain; and the insulator 545.

In the transistor 510A shown in FIG. 16B, the oxide 530*c*, the insulator 550, and the conductor 560 are positioned in an opening portion provided in the insulator 580 with the insulator 545 therebetween. Moreover, the oxide 530*c*, the insulator 550, and the conductor 560 are positioned between the conductor 542*a* and the conductor 542*b*.

The insulator 511 and the insulator 512 each function as an interlayer film.

As the interlayer film, a single layer or stacked layers of an insulator such as silicon oxide, silicon oxynitride, silicon nitride oxide, silicon nitride, aluminum oxide, aluminum oxynitride, aluminum nitride oxide, aluminum nitride, hafnium oxide, hafnium oxynitride, hafnium nitride oxide, hafnium nitride, tantalum oxide, zirconium oxide, lead zirconate titanate (PZT), strontium titanate ($SrTiO_3$), or ($Ba,Sr$)$TiO_3$ (BST) can be used. Alternatively, aluminum oxide, bismuth oxide, germanium oxide, niobium oxide, silicon oxide, titanium oxide, tungsten oxide, yttrium oxide, or zirconium oxide may be added to these insulators, for example. Alternatively, these insulators may be subjected to nitriding treatment. Silicon oxide, silicon oxynitride, or silicon nitride may be stacked over the insulator.

For example, the insulator 511 preferably functions as a barrier film that inhibits entry of impurities such as water or hydrogen into the transistor 510A from the substrate side. Accordingly, for the insulator 511, it is preferable to use an insulating material that has a function of inhibiting diffusion of impurities such as a hydrogen atom, a hydrogen molecule, a water molecule, and a copper atom (through which the above impurities are less likely to pass). Alternatively, it is preferable to use an insulating material that has a function of inhibiting diffusion of oxygen (e.g., at least one of an oxygen atom, an oxygen molecule, and the like) (through which the above oxygen is less likely to pass). Moreover, aluminum oxide or silicon nitride, for example, may be used for the insulator 511. This structure can inhibit diffusion of impurities such as hydrogen and water to the transistor 510A side from the substrate side through the insulator 511.

For example, the permittivity of the insulator 512 is preferably lower than that of the insulator 511. When a material with a low permittivity is used for the interlayer film, the parasitic capacitance generated between wirings can be reduced.

The conductor 503 is formed to be embedded in the insulator 512. Here, the top surface of the conductor 503 and the top surface of the insulator 512 can be substantially level with each other. Note that although the conductor 503 has a single-layer structure, the present invention is not limited thereto. For example, the conductor 503 may have a multi-layer structure of two or more layers. Note that for the conductor 503, a conductive material that has high conductivity and contains tungsten, copper, or aluminum as its main component is preferably used.

In the transistor 510A, the conductor 560 sometimes functions as a first gate electrode. The conductor 505 sometimes functions as a second gate electrode. In that case, the threshold voltage of the transistor 510A can be controlled by changing a potential applied to the conductor 505 independently of a potential applied to the conductor 560. In particular, when a negative potential is applied to the conductor 505, the threshold voltage of the transistor 510A can be higher than 0 V, and the off-state current can be reduced. Thus, a drain current at the time when a potential applied to the conductor 560 is 0 V can be lower in the case where a negative potential is applied to the conductor 505 than in the case where a negative potential is not applied to the conductor 505.

For example, when the conductor 505 and the conductor 560 are provided to overlap with each other, in the case where a potential is applied to the conductor 560 and the conductor 505, an electric field generated from the conductor 560 and an electric field generated from the conductor 505 are connected, so that the channel formation region formed in the oxide 530 can be covered.

That is, the channel formation region can be electrically surrounded by the electric field of the conductor 560 having a function of the first gate electrode and the electric field of the conductor 505 having a function of the second gate electrode. In other words, the transistor 510A has an S-channel structure, like the transistor 500 described above.

Like the insulator 511 or the insulator 512, the insulator 514 and the insulator 516 each function as an interlayer film. For example, the insulator 514 preferably functions as a barrier film that inhibits entry of impurities such as water or hydrogen into the transistor 510A from the substrate side. This structure can inhibit diffusion of impurities such as hydrogen and water to the transistor 510A side from the substrate side through the insulator 514. Moreover, for example, the insulator 516 preferably has a lower permittivity than the insulator 514. When a material with a low permittivity is used for the interlayer film, the parasitic capacitance generated between wirings can be reduced.

In the conductor 505 functioning as the second gate, the conductor 505a is formed in contact with an inner wall of an opening in the insulator 514 and the insulator 516, and the conductor 505b is formed further inside. Here, the top surfaces of the conductor 505a and the conductor 505b and the top surface of the insulator 516 can be substantially level with each other. Although the transistor 510A has a structure in which the conductor 505a and the conductor 505b are stacked, the present invention is not limited thereto. For example, the conductor 505 may have a single-layer structure or a stacked-layer structure of three or more layers.

Here, for the conductor 505a, it is preferable to use a conductive material that has a function of inhibiting diffusion of impurities such as a hydrogen atom, a hydrogen molecule, a water molecule, and a copper atom (through which the above impurities are less likely to pass). Alternatively, it is preferable to use a conductive material that has a function of inhibiting diffusion of oxygen (e.g., at least one of an oxygen atom, an oxygen molecule, and the like) (through which the above oxygen is less likely to pass). Note that in this specification and the like, a function of inhibiting diffusion of impurities or oxygen means a function of inhibiting diffusion of any one or all of the above impurities and the above oxygen.

For example, when the conductor 505a has a function of inhibiting diffusion of oxygen, a reduction in conductivity of the conductor 505b due to oxidation can be inhibited.

In the case where the conductor 505 doubles as a wiring, the conductor 505b is preferably formed using a conductive material that has high conductivity and contains tungsten, copper, or aluminum as its main component. In that case, the conductor 503 is not necessarily provided. Note that the conductor 505b is illustrated as a single layer but may have a stacked-layer structure, for example, a stack of any of the above conductive materials and titanium or titanium nitride.

The insulator 521, the insulator 522, and the insulator 524 each have a function of a second gate insulating film.

The insulator 522 preferably has a barrier property. The insulator 522 having a barrier property functions as a layer that inhibits entry of impurities such as hydrogen into the transistor 510A from the surroundings of the transistor 510A.

As the insulator 522, a single layer or stacked layers of an insulator containing aluminum oxide, hafnium oxide, an oxide containing aluminum and hafnium (hafnium aluminate), oxynitride containing aluminum and hafnium, tantalum oxide, zirconium oxide, lead zirconate titanate (PZT), strontium titanate ($SrTiO_3$), or ($Ba,Sr$)$TiO_3$ (BST), are preferably used, for example. With miniaturization and high integration of transistors, a problem such as leakage current might arise because of a thinner gate insulating film. When a high-k material is used for the insulator functioning as the gate insulating film, a gate potential at the time when the transistor operates can be reduced while the physical thickness is maintained.

It is preferable that the insulator 521 be thermally stable. For example, silicon oxide and silicon oxynitride, which have thermal stability, are preferable. In addition, a combination of an insulator of a high-k material and silicon oxide or silicon oxynitride allows the insulator 521 to have a stacked-layer structure with thermal stability and a high relative permittivity.

Note that the second gate insulating film is shown to have a stacked-layer structure of three layers in FIG. 16B and FIG. 16C, but may be two or less layers or have a stacked-layer structure of four or more layers. In such cases, without limitation to a stacked-layer structure formed of the same material, a stacked-layer structure formed of different materials may be employed.

The oxide 530 including a region functioning as the channel formation region includes the oxide 530a, the oxide 530b over the oxide 530a, and the oxide 530c over the oxide 530b. Including the oxide 530a under the oxide 530b makes it possible to inhibit diffusion of impurities into the oxide 530b from the components formed below the oxide 530a. Moreover, including the oxide 530c over the oxide 530b makes it possible to inhibit diffusion of impurities into the oxide 530b from the components formed above the oxide 530c. As the oxide 530, the above-described oxide semiconductor, which is one type of metal oxide, can be used.

Note that the oxide 530c is preferably provided in the opening portion provided in the insulator 580 with the insulator 545 therebetween. When the insulator 545 has a barrier property, diffusion of impurities from the insulator 580 into the oxide 530 can be inhibited.

One of the conductors 542 functions as a source electrode and the other functions as a drain electrode.

For the conductor 542a and the conductor 542b, a metal such as aluminum, titanium, chromium, nickel, copper, yttrium, zirconium, molybdenum, silver, tantalum, or tungsten or an alloy containing any of the metals as its main component can be used. In particular, a metal nitride film of tantalum nitride or the like is preferable because it has a barrier property against hydrogen or oxygen and high oxidation resistance.

Although a single-layer structure is illustrated in FIG. 16B, a stacked-layer structure of two or more layers may also be employed. For example, it is preferable to stack a tantalum nitride film and a tungsten film. Alternatively, a titanium film and an aluminum film may be stacked. Alternatively, a two-layer structure where an aluminum film is stacked over a tungsten film, a two-layer structure where a copper film is stacked over a copper-magnesium-aluminum alloy film, a two-layer structure where a copper film is stacked over a titanium film, or a two-layer structure where a copper film is stacked over a tungsten film may be employed.

Other examples include a three-layer structure where a titanium film or a titanium nitride film is formed, an aluminum film or a copper film is stacked over the titanium film or the titanium nitride film, and a titanium film or a titanium nitride film is formed thereover; and a three-layer structure where a molybdenum film or a molybdenum nitride film is formed, an aluminum film or a copper film is stacked over the molybdenum film or the molybdenum nitride film, and a molybdenum film or a molybdenum nitride film is formed thereover. Note that a transparent conductive material containing indium oxide, tin oxide, or zinc oxide may be used.

A barrier layer may be provided over the conductor 542. The barrier layer is preferably formed using a substance having a barrier property against oxygen or hydrogen. This structure can inhibit oxidation of the conductor 542 at the time of depositing the insulator 545.

A metal oxide can be used for the barrier layer, for example. In particular, an insulating film of aluminum oxide, hafnium oxide, gallium oxide, or the like, which has a barrier property against oxygen and hydrogen, is preferably used. Alternatively, silicon nitride formed by a CVD method may be used.

With the barrier layer, the range of choices for the material of the conductor 542 can be expanded. For example, a material having a low oxidation resistance and high conductivity, such as tungsten or aluminum, can be used for the conductor 542. Moreover, for example, a conductor that can be easily deposited or processed can be used.

The insulator 550 functions as a first gate insulating film. The insulator 550 is preferably provided in the opening portion provided in the insulator 580 with the oxide 530c and the insulator 545 therebetween.

With miniaturization and high integration of transistors, a problem such as leakage current might arise because of a thinner gate insulating film. In that case, the insulator 550 may have a stacked-layer structure like the second gate insulating film. When the insulator functioning as the gate insulating film has a stacked-layer structure of a high-k material and a thermally stable material, a gate potential at the time when the transistor operates can be reduced while the physical thickness is maintained. Furthermore, the stacked-layer structure can be thermally stable and have a high relative permittivity.

The conductor 560 functioning as the first gate electrode includes the conductor 560a and the conductor 560b over the conductor 560a. Like the conductor 505a, the conductor 560a is preferably formed using a conductive material having a function of inhibiting diffusion of impurities such as a hydrogen atom, a hydrogen molecule, a water molecule, and a copper atom. Alternatively, it is preferable to use a conductive material having a function of inhibiting diffusion of oxygen (e.g., at least one of an oxygen atom, an oxygen molecule, and the like).

When the conductor 560a has a function of inhibiting oxygen diffusion, the range of choices for the material of the conductor 560b can be expanded. That is, the conductor 560a inhibits oxidation of the conductor 560b, thereby preventing a decrease in conductivity.

As a conductive material having a function of inhibiting oxygen diffusion, tantalum, tantalum nitride, ruthenium, or ruthenium oxide is preferably used, for example. For the conductor 560a, the oxide semiconductor that can be used for the oxide 530 can be used. In that case, when the conductor 560b is deposited by a sputtering method, the conductor 560a can have a reduced electric resistance value to be a conductor. This can be referred to as an OC (Oxide Conductor) electrode.

The conductor 560b is preferably formed using a conductive material containing tungsten, copper, or aluminum as its main component. In addition, since the conductor 560 functions as a wiring, a conductor having high conductivity is preferably used for the conductor 560b. For example, a conductive material containing tungsten, copper, or aluminum as its main component can be used. The conductor 560b may have a stacked-layer structure, for example, a stack of any of the above conductive materials and titanium or titanium nitride.

The insulator 545 is positioned between the insulator 580 and the transistor 510A. For the insulator 545, an insulating material having a function of inhibiting diffusion of oxygen and impurities such as water or hydrogen is preferably used. For example, aluminum oxide or hafnium oxide is preferably used. Moreover, it is possible to use, for example, a metal oxide such as magnesium oxide, gallium oxide, germanium oxide, yttrium oxide, zirconium oxide, lanthanum oxide, neodymium oxide, or tantalum oxide; silicon nitride oxide; silicon nitride; or the like.

The insulator 545 can inhibit diffusion of impurities such as water and hydrogen contained in the insulator 580 into the oxide 530b through the oxide 530c and the insulator 550. Furthermore, oxidation of the conductor 560 due to excess oxygen contained in the insulator 580 can be inhibited.

The insulator 580, the insulator 582, and the insulator 584 each function as an interlayer film.

Like the insulator 514, the insulator 582 preferably functions as a barrier insulating film that inhibits entry of impurities such as water or hydrogen into the transistor 510A from the outside.

Like the insulator 516, the insulator 580 and the insulator 584 preferably have a lower permittivity than the insulator 582. When a material with a low permittivity is used for the interlayer film, the parasitic capacitance generated between wirings can be reduced.

The transistor 510A may be electrically connected to another component through a plug or a wiring such as the conductor 546 embedded in the insulator 580, the insulator 582, and the insulator 584.

As a material of the conductor 546, a single layer or stacked layers of a conductive material such as a metal material, an alloy material, a metal nitride material, or a metal oxide material can be used, as in the case of the conductor 505. For example, it is preferable to use a high-melting-point material that has both heat resistance and conductivity, such as tungsten or molybdenum. Alternatively, it is preferable to use a low-resistance conductive material such as aluminum or copper. The use of a low-resistance conductive material can reduce wiring resistance.

For example, when the conductor 546 has a stacked-layer structure of tantalum nitride or the like, which is a conductor having a barrier property against hydrogen and oxygen, and tungsten, which has high conductivity, diffusion of impurities from the outside can be inhibited while the conductivity of the wiring is maintained.

With the above structure, an OS transistor having a high on-state current can be provided. Alternatively, an OS transistor having a low off-state current can be provided. Alternatively, in a memory device including an OS transistor, variations in electrical characteristics can be inhibited and the reliability can be improved.

<Structure Example 2 of Transistor>

Figure 17A:
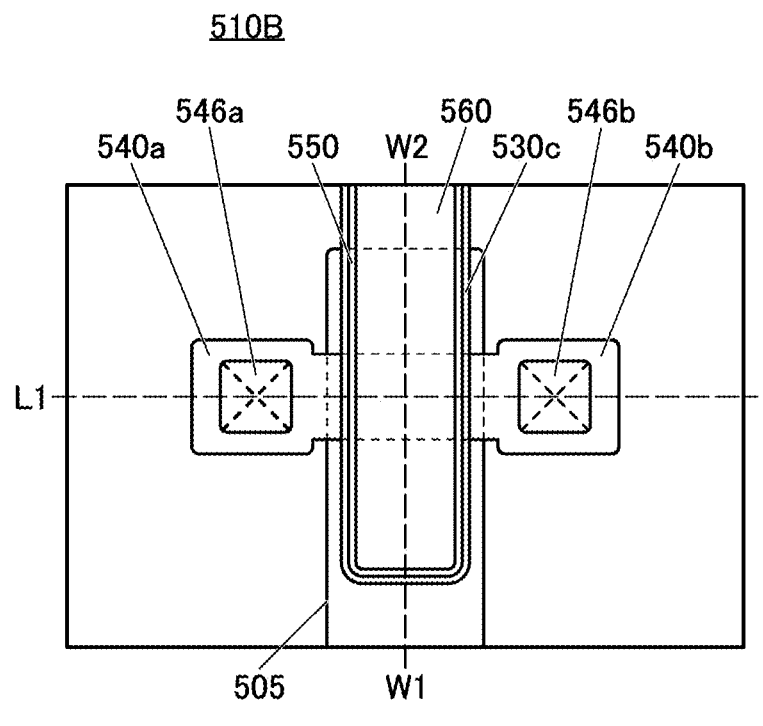
FIG. 17A is a top view illustrating a structure example of a transistor.
Figure 17C:
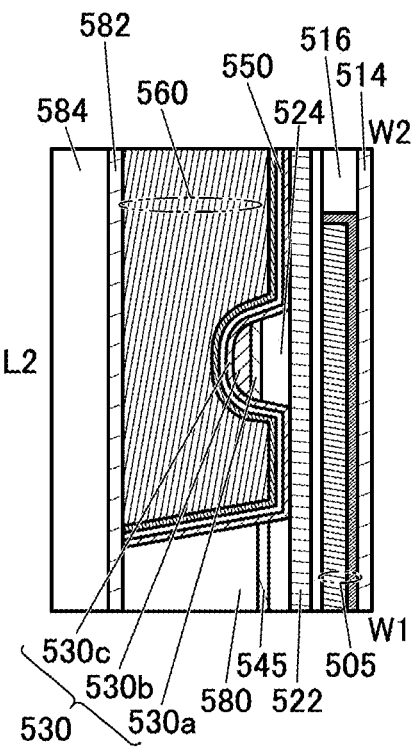
FIG. 17B and FIG. 17C are cross-sectional views illustrating the structure example of the transistor.
Figure 17B:
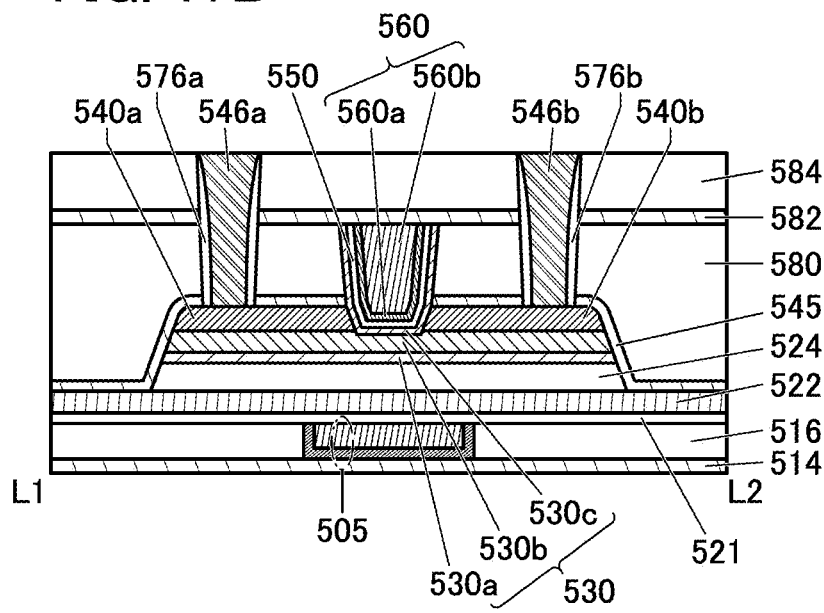

A structure example of a transistor 510B is described with reference to FIG. 17A, FIG. 17B, and FIG. 17C. FIG. 17A is a top view of the transistor 510B. FIG. 17B is a cross-sectional view of a portion indicated by dashed-dotted line L1-L2 in FIG. 17A. FIG. 17C is a cross-sectional view of a portion indicated by dashed-dotted line W1-W2 in FIG. 17A. Note that for clarity of the drawing, some components are not illustrated in the top view of FIG. 17A.

The transistor 510B is a modification example of the transistor 510A. Therefore, differences from the above transistor will be mainly described to avoid repeated description.

In the transistor 510A, a part of the insulator 545 is provided in the opening portion provided in the insulator 580 and covers the side surface of the conductor 560. Meanwhile, in the transistor 510B, an opening is formed by partly removing the insulator 580 and the insulator 545.

An insulator 576 (an insulator 576a and an insulator 576b) having a barrier property may be provided between the conductor 546 and the insulator 580. Providing the insulator 576 can inhibit oxygen in the insulator 580 from reacting with the conductor 546 and oxidizing the conductor 546.

Note that when an oxide semiconductor is used for the oxide 530, the oxide 530 preferably has a stacked-layer structure of a plurality of oxide layers that differ in the atomic ratio of metal atoms. Specifically, the atomic proportion of the element M in the constituent elements in the metal oxide used for the oxide 530a is preferably higher than the atomic proportion of the element M in the constituent elements in the metal oxide used for the oxide 530b. In addition, the atomic ratio of the element M to In in the metal oxide used for the oxide 530a is preferably higher than the atomic ratio of the element M to In in the metal oxide used for the oxide 530b. Furthermore, the atomic ratio of In to the element M in the metal oxide used for the oxide 530b is preferably higher than the atomic ratio of In to the element M in the metal oxide used for the oxide 530a. A metal oxide that can be used for the oxide 530a or the oxide 530b can be used for the oxide 530c.

The oxide 530a, the oxide 530b, and the oxide 530c preferably have crystallinity, and in particular, it is preferable to use a CAAC-OS. An oxide having crystallinity, such as a CAAC-OS, has a dense structure with small amounts of impurities and defects (e.g., oxygen vacancies) and high crystallinity. This can inhibit extraction of oxygen from the oxide 530b by the source electrode or the drain electrode. This can reduce extraction of oxygen from the oxide 530b even when heat treatment is performed; hence, the transistor 510B is stable against high temperatures (or thermal budget) in the manufacturing process.

Note that one or both of the oxide 530a and the oxide 530c may be omitted. The oxide 530 may be a single layer of the oxide 530b. In the case where the oxide 530 is a stack of the oxide 530a, the oxide 530b, and the oxide 530c, the energy of the conduction band minimum of each of the oxide 530a and the oxide 530c is preferably higher than the energy of the conduction band minimum of the oxide 530b. In other words, the electron affinity of each of the oxide 530a and the oxide 530c is preferably smaller than the electron affinity of the oxide 530b. In that case, for the oxide 530c, a metal oxide that can be used for the oxide 530a is preferably used. Specifically, the atomic proportion of the element M in the constituent elements in the metal oxide used for the oxide 530c is preferably higher than the atomic proportion of the element M in the constituent elements in the metal oxide used for the oxide 530b. Moreover, the atomic ratio of the element M to In in the metal oxide used for the oxide 530c is preferably higher than the atomic ratio of the element M to In in the metal oxide used for the oxide 530b. Furthermore, the atomic ratio of In to the element M in the metal oxide used for the oxide 530b is preferably higher than the atomic ratio of In to the element M in the metal oxide used for the oxide 530c.

The energy level of the conduction band minimum gradually changes at junction portions of the oxide 530a, the oxide 530b, and the oxide 530c. In other words, the energy level of the conduction band minimum at the junction portions of the oxide 530a, the oxide 530b, and the oxide 530c continuously changes or is continuously connected. To obtain this, the density of defect states in a mixed layer formed at the interface between the oxide 530a and the oxide 530b and the interface between the oxide 530b and the oxide 530c is preferably made low.

Specifically, when the oxide 530a and the oxide 530b or the oxide 530b and the oxide 530c contain a common element (as a main component) in addition to oxygen, a mixed layer with a low density of defect states can be formed. For example, in the case where the oxide 530b is an In—Ga—Zn oxide, an In—Ga—Zn oxide, a Ga—Zn oxide, gallium oxide, or the like may be used for the oxide 530a and the oxide 530c. In addition, the oxide 530c may have a stacked-layer structure. For example, it is possible to employ a stacked-layer structure of an In—Ga—Zn oxide and a Ga—Zn oxide over the In—Ga—Zn oxide, or a stacked-layer structure of an In—Ga—Zn oxide and gallium oxide over the In—Ga—Zn oxide. In other words, the oxide 530c may employ a stacked-layer structure of an In—Ga—Zn oxide and an oxide that does not contain In.

Specifically, for the oxide 530a, a metal oxide with In:Ga:Zn=1:3:4 [atomic ratio] or 1:1:0.5 [atomic ratio] is used. For the oxide 530b, a metal oxide with In:Ga:Zn=4:2:3 [atomic ratio] or 3:1:2 [atomic ratio] is used. For the oxide 530c, a metal oxide with In:Ga:Zn=1:3:4 [atomic ratio], In:Ga:Zn=4:2:3 [atomic ratio], Ga:Zn=2:1 [atomic ratio], or Ga:Zn=2:5 [atomic ratio] is used. Furthermore, specific examples of the case where the oxide 530c has a stacked-layer structure include a stacked-layer structure of In:Ga:Zn=4:2:3 [atomic ratio] and Ga:Zn=2:1 [atomic ratio], a stacked-layer structure of In:Ga:Zn=4:2:3 [atomic ratio] and Ga:Zn=2:5 [atomic ratio], and a stacked-layer structure of In:Ga:Zn=4:2:3 [atomic ratio] and gallium oxide.

At this time, the oxide 530b serves as a main carrier path. When the oxide 530a and the oxide 530c have the above structure, the density of defect states at the interface between the oxide 530a and the oxide 530b and the interface between the oxide 530b and the oxide 530c can be made low. Thus, the influence of interface scattering on carrier conduction is small, and the transistor 510B can have a high on-state current and high frequency characteristics. Note that in the case where the oxide 530c has a stacked-layer structure, in addition to the effect of reducing the density of defect states at the interface between the oxide 530b and the oxide 530c, the effect of inhibiting diffusion of the constituent element of the oxide 530c to the insulator 550 side is expected. More specifically, the oxide 530c has a stacked-layer structure and the oxide that does not contain In is positioned at the upper part of the stacked-layer structure, whereby the amount of In that would diffuse to the insulator 550 side can be reduced. Since the insulator 550 functions as a gate insulator, the transistor has defects in characteristics when In diffuses. Thus, when the oxide 530c has a stacked-layer structure, a highly reliable memory device can be provided.

A metal oxide functioning as an oxide semiconductor is preferably used for the oxide 530. For example, as the metal oxide to be the channel formation region in the oxide 530, a metal oxide having a band gap of 2 eV or larger, preferably 2.5 eV or larger is preferably used. With the use of a metal oxide having such a wide band gap, the off-state current of the transistor can be reduced. With such a transistor, a memory device with low power consumption can be provided.

<Structure Example 3 of Transistor>

A structure example of a transistor 510C is described with reference to FIG. 18A and FIG. 18B. The transistor 510C is a modification example of the transistor 500. Therefore, differences from the above transistor will be mainly described to avoid repeated description. Note that the structure shown in FIG. 18A and FIG. 18B can be employed for other transistors, such as the transistor 300, included in the memory device of one embodiment of the present invention.

Figure 18A:
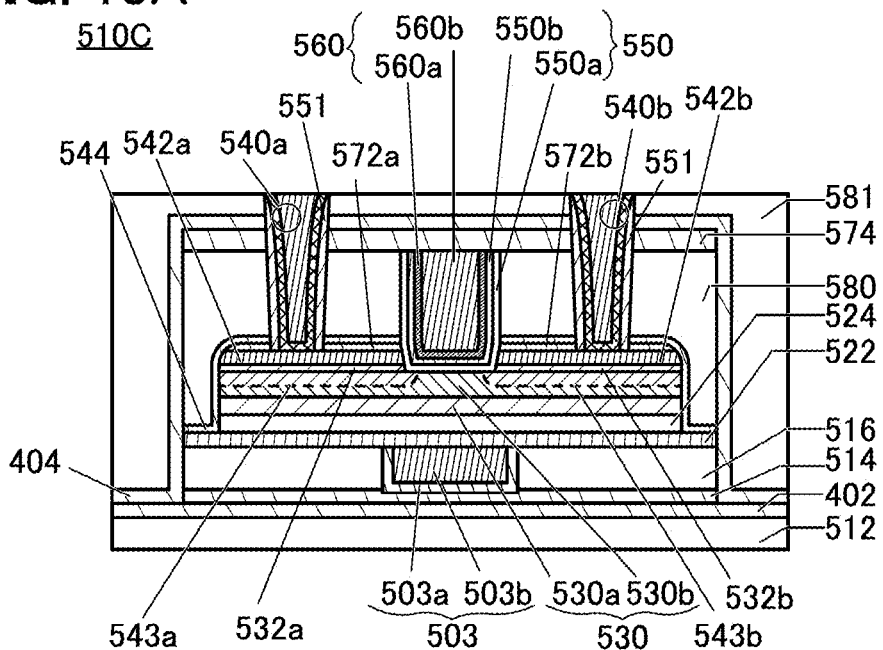
FIG. 18A and FIG. 18B are cross-sectional views illustrating a structure example of a transistor.
Figure 18B:
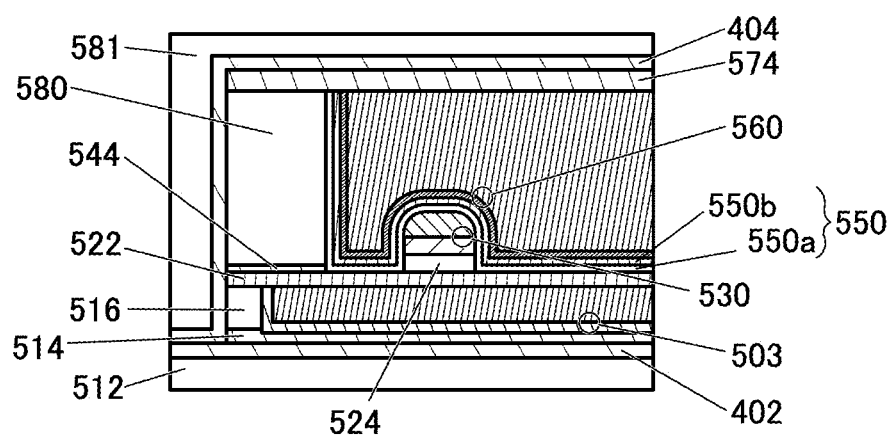

FIG. 18A is a cross-sectional view of the transistor 510C in the channel length direction, and FIG. 18B is a cross-sectional view of the transistor 510C in the channel width direction. The transistor 510C illustrated in FIG. 18A and FIG. 18B is different from the transistor 500 illustrated in FIG. 15A and FIG. 15B in that an insulator 402 and an insulator 404 are provided and that the insulator 550 includes an insulator 550a and an insulator 550b. In addition, differences from the transistor 500 illustrated in FIG. 15A and FIG. 15B are that an insulator 551 is provided in contact with the side surface of the conductor 540a, the insulator 551 is provided in contact with the side surface of the conductor 540b, a conductor 572a is provided in contact with the top surface of the conductor 542a, a conductor 532a is provided in contact with the top surface of the region 543a, a conductor 572b is provided in contact with the top surface of the conductor 542b, and a conductor 532b is provided in contact with the top surface of the region 543b. Another difference from the transistor 500 illustrated in FIG. 15A and FIG. 15B is that the insulator 520 and the oxide 530c are not provided.

In the transistor 510C shown in FIG. 18A and FIG. 18B, the insulator 402 is provided over the insulator 512. In addition, the insulator 404 is provided over the insulator 574 and the insulator 402.

The transistor 510C shown in FIG. 18A and FIG. 18B has a structure in which the insulator 514, the insulator 516, the insulator 522, the insulator 544, the insulator 580, and the insulator 574 are patterned and covered with the insulator 404. That is, the insulator 404 is in contact with the top surface of the insulator 574, the side surface of the insulator 574, the side surface of the insulator 580, the side surface of the insulator 544, the side surface of the insulator 522, the side surface of the insulator 516, the side surface of the insulator 514, and the top surface of the insulator 402. Thus, the oxide 530 and the like are isolated from the outside by the insulator 404 and the insulator 402.

It is preferable that the insulator 402 and the insulator 404 have high capability of inhibiting diffusion of hydrogen (e.g., at least one of a hydrogen atom, a hydrogen molecule, and the like) or a water molecule. For example, the insulator 402 and the insulator 404 are preferably formed using silicon nitride or silicon nitride oxide with a high hydrogen barrier property. This can inhibit diffusion of hydrogen or the like into the oxide 530, thereby inhibiting the degradation of the characteristics of the transistor 510C. Consequently, the reliability of the memory device including an OS transistor can be increased.

Silicon oxide, silicon oxynitride, or the like can be used for the insulator 550a, and hafnium oxide or the like can be used for the insulator 550b, for example. Thus, oxidation of the conductor 560 can be inhibited. For the conductor 572a and the conductor 572b, aluminum oxide, hafnium oxide, an oxide containing aluminum and hafnium (hafnium aluminate), or the like can be used. For the conductor 532a and the conductor 532b, a metal oxide used for the oxide 530a can be used, for example. Thus, oxidation of the conductor 542a and the conductor 542b can be inhibited.

The insulator 551 is provided in contact with the insulator 581, the insulator 404, the insulator 574, the insulator 580, and the insulator 544. The insulator 551 preferably has a function of inhibiting diffusion of hydrogen or water molecules. For example, for the insulator 551, an insulator such as silicon nitride, aluminum oxide, or silicon nitride oxide that has a high hydrogen barrier property is preferably used. In particular, silicon nitride is suitably used for the insulator 551 because of its high hydrogen barrier property. The use of a material having a high hydrogen barrier property for the insulator 551 can inhibit diffusion of impurities such as water or hydrogen from the insulator 580 and the like into the oxide 530 through the conductor 540a and the conductor 540b. Furthermore, oxygen contained in the insulator 580 can be inhibited from being absorbed by the conductor 540a and the conductor 540b. Consequently, the reliability of the memory device including an OS transistor can be increased.

<Structure Example 4 of Transistor>

A structure example of a transistor 510D is described with reference to FIG. 19A and FIG. 19B. The transistor 510D is a modification example of the transistor 500. Therefore, differences from the above transistor will be mainly described to avoid repeated description. Note that the structure shown in FIG. 19A and FIG. 19B can be employed for other transistors, such as the transistor 300, included in the memory device of one embodiment of the present invention.

Figure 19A:
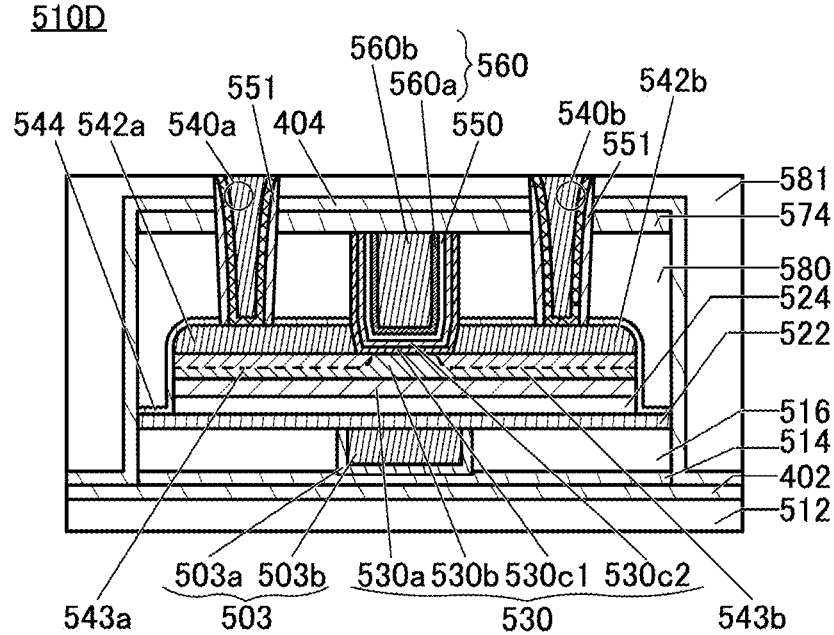
FIG. 19A and FIG. 19B are cross-sectional views illustrating a structure example of a transistor.
Figure 19B:
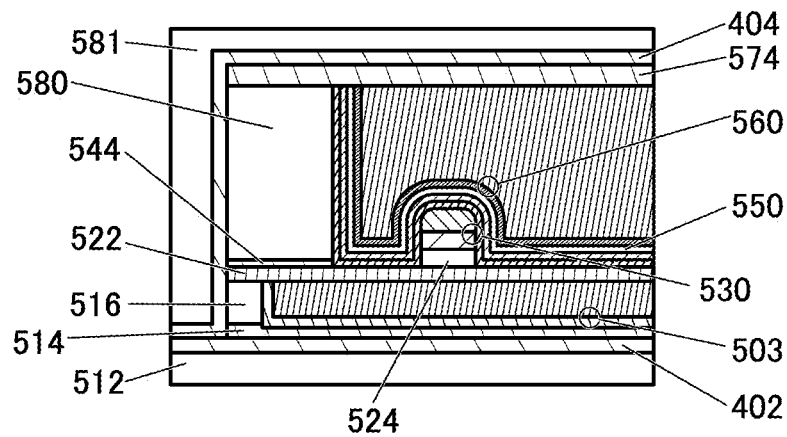

FIG. 19A and FIG. 19B show a modification example of the transistor shown in FIG. 15A and FIG. 15B. FIG. 19A is a cross-sectional view of the transistor in the channel length direction and FIG. 19B is a cross-sectional view of the transistor in the channel width direction. The transistor shown in FIG. 19A and FIG. 19B is different from the transistor 500 shown in FIG. 15A and FIG. 15B in that the insulator 402 and the insulator 404 are provided. Another difference from the transistor 500 shown in FIG. 15A and FIG. 15B is that the insulator 551 is provided in contact with the side surface of the conductor 540a and the insulator 551 is provided in contact with the side surface of the conductor 540b. Another difference from the transistor 500 shown in FIG. 15A and FIG. 15B is that the insulator 520 is not provided. Another difference from the transistor shown in FIG. 15A and FIG. 15B is that the oxide 530c has a two-layer structure of an oxide 530c1 and an oxide 530c2.

In the transistor 510D shown in FIG. 19A and FIG. 19B, the insulator 402 is provided over the insulator 512. In addition, the insulator 404 is provided over the insulator 574 and the insulator 402.

The transistor 510D shown in FIG. 19A and FIG. 19B has a structure in which the insulator 514, the insulator 516, the insulator 522, the insulator 524, the insulator 544, the insulator 580, and the insulator 574 are patterned and covered with the insulator 404. That is, the insulator 404 is in contact with the top surface of the insulator 574, the side surface of the insulator 574, the side surface of the insulator 580, the side surface of the insulator 544, the side surface of the insulator 522, the side surface of the insulator 516, the side surface of the insulator 514, and the top surface of the insulator 402. Thus, the oxide 530 and the like are isolated from the outside by the insulator 404 and the insulator 402.

It is preferable that the insulator 402 and the insulator 404 have high capability of inhibiting diffusion of hydrogen (e.g., at least one of a hydrogen atom, a hydrogen molecule, and the like) or a water molecule. For example, the insulator 402 and the insulator 404 are preferably formed using silicon nitride or silicon nitride oxide with a high hydrogen barrier property. This can inhibit diffusion of hydrogen or the like into the oxide 530, thereby inhibiting the degradation of the characteristics of the transistor 510D. Consequently, the reliability of the memory device including an OS transistor can be increased.

The insulator 551 is provided in contact with the insulator 581, the insulator 404, the insulator 574, the insulator 580, and the insulator 544. The insulator 551 preferably has a function of inhibiting diffusion of hydrogen or water molecules. For example, for the insulator 551, an insulator such as silicon nitride, aluminum oxide, or silicon nitride oxide that has a high hydrogen barrier property is preferably used. In particular, silicon nitride is suitably used for the insulator 551 because of its high hydrogen barrier property. The use of a material having a high hydrogen barrier property for the insulator 551 can inhibit diffusion of impurities such as water or hydrogen from the insulator 580 and the like into the oxide 530 through the conductor 540a and the conductor 540b. Furthermore, oxygen contained in the insulator 580 can be inhibited from being absorbed by the conductor 540a and the conductor 540b. Consequently, the reliability of the memory device including an OS transistor can be increased.

The oxide 530c1 is in contact with the top surface of the insulator 522, the side surface of the insulator 524, the side surface of the oxide 530a, the top surface and the side surface of the oxide 530b, the side surfaces of the conductor 542a and the conductor 542b, the side surface of the insulator 544, and the side surface of the insulator 580. The oxide 530c2 is in contact with the insulator 550.

An In—Zn oxide can be used for the oxide 530c1, for example. For the oxide 530c2, it is possible to use a material similar to the material that can be used for the oxide 530c when the oxide 530c has a single-layer structure. For example, for the oxide 530c2, a metal oxide with In:Ga:Zn=1:3:4 [atomic ratio], Ga:Zn=2:1 [atomic ratio], or Ga:Zn=2:5 [atomic ratio] can be used.

When the oxide 530c has a two-layer structure of the oxide 530c1 and the oxide 530c2, the on-state current of the transistor can be increased as compared with the case where the oxide 530c has a single-layer structure. Thus, a transistor can be a power MOS transistor, for example. Note that the oxide 530c included in the transistor shown in FIG. 15A and FIG. 15B can also have a two-layer structure of the oxide 530c1 and the oxide 530c2.

The transistor shown in FIG. 19A and FIG. 19B can be employed for the transistor 500, the transistor 300, or both thereof.

Note that the composition, structure, method, and the like described in this embodiment can be used in appropriate combination with the compositions, structures, methods, and the like described in the other embodiments and the like.

Embodiment 5

In this embodiment, an oxide semiconductor that is a kind of metal oxide will be described.

The metal oxide preferably contains at least indium or zinc. In particular, indium and zinc are preferably contained. In addition, one or more kinds selected from aluminum, gallium, yttrium, tin, and the like is preferably contained. Furthermore, one or more kinds selected from boron, silicon, titanium, iron, nickel, germanium, zirconium, molybdenum, lanthanum, cerium, neodymium, hafnium, tantalum, tungsten, magnesium, cobalt, and the like may be contained.

<Classification of Crystal Structure>

First, the classification of the crystal structures of an oxide semiconductor is described with reference to FIG. 20A. FIG. 20A is a diagram showing classification of crystal structures of an oxide semiconductor, typically IGZO (a metal oxide containing In, Ga, and Zn).

As shown in FIG. 20A, an oxide semiconductor is roughly classified into "Amorphous", "Crystalline", and "Crystal".

The term "Amorphous" includes completely amorphous. The term "Crystalline" includes CAAC, nc, and CAC (cloud-aligned composite). Note that the term "Crystalline" excludes single crystal, poly crystal, and completely amorphous. The term "Crystal" includes single crystal and poly crystal.

Note that the structures in the thick frame in FIG. 20A are in an intermediate state between "Amorphous" and "Crystal", and belong to a new crystalline phase. That is, these structures are completely different from "Amorphous", which is energetically unstable, and "Crystal".

A crystal structure of a film or a substrate can be analyzed with an X-ray diffraction (XRD) spectrum. Here, FIG. 20B shows an XRD spectrum, which is obtained by GIXD (Grazing-Incidence XRD) measurement, of a CAAC-IGZO film classified into "Crystalline". Note that a GIXD method is also referred to as a thin film method or a Seemann-Bohlin method. The XRD spectrum that is shown in FIG. 20B and obtained by GIXD measurement is hereinafter simply referred to as an XRD spectrum. The CAAC-IGZO film in FIG. 20B has a composition in the vicinity of In:Ga:Zn=4:2:3 [atomic ratio]. The CAAC-IGZO film in FIG. 20B has a thickness of 500 nm.

In FIG. 20B, the horizontal axis represents 2θ [deg.], and the vertical axis represents intensity [a.u.]. As shown in FIG. 20B, a clear peak indicating crystallinity is detected in the XRD spectrum of the CAAC-IGZO film. Specifically, a peak indicating c-axis alignment is detected at 2θ of around 31° in the XRD spectrum of the CAAC-IGZO film. As shown in FIG. 20B, the peak at 2θ of around 31° is asymmetric with respect to the axis of the angle at which the peak intensity is detected.

A crystal structure of a film or a substrate can also be evaluated with a diffraction pattern obtained by a nanobeam electron diffraction (NBED) method (such a pattern is also referred to as a nanobeam electron diffraction pattern). FIG. 20C shows a diffraction pattern of the CAAC-IGZO film. FIG. 20C shows a diffraction pattern obtained with the NBED method in which an electron beam is incident in the direction parallel to the substrate. The CAAC-IGZO film in FIG. 20C has a composition in the vicinity of In:Ga:Zn=4:2:3 [atomic ratio]. In the nanobeam electron diffraction method, electron diffraction is performed with a probe diameter of 1 nm.

As shown in FIG. 20C, a plurality of spots indicating c-axis alignment are observed in the diffraction pattern of the CAAC-IGZO film.

<<Structure of Oxide Semiconductor>>

Oxide semiconductors might be classified in a manner different from that in FIG. 20A when classified in terms of the crystal structure. Oxide semiconductors are classified into a single crystal oxide semiconductor and a non-single-crystal oxide semiconductor, for example. Examples of the non-single-crystal oxide semiconductor include the above-described CAAC-OS and nc-OS. Other examples of the non-single-crystal oxide semiconductor include a polycrystalline oxide semiconductor, an amorphous-like oxide semiconductor (a-like OS), and an amorphous oxide semiconductor.

Here, the above-described CAAC-OS, nc-OS, and a-like OS are described in detail.

[CAAC-OS]

The CAAC-OS is an oxide semiconductor that has a plurality of crystal regions each of which has c-axis alignment in a particular direction. Note that the particular direction refers to the thickness direction of a CAAC-OS film, the normal direction of the surface where the CAAC-OS film is formed, or the normal direction of the surface of the CAAC-OS film. The crystal region refers to a region having a periodic atomic arrangement. When an atomic arrangement is regarded as a lattice arrangement, the crystal region also refers to a region with a uniform lattice arrangement. The CAAC-OS has a region where a plurality of crystal regions are connected in the a-b plane direction, and the region has distortion in some cases. Note that the distortion refers to a portion where the direction of a lattice arrangement changes between a region with a uniform lattice arrangement and another region with a uniform lattice arrangement in a region where a plurality of crystal regions are connected. That is, the CAAC-OS is an oxide semiconductor having c-axis alignment and having no clear alignment in the a-b plane direction.

Note that each of the plurality of crystal regions is formed of one or more fine crystals (crystals each of which has a maximum diameter of less than 10 nm). In the case where the crystal region is formed of one fine crystal, the maximum diameter of the crystal region is less than 10 nm. In the case where the crystal region is formed of a large number of fine crystals, the size of the crystal region may be approximately several tens of nanometers.

In the case of an In-M-Zn oxide (the element M is one or more kinds selected from aluminum, gallium, yttrium, tin, titanium, and the like), the CAAC-OS tends to have a layered crystal structure (also referred to as a layered structure) in which a layer containing indium (In) and oxygen (hereinafter, an In layer) and a layer containing the element M, zinc (Zn), and oxygen (hereinafter, an (M, Zn) layer) are stacked. Indium and the element M can be replaced with each other. Therefore, indium may be contained in the (M, Zn) layer. In addition, the element M may be contained in the In layer. Note that Zn may be contained in the In layer. Such a layered structure is observed as a lattice image in a high-resolution TEM image, for example.

When the CAAC-OS film is subjected to structural analysis by Out-of-plane XRD measurement with an XRD apparatus using θ/2θ scanning, for example, a peak indicating c-axis alignment is detected at 2θ of 31° or around 31°. Note that the position of the peak indicating c-axis alignment (the value of 2θ) may change depending on the kind, composition, or the like of the metal element contained in the CAAC-OS.

For example, a plurality of bright spots are observed in the electron diffraction pattern of the CAAC-OS film. Note that one spot and another spot are observed point-symmetrically with a spot of the incident electron beam passing through a sample (also referred to as a direct spot) as the symmetric center.

When the crystal region is observed from the particular direction, a lattice arrangement in the crystal region is basically a hexagonal lattice arrangement; however, a unit lattice is not always a regular hexagon and is a non-regular hexagon in some cases. A pentagonal lattice arrangement, a heptagonal lattice arrangement, and the like are included in the distortion in some cases. Note that a clear crystal grain boundary (grain boundary) cannot be observed even in the vicinity of the distortion in the CAAC-OS. That is, formation of a crystal grain boundary is inhibited by the distortion of lattice arrangement. This is probably because the CAAC-OS can tolerate distortion owing to a low density of arrangement of oxygen atoms in the a-b plane direction, an interatomic bond distance changed by substitution of a metal atom, and the like.

A crystal structure in which a clear crystal grain boundary is observed is what is called polycrystal. It is highly probable that the crystal grain boundary becomes a recombination center and captures carriers and thus decreases the on-state current and field-effect mobility of a transistor, for example. Thus, the CAAC-OS in which no clear crystal grain boundary is observed is one of crystalline oxides having a crystal structure suitable for a semiconductor layer of a transistor. Note that Zn is preferably contained to form the CAAC-OS. For example, an In—Zn oxide and an In—Ga—Zn oxide are suitable because they can inhibit generation of a crystal grain boundary as compared with an In oxide.

The CAAC-OS is an oxide semiconductor with high crystallinity in which no clear crystal grain boundary is observed. Thus, in the CAAC-OS, a reduction in electron mobility due to the crystal grain boundary is less likely to occur. Moreover, since the crystallinity of an oxide semiconductor might be decreased by entry of impurities, formation of defects, or the like, the CAAC-OS can be regarded as an oxide semiconductor that has small amounts of impurities and defects (e.g., oxygen vacancies). Thus, an oxide semiconductor including the CAAC-OS is physically stable. Therefore, the oxide semiconductor including the CAAC-OS is resistant to heat and has high reliability. In addition, the CAAC-OS is stable with respect to high temperature in the manufacturing process (or thermal budget). Accordingly, the use of the CAAC-OS for the OS transistor can extend the degree of freedom of the manufacturing process.

[nc-OS]

In the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. In other words, the nc-OS includes a fine crystal. Note that the size of the fine crystal is, for example, greater than or equal to 1 nm and less than or equal to 10 nm, particularly greater than or equal to 1 nm and less than or equal to 3 nm; thus, the fine crystal is also referred to as a nanocrystal. Furthermore, there is no regularity of crystal orientation between different nanocrystals in the nc-OS. Thus, the orientation in the whole film is not observed. Accordingly, the nc-OS cannot be distinguished from an a-like OS or an amorphous oxide semiconductor by some analysis methods. For example, when an nc-OS film is subjected to structural analysis by Out-of-plane XRD measurement with an XRD apparatus using θ/2θ scanning, a peak indicating crystallinity is not detected. Furthermore, a diffraction pattern like a halo pattern is observed when the nc-OS film is subjected to electron diffraction (also referred to as selected-area electron diffraction) using an electron beam with a probe diameter larger than the diameter of a nanocrystal (e.g., larger than or equal to 50 nm). Meanwhile, in some cases, a plurality of spots in a ring-like region with a direct spot as the center are observed in the obtained electron diffraction pattern when the nc-OS film is subjected to electron diffraction (also referred to as nanobeam electron diffraction) using an electron beam with a probe diameter nearly equal to or smaller than the diameter of a nanocrystal (e.g., 1 nm or larger and 30 nm or smaller).

[a-Like OS]

The a-like OS is an oxide semiconductor having a structure between those of the nc-OS and the amorphous oxide semiconductor. The a-like OS includes a void or a low-density region. That is, the a-like OS has low crystallinity as compared with the nc-OS and the CAAC-OS. Moreover, the a-like OS has higher hydrogen concentration in the film than the nc-OS and the CAAC-OS.

<<Structure of Oxide Semiconductor>>

Next, the above-described CAC-OS is described in detail. Note that the CAC-OS relates to the material composition.

[CAC-OS]

The CAC-OS refers to one composition of a material in which elements constituting a metal oxide are unevenly distributed with a size greater than or equal to 0.5 nm and less than or equal to 10 nm, preferably greater than or equal to 1 nm and less than or equal to 3 nm, or a similar size, for example. Note that a state in which one or more metal elements are unevenly distributed and regions including the metal element(s) are mixed with a size greater than or equal to 0.5 nm and less than or equal to 10 nm, preferably greater than or equal to 1 nm and less than or equal to 3 nm, or a similar size in a metal oxide is hereinafter referred to as a mosaic pattern or a patch-like pattern.

In addition, the CAC-OS has a composition in which materials are separated into a first region and a second region to form a mosaic pattern, and the first regions are distributed in the film (this composition is hereinafter also referred to as a cloud-like composition). That is, the CAC-OS is a composite metal oxide having a composition in which the first regions and the second regions are mixed.

Note that the atomic ratios of In, Ga, and Zn to the metal elements contained in the CAC-OS in an In—Ga—Zn oxide are denoted with [In], [Ga], and [Zn], respectively. For example, the first region in the CAC-OS in the In—Ga—Zn oxide has [In] higher than [In] in the composition of the CAC-OS film. Moreover, the second region has [Ga] higher than [Ga] in the composition of the CAC-OS film. For example, the first region has higher [In] and lower [Ga] than the second region. Moreover, the second region has higher [Ga] and lower [In] than the first region.

Specifically, the first region includes indium oxide, indium zinc oxide, or the like as its main component. The second region includes gallium oxide, gallium zinc oxide, or the like as its main component. That is, the first region can be referred to as a region containing In as its main component. The second region can be referred to as a region containing Ga as its main component.

Note that a clear boundary between the first region and the second region cannot be observed in some cases.

For example, in EDX mapping obtained by energy dispersive X-ray spectroscopy (EDX), it is confirmed that the CAC-OS in the In—Ga—Zn oxide has a composition in which the region containing In as its main component (the first region) and the region containing Ga as its main component (the second region) are unevenly distributed and mixed.

In the case where the CAC-OS is used for a transistor, a switching function (On/Off switching function) can be given to the CAC-OS owing to the complementary action of the conductivity derived from the first region and the insulating property derived from the second region. A CAC-OS has a conducting function in part of the material and has an insulating function in another part of the material; as a whole, the CAC-OS has a function of a semiconductor. Separation of the conducting function and the insulating function can maximize each function. Accordingly, when the CAC-OS is used for a transistor, high on-state current ($I_{on}$), high field-effect mobility (μ), and excellent switching operation can be achieved.

An oxide semiconductor has various structures with different properties. Two or more kinds among the amorphous oxide semiconductor, the polycrystalline oxide semiconductor, the a-like OS, the CAC-OS, the nc-OS, and the CAAC-OS may be included in an oxide semiconductor of one embodiment of the present invention.

<Transistor Including Oxide Semiconductor>

Next, the case where the above oxide semiconductor is used for a transistor is described.

When the above oxide semiconductor is used for a transistor, a transistor with high field-effect mobility can be achieved. In addition, a transistor having high reliability can be achieved.

An oxide semiconductor with a low carrier density is preferably used for the transistor (for more specifics, refer to Embodiment 4). In order to reduce the carrier density of an oxide semiconductor film, the impurity concentration in the oxide semiconductor film is reduced so that the density of defect states can be reduced. In this specification and the like, a state with a low impurity concentration and a low density of defect states is referred to as a highly purified intrinsic or substantially highly purified intrinsic state. Note that an oxide semiconductor having a low carrier density may be referred to as a highly purified intrinsic or substantially highly purified intrinsic oxide semiconductor.

A highly purified intrinsic or substantially highly purified intrinsic oxide semiconductor film has a low density of defect states and thus has a low density of trap states in some cases.

Electric charge trapped by the trap states in the oxide semiconductor takes a long time to disappear and might behave like fixed electric charge. Thus, a transistor whose channel formation region is formed in an oxide semiconductor with a high density of trap states has unstable electrical characteristics in some cases.

Accordingly, in order to obtain stable electrical characteristics of a transistor, reducing the impurity concentration in an oxide semiconductor is effective. In order to reduce the impurity concentration in the oxide semiconductor, it is preferable that the impurity concentration in an adjacent film be also reduced. Examples of impurities include hydrogen, nitrogen, an alkali metal, an alkaline earth metal, iron, nickel, and silicon.

<Impurity>

Here, the influence of each impurity in the oxide semiconductor is described.

When silicon or carbon, which is one of Group 14 elements, is contained in the oxide semiconductor, defect states are formed in the oxide semiconductor. Thus, the concentration of silicon or carbon in the oxide semiconductor and the concentration of silicon or carbon in the vicinity of an interface with the oxide semiconductor (the concentration obtained by SIMS) are each set lower than or equal to $2\times10^{18}$ atoms/cm$^3$, preferably lower than or equal to $2\times10^{17}$ atoms/cm$^3$.

When the oxide semiconductor contains an alkali metal or an alkaline earth metal, defect states are formed and carriers are generated in some cases. Thus, a transistor using an oxide semiconductor that contains an alkali metal or an alkaline earth metal is likely to have normally-on characteristics. Thus, the concentration of an alkali metal or an alkaline earth metal in the oxide semiconductor, which is obtained by SIMS, is lower than or equal to $1\times10^{18}$ atoms/cm$^3$, preferably lower than or equal to $2\times10^{16}$ atoms/cm$^3$.

Furthermore, when the oxide semiconductor contains nitrogen, the oxide semiconductor easily becomes n-type by generation of electrons serving as carriers and an increase in carrier density. As a result, a transistor using, as a semiconductor, an oxide semiconductor containing nitrogen is likely to have normally-on characteristics. When nitrogen is contained in the oxide semiconductor, a trap state is sometimes formed. This might make the electrical characteristics of the transistor unstable. Therefore, the concentration of nitrogen in the oxide semiconductor, which is obtained by SIMS, is set lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, still further preferably lower than or equal to $5\times10^{17}$ atoms/cm$^3$.

Hydrogen contained in the oxide semiconductor reacts with oxygen bonded to a metal atom to be water, and thus forms an oxygen vacancy in some cases. Entry of hydrogen into the oxygen vacancy generates an electron serving as a carrier in some cases. Furthermore, bonding of part of hydrogen to oxygen bonded to a metal atom causes generation of an electron serving as a carrier in some cases. Thus, a transistor using an oxide semiconductor containing hydrogen is likely to have normally-on characteristics. Accordingly, hydrogen in the oxide semiconductor is preferably reduced as much as possible (for more specifics, refer to Embodiment 4).

When an oxide semiconductor with sufficiently reduced impurities is used for the channel formation region of the transistor, stable electrical characteristics can be given.

Note that the composition, structure, method, and the like described in this embodiment can be used in appropriate combination with the compositions, structures, methods, and the like described in the other embodiments and the like.

Embodiment 6

This embodiment will show examples of a semiconductor wafer where the memory device or the like described in the above embodiment is formed and electronic components incorporating the memory device.

<Semiconductor Wafer>

First, an example of a semiconductor wafer where a memory device or the like is formed is described with reference to FIG. 29A.

Figure 29A:
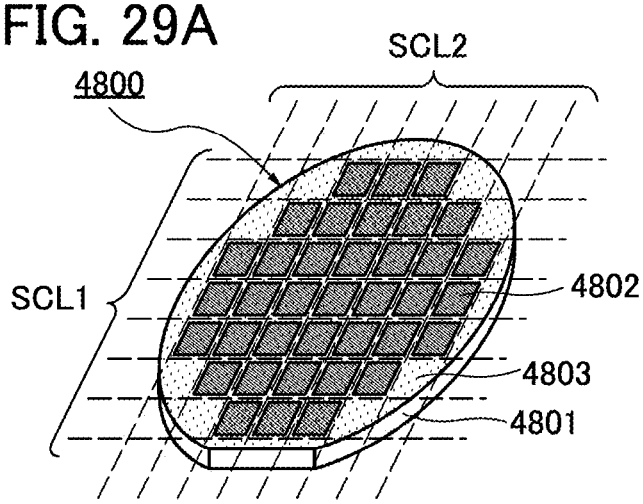
FIG. 29A is a perspective view illustrating an example of a semiconductor wafer.

A semiconductor wafer 4800 shown in FIG. 29A includes a wafer 4801 and a plurality of circuit portions 4802 provided on the top surface of the wafer 4801. A portion without the circuit portion 4802 on the top surface of the wafer 4801 is a spacing 4803 that is a region for dicing.

The semiconductor wafer 4800 can be fabricated by forming the plurality of circuit portions 4802 on the surface of the wafer 4801 by a wafer process. After that, a surface of the wafer 4801 opposite to the surface provided with the plurality of circuit portions 4802 may be ground to thin the wafer 4801. Through this step, warpage or the like of the wafer 4801 is reduced and the size of the component can be reduced.

A dicing step is performed as the next step. The dicing is performed along scribe lines SCL1 and scribe lines SCL2 (referred to as dicing lines or cutting lines in some cases) indicated by dashed-dotted lines. Note that to perform the dicing step easily, it is preferable that the spacing 4803 be provided so that the plurality of scribe lines SCL1 are parallel to each other, the plurality of scribe lines SCL2 are parallel to each other, and the scribe lines SCL1 are perpendicular to the scribe lines SCL2.

Figure 29B:
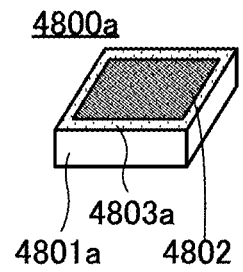
FIG. 29B is a perspective view illustrating an example of a chip.

With the dicing step, a chip 4800a as shown in FIG. 29B can be cut out from the semiconductor wafer 4800. The chip 4800a includes a wafer 4801a, the circuit portion 4802, and a spacing 4803a. Note that it is preferable to make the spacing 4803a as small as possible. In this case, the width of the spacing 4803 between adjacent circuit portions 4802 is substantially the same as a length of a cutting allowance of the scribe line SCL1 or a cutting allowance of the scribe line SCL2.

Note that the shape of the element substrate of one embodiment of the present invention is not limited to the shape of the semiconductor wafer 4800 shown in FIG. 29A. The element substrate may be a rectangular semiconductor wafer, for example. The shape of the element substrate can be changed as appropriate, depending on a manufacturing process of an element and an apparatus for manufacturing the element.

<Electronic Component>

Figure 29C:
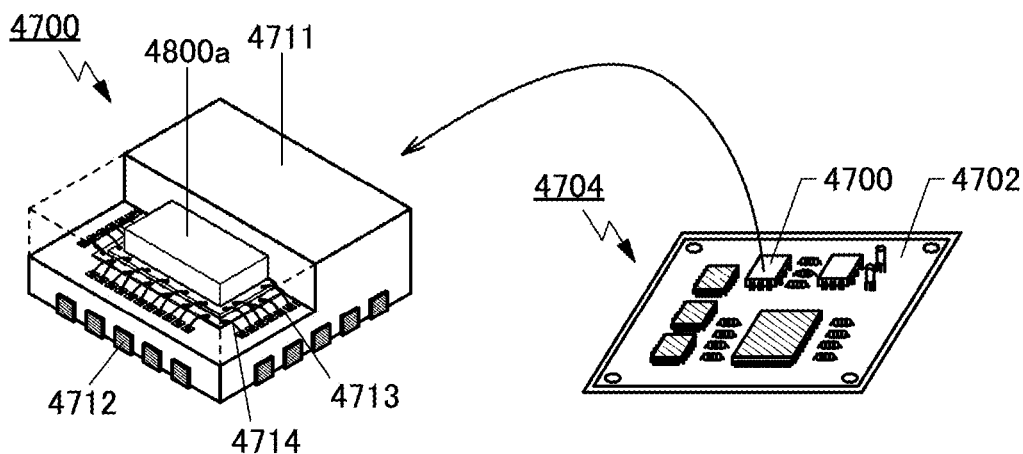
FIG. 29C and FIG. 29D are perspective views illustrating examples of electronic components.

FIG. 29C is a perspective view of an electronic component 4700 and a substrate (a mounting board 4704) on which the electronic component 4700 is mounted. The electronic component 4700 illustrated in FIG. 29C includes the chip 4800*a* in a mold 4711. As the chip 4800*a*, the memory device of one embodiment of the present invention can be used, for example.

To illustrate the inside of the electronic component 4700, some portions are omitted in FIG. 29C. The electronic component 4700 includes a land 4712 outside the mold 4711. The land 4712 is electrically connected to an electrode pad 4713, and the electrode pad 4713 is electrically connected to the chip 4800*a* through a wire 4714. The electronic component 4700 is mounted on a printed circuit board 4702, for example. A plurality of such electronic components are combined and electrically connected to each other on the printed circuit board 4702, whereby the mounting board 4704 is completed.

Figure 29D:
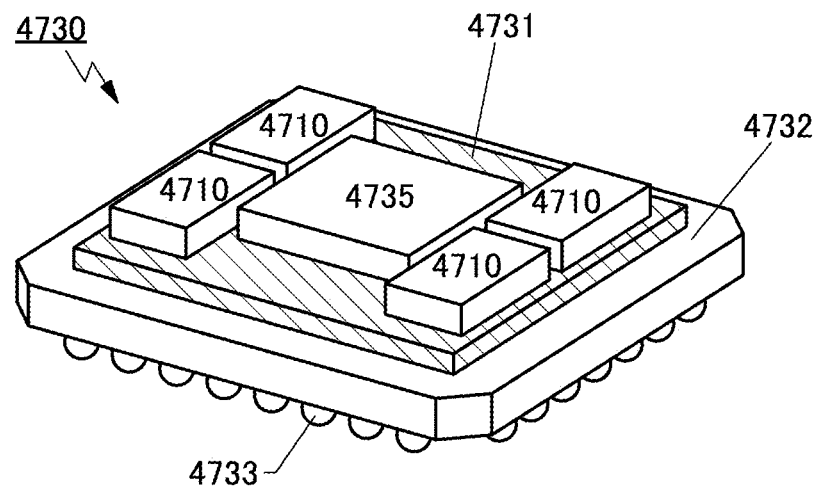

FIG. 29D shows a perspective view of an electronic component 4730. The electronic component 4730 is an example of a SiP (System in package) or an MCM (Multi Chip Module). In the electronic component 4730, an interposer 4731 is provided on a package substrate 4732 (a printed circuit board), and a semiconductor device 4735 and a plurality of memory devices 4710 are provided on the interposer 4731.

Examples of the memory device 4710 include the chip 4800*a*, the memory device described in the above embodiment, and a high bandwidth memory (HBM). An integrated circuit such as a CPU, a GPU, an FPGA, or a memory device can be used as the semiconductor device 4735. Note that in this specification and the like, a semiconductor device generally means a device that can function by utilizing semiconductor characteristics.

As the package substrate 4732, a ceramic substrate, a plastic substrate, a glass epoxy substrate, or the like can be used. As the interposer 4731, a silicon interposer, a resin interposer, or the like can be used.

The interposer 4731 includes a plurality of wirings and has a function of electrically connecting a plurality of integrated circuits with different terminal pitches. The plurality of wirings have a single-layer structure or a layered structure. Moreover, the interposer 4731 has a function of electrically connecting an integrated circuit provided on the interposer 4731 to an electrode provided on the package substrate 4732. Accordingly, the interposer is sometimes referred to as a redistribution substrate or an intermediate substrate. A through electrode is provided in the interposer 4731 and the through electrode is used to electrically connect an integrated circuit and the package substrate 4732 in some cases. In the case of using a silicon interposer, a TSV (Through Silicon Via) can also be used as the through electrode.

A silicon interposer is preferably used as the interposer 4731. The silicon interposer can be manufactured at lower cost than an integrated circuit because it is not necessary to provide an active element. Meanwhile, since wirings of the silicon interposer can be formed through a semiconductor process, the formation of minute wirings, which is difficult for a resin interposer, is easily achieved.

An HBM needs to be connected to many wirings to achieve a wide memory bandwidth. Therefore, an interposer on which an HBM is mounted requires minute and densely formed wirings. For this reason, a silicon interposer is preferably used as the interposer on which an HBM is mounted.

In a SiP, an MCM, or the like using a silicon interposer, a decrease in reliability due to a difference in expansion coefficient between an integrated circuit and the interposer is less likely to occur. Furthermore, a surface of a silicon interposer has high planarity, and a poor connection between the silicon interposer and an integrated circuit provided thereon less likely occurs. It is particularly preferable to use a silicon interposer for a 2.5D package (2.5D mounting) in which a plurality of integrated circuits are arranged side by side on the interposer.

A heat sink (a radiator plate) may be provided to overlap with the electronic component 4730. In the case of providing a heat sink, the heights of integrated circuits provided on the interposer 4731 are preferably equal to each other. For example, in the electronic component 4730 described in this embodiment, the heights of the memory devices 4710 and the semiconductor device 4735 are preferably equal to each other.

To mount the electronic component 4730 on another substrate, an electrode 4733 may be provided on the bottom portion of the package substrate 4732. FIG. 29D shows an example in which the electrode 4733 is formed of a solder ball. Solder balls are provided in a matrix on the bottom portion of the package substrate 4732, whereby BGA (Ball Grid Array) mounting can be achieved. Alternatively, the electrode 4733 may be formed of a conductive pin. When conductive pins are provided in a matrix on the bottom portion of the package substrate 4732, PGA (Pin Grid Array) mounting can be achieved.

The electronic component 4730 can be mounted on another substrate by various mounting methods other than BGA and PGA. For example, a mounting method such as an SPGA (Staggered Pin Grid Array), an LGA (Land Grid Array), a QFP (Quad Flat Package), a QFJ (Quad Flat J-leaded package), or a QFN (Quad Flat Non-leaded package) can be employed.

Note that this embodiment can be combined with any of the other embodiments in this specification as appropriate.

Embodiment 7

In this embodiment, application examples of the memory device of one embodiment of the present invention will be described.

Figure 30A:
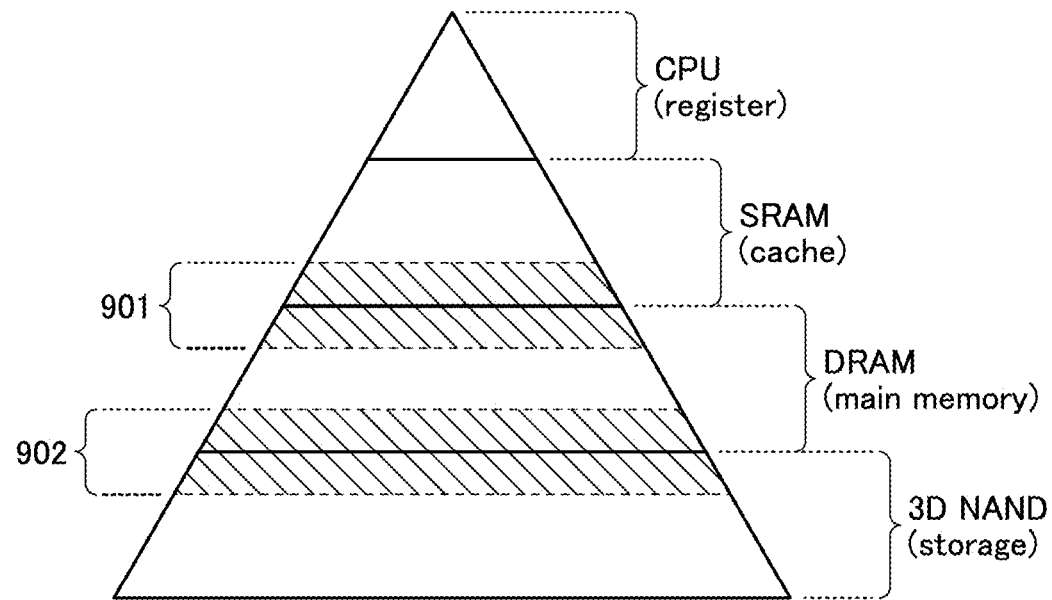
FIG. 30A and FIG. 30B are diagrams each showing a hierarchy of a variety of memory devices.

In general, a variety of memory devices are used in semiconductor devices such as computers in accordance with the intended use. FIG. 30A illustrates the hierarchy of various memory devices used in a semiconductor device. The memory devices at the upper levels require a higher operating speed, whereas the memory devices at the lower levels require a larger memory capacity and a higher memory density. FIG. 30A shows, sequentially from the top level, a memory included as a register in an arithmetic processing device such as a CPU, an SRAM, a DRAM, and a 3D NAND memory.

A memory included as a register in an arithmetic processing device such as a CPU is used for temporary storage of arithmetic operation results, for example, and thus is very frequently accessed by the arithmetic processing device.

Accordingly, high operation speed is required rather than memory capacity. The register also has a function of retaining settings of the arithmetic processing device, for example.

An SRAM is used for a cache, for example. The cache has a function of duplicating and retaining part of data retained in a main memory. By duplicating frequently used data and retaining the duplicated data in the cache, the access speed to the data can be increased. The cache requires a smaller memory capacity than the main memory but a higher operating speed than the main memory. Data that is rewritten in the cache is duplicated, and the duplicated data is supplied to the main memory.

A DRAM is used for the main memory, for example. The main memory has a function of retaining a program and data that are read from the storage. The memory density of a DRAM is approximately 0.1 to 0.3 Gbit/mm$^2$.

A 3D NAND memory is used for the storage, for example. The storage has a function of retaining data that needs to be stored for a long time and programs used in an arithmetic processing device, for example. Therefore, the storage needs to have a large memory capacity and a high memory density rather than operating speed. The memory density of the memory device used for the storage is approximately 0.6 to 6.0 Gbit/mm$^2$.

The memory device of one embodiment of the present invention operates fast and can retain data for a long time. The memory device of one embodiment of the present invention can be favorably used as a memory device in a boundary region 901 that includes both the level where the cache is positioned and the level where the main memory is positioned. The memory device of one embodiment of the present invention can be favorably used as a memory device in a boundary region 902 that includes both the level where the main memory is positioned and the level where the storage is positioned.

Figure 30B:
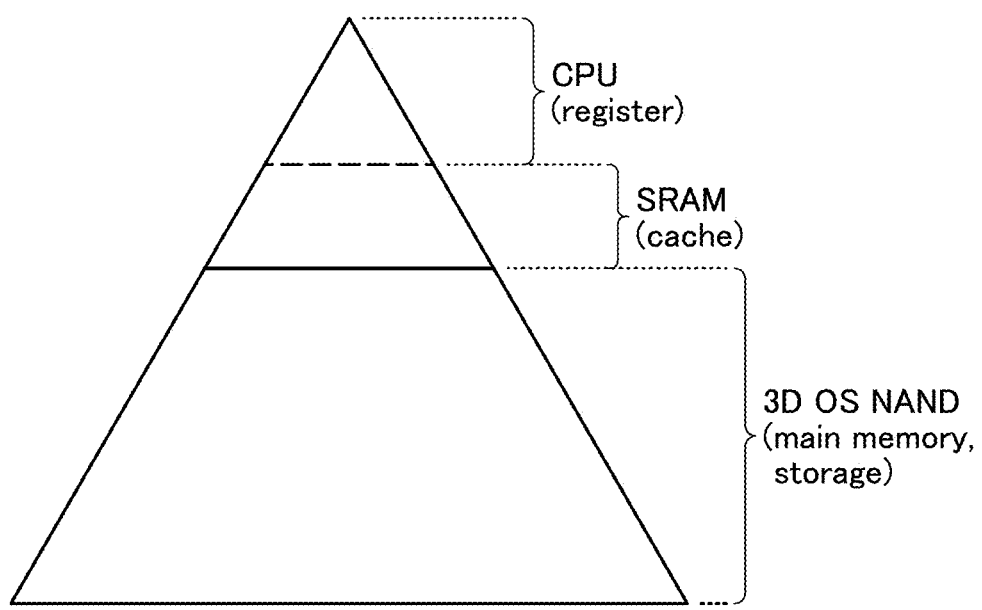

The memory device of one embodiment of the present invention can be favorably used at both the level where the main memory is positioned and the level where the storage is positioned. The memory device of one embodiment of the present invention can be favorably used at the level where the cache is positioned. FIG. 30B illustrates the hierarchy of various memory devices different from that in FIG. 30A.

FIG. 30B shows, sequentially from the top level, a memory included as a register in an arithmetic processing device such as a CPU, an SRAM used as a cache, and a 3D OS NAND memory. The memory device of one embodiment of the present invention can be used for the cache, the main memory, and the storage. When a high-speed memory of 1 GHz or higher is required as the cache, the cache is included in an arithmetic processing device such as a CPU.

The memory device of one embodiment of the present invention is not limited to a NAND type, and may alternatively be a NOR type or a combination of a NAND type and a NOR type.

The memory device of one embodiment of the present invention can be used, for example, as memory devices of a variety of electronic devices (e.g., information terminals, computers, smartphones, e-book readers, digital still cameras, video cameras, video recording/reproducing devices, navigation systems, and game machines). The memory device of one embodiment of the present invention can also be used for image sensors, IoT (Internet of Things) terminal devices, healthcare devices, and the like. Here, the computers refer not only to tablet computers, notebook computers, and desktop computers, but also to large computers such as server systems.

Examples of electronic device including the memory device of one embodiment of the present invention will be described. FIG. 31A to FIG. 31J and FIG. 32A to FIG. 32E each show that the electronic component 4700 or the electronic component 4730, each of which includes the memory device, is included in an electronic device.

[Mobile Phone]

Figure 31A:
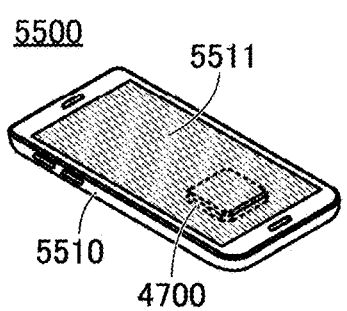
FIG. 31A to FIG. 31J are each a perspective view or a schematic view illustrating an example of an electronic device.

An information terminal 5500 illustrated in FIG. 31A is a mobile phone (a smartphone), which is a type of information terminal. The information terminal 5500 includes a housing 5510 and a display portion 5511. As input interfaces, a touch panel is provided in the display portion 5511 and a button is provided in the housing 5510.

By using the memory device of one embodiment of the present invention, the information terminal 5500 can retain a temporary file generated at the time of executing an application (e.g., a web browser's cache).

[Wearable Terminal]

Figure 31B:
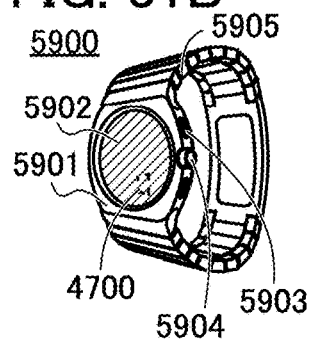

FIG. 31B illustrates an information terminal 5900 as an example of a wearable terminal. The information terminal 5900 includes a housing 5901, a display portion 5902, an operation switch 5903, an operation switch 5904, a band 5905, and the like.

Like the information terminal 5500 described above, the wearable terminal can retain a temporary file generated at the time of executing an application, by using the memory device of one embodiment of the present invention.

[Information Terminal]

Figure 31C:
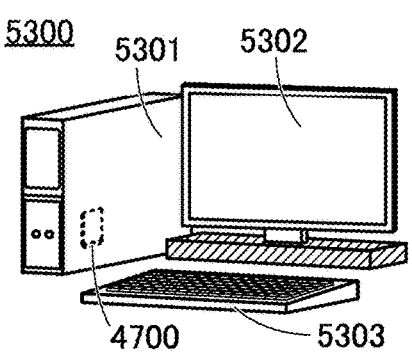

FIG. 31C illustrates a desktop information terminal 5300. The desktop information terminal 5300 includes a main body 5301 of the information terminal, a display portion 5302, and a keyboard 5303.

Like the information terminal 5500 described above, the desktop information terminal 5300 can retain a temporary file generated at the time of executing an application, by using the memory device of one embodiment of the present invention.

Note that although FIG. 31A to FIG. 31C illustrate a smartphone, a wearable terminal, and a desktop information terminal as examples of the electronic device, one embodiment of the present invention can also be applied to an information terminal other than a smartphone, a wearable terminal, and a desktop information terminal. Examples of information terminals other than a smartphone, a wearable terminal, and a desktop information terminal include a PDA (Personal Digital Assistant), a laptop information terminal, and a workstation.

[Household Appliance]

Figure 31D:
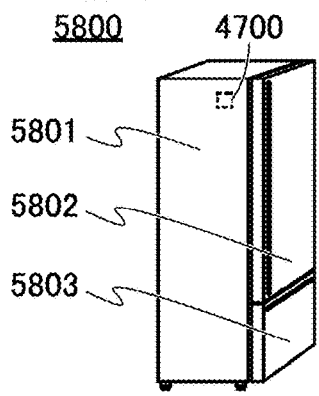

FIG. 31D illustrates an electric refrigerator-freezer 5800 as an example of a household appliance. The electric refrigerator-freezer 5800 includes a housing 5801, a refrigerator door 5802, a freezer door 5803, and the like. For example, the electric refrigerator-freezer 5800 is compatible with IoT (Internet of Things).

The memory device of one embodiment of the present invention can be used in the electric refrigerator-freezer 5800. The electric refrigerator-freezer 5800 can transmit and receive data on food stored in the electric refrigerator-freezer 5800 and food expiration dates, for example, to/from an information terminal and the like via the Internet. In the electric refrigerator-freezer 5800, the memory device can retain a temporary file generated at the time of transmitting the data.

Here, an electric refrigerator-freezer is described as an example of a household appliance; other examples of household appliances include a vacuum, a microwave oven, an electric oven, a rice cooker, a water heater, an IH cooker, a water server, a heating-cooling combination appliance such as an air conditioner, a washing machine, a drying machine, and an audio visual appliance.

[Game Machines]

Figure 31E:
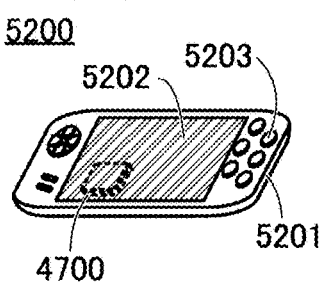

FIG. 31E illustrates a portable game machine 5200 as an example of a game machine. The portable game machine 5200 includes a housing 5201, a display portion 5202, a button 5203, and the like.

Figure 31F:
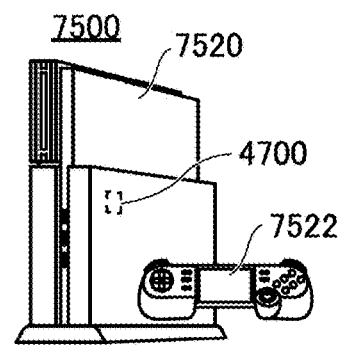

FIG. 31F illustrates a stationary game machine 7500 as another example of a game machine. The stationary game machine 7500 includes a main body 7520 and a controller 7522. The controller 7522 can be connected to the main body 7520 with or without a wire. Although not illustrated in FIG. 31F, the controller 7522 can include a display portion that displays a game image, and an input interface besides a button, such as a touch panel, a stick, a rotating knob, and a sliding knob, for example. The shape of the controller 7522 is not limited to that in FIG. 31F and may be changed variously in accordance with the genres of games. For example, in a shooting game such as an FPS (First Person Shooter) game, a gun-shaped controller having a trigger button can be used. As another example, in a music game or the like, a controller having a shape of a music instrument, audio equipment, or the like can be used. Furthermore, the stationary game machine may include a camera, a depth sensor, a microphone, and the like so that the game player can play a game using a gesture and/or a voice instead of a controller.

Videos displayed on the game machine can be output with a display device such as a television device, a personal computer display, a game display, and a head-mounted display.

By using the memory device described in the above embodiment in the portable game machine 5200 and the stationary game machine 7500, low power consumption can be achieved in the portable game machine 5200 and the stationary game machine 7500. Moreover, heat generation from a circuit can be reduced owing to low power consumption; thus, the influence of heat generation on the circuit, the peripheral circuit, and the module can be reduced.

Moreover, with the use of the memory device described in the above embodiment, the portable game machine 5200 and the stationary game machine 7500 can retain a temporary file or the like necessary for arithmetic operation that occurs during game play.

As examples of game machines, FIG. 31E illustrates a portable game machine and FIG. 31F illustrates a stationary game machine; however, the electronic device of one embodiment of the present invention is not limited thereto. Other examples of the electronic device of one embodiment of the present invention include an arcade game machine installed in an entertainment facility (e.g., a game center and an amusement park) and a throwing machine for batting practice, installed in sports facilities.

[Moving Vehicle]

The memory device described in the above embodiment can be used in an automobile, which is a moving vehicle, and around the driver's seat in an automobile.

Figure 31G:
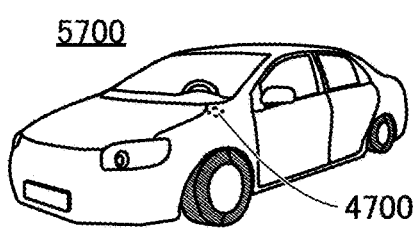

FIG. 31G illustrates an automobile 5700 as an example of a moving vehicle.

An instrument panel that provides various kinds of information by displaying a speedometer, a tachometer, a mileage, a fuel meter, a gearshift indicator, air-conditioning settings, and the like is provided around the driver's seat in the automobile 5700. In addition, a display device showing the above information may be provided around the driver's seat.

In particular, the display device can compensate for the view obstructed by the pillar or the like, the blind areas for the driver's seat, and the like by displaying a video taken by an imaging device (not illustrated) provided for the automobile 5700, thereby providing a high level of safety. That is, displaying an image taken by the imaging device provided on the exterior of the automobile 5700 leads to compensation for the blind areas and an increase in safety.

The memory device described in the above embodiment can temporarily retain data, and thus can be used to retain temporary data necessary in an automatic driving system for the automobile 5700 and a system for navigation and risk prediction, for example. The display device may be configured to display temporary information for navigation, risk prediction, and the like. Moreover, the memory device may be configured to retain a video taken by a driving recorder provided on the automobile 5700.

Although an automobile is described above as an example of a moving vehicle, moving vehicles are not limited to an automobile. Other examples of moving vehicles include a train, a monorail train, a ship, and a flying object (a helicopter, an unmanned aircraft (a drone), an airplane, and a rocket).

[Camera]

The memory device described in the above embodiment can be used in a camera.

Figure 31H:
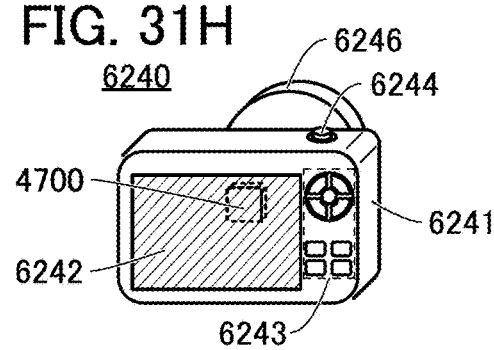

FIG. 31H illustrates a digital camera 6240 as an example of an imaging device. The digital camera 6240 includes a housing 6241, a display portion 6242, operation switches 6243, a shutter button 6244, and the like. An attachable lens 6246 is attached to the digital camera 6240. Here, the lens 6246 of the digital camera 6240 is detachable from the housing 6241 for replacement; alternatively, the lens 6246 may be incorporated into the housing 6241. Moreover, the digital camera 6240 may be configured to be equipped with a stroboscope, a viewfinder, or the like.

When the memory device described in the above embodiment is used in the digital camera 6240, the digital camera 6240 with low power consumption can be achieved. Moreover, heat generation from a circuit can be reduced owing to low power consumption; thus, the influence of heat generation on the circuit, the peripheral circuit, and the module can be reduced.

[Video Camera]

The memory device described in the above embodiment can be used in a video camera.

Figure 31I:
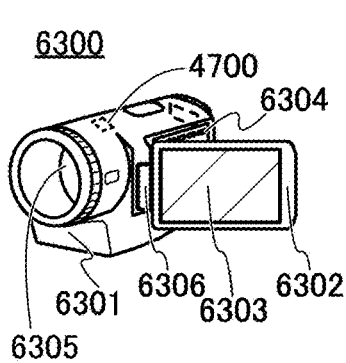

FIG. 31I illustrates a video camera 6300 as an example of an imaging device. The video camera 6300 includes a first housing 6301, a second housing 6302, a display portion 6303, an operation switch 6304, a lens 6305, a joint 6306, and the like. The operation switch 6304 and the lens 6305 are provided for the first housing 6301, and the display portion 6303 is provided for the second housing 6302. The first housing 6301 and the second housing 6302 are connected to each other with the joint 6306, and the angle between the first housing 6301 and the second housing 6302 can be changed with the joint 6306. Videos displayed on the display portion 6303 may be switched in accordance with the angle at the joint 6306 between the first housing 6301 and the second housing 6302.

When a video taken by the video camera 6300 is recorded, the video needs to be encoded based on a data recording format. With the use of the above memory device, the video camera 6300 can retain a temporary file generated in encoding.

[ICD]

The memory device described in the above embodiment can be used in an implantable cardioverter-defibrillator (ICD).

Figure 31J:
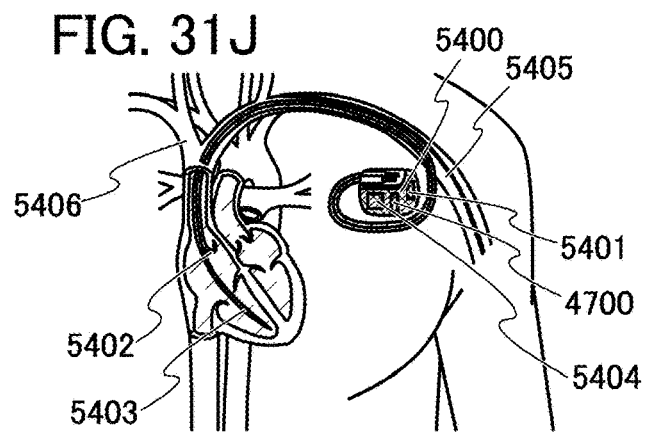

FIG. 31J is a schematic cross-sectional view illustrating an example of an ICD. An ICD main unit 5400 includes at least a battery 5401, the electronic component 4700, a regulator, a control circuit, an antenna 5404, a wire 5402 reaching a right atrium, and a wire 5403 reaching a right ventricle.

The ICD main unit 5400 is implanted in the body by surgery, and the two wires pass through a subclavian vein 5405 and a superior vena cava 5406 of the human body, with the end of one of them placed in the right ventricle and the end of the other placed in the right atrium.

The ICD main unit 5400 functions as a pacemaker and paces the heart when the heart rate is not within a predetermined range. When the heart rate is not recovered by pacing (e.g., when ventricular tachycardia or ventricular fibrillation occurs), treatment with an electrical shock is performed.

The ICD main unit 5400 needs to monitor the heart rate all the time in order to perform pacing and deliver electrical shocks as appropriate. For that reason, the ICD main unit 5400 includes a sensor for measuring the heart rate. In the ICD main unit 5400, data on the heart rate obtained by the sensor, the number of times the treatment with pacing is performed, and the time taken for the treatment, for example, can be stored in the electronic component 4700.

The antenna 5404 can receive power, and the power is charged into the battery 5401. When the ICD main unit 5400 includes a plurality of batteries, the safety can be improved. Specifically, even if one of the batteries in the ICD main unit 5400 is dead, the other batteries can work properly; hence, the batteries also function as an auxiliary power source.

In addition to the antenna 5404 capable of receiving power, an antenna that can transmit physiological signals may be included to construct, for example, a system that monitors the cardiac activity by checking physiological signals such as a pulse, a respiratory rate, a heart rate, and body temperature with an external monitoring device.

[Expansion Device for PC]

The memory device described in the above embodiment can be used in a calculator such as a PC and an expansion device for an information terminal.

Figure 32A:
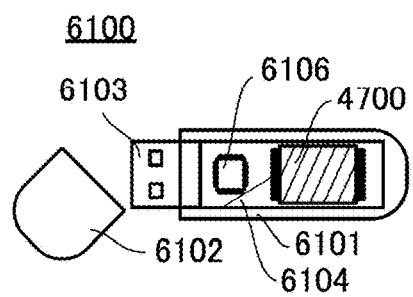
FIG. 32A to FIG. 32E are each a perspective view or a schematic view illustrating an example of an electronic device.

FIG. 32A illustrates, as an example of the expansion device, a portable expansion device 6100 that is externally attached to a PC and includes a chip capable of storing data. When the expansion device 6100 is connected to a PC with a USB (Universal Serial Bus), for example, data can be stored in the chip. FIG. 32A illustrates the portable expansion device 6100; however, the expansion device of one embodiment of the present invention is not limited to this and may be a relatively large expansion device including a cooling fan or the like, for example.

The expansion device 6100 includes a housing 6101, a cap 6102, a USB connector 6103, and a substrate 6104. The substrate 6104 is held in the housing 6101. The substrate 6104 is provided with a circuit for driving the memory device or the like described in the above embodiment. For example, the substrate 6104 is provided with the electronic component 4700 and a controller chip 6106. The USB connector 6103 functions as an interface for connection to an external device.

[SD Card]

The memory device described in the above embodiment can be used in an SD card that can be attached to electronic devices such as an information terminal and a digital camera.

Figure 32B:
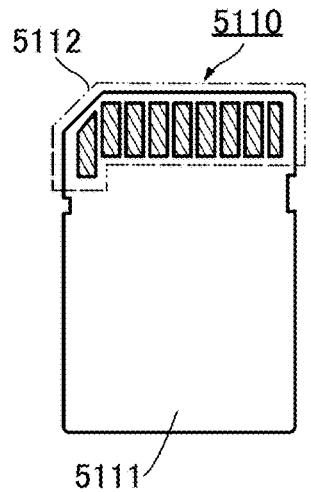
Figure 32C:
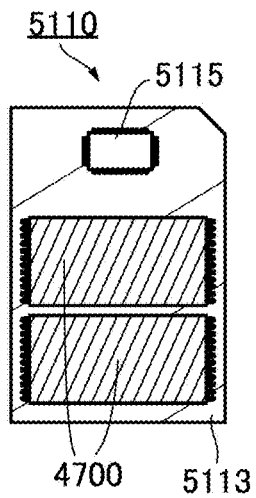

FIG. 32B is a schematic external diagram of an SD card, and FIG. 32C is a schematic diagram illustrating the internal structure of the SD card. An SD card 5110 includes a housing 5111, a connector 5112, and a substrate 5113. The connector 5112 functions as an interface for connection to an external device. The substrate 5113 is held in the housing 5111. The substrate 5113 is provided with a memory device and a circuit for driving the memory device. For example, the substrate 5113 is provided with the electronic component 4700 and a controller chip 5115. Note that the circuit structures of the electronic component 4700 and the controller chip 5115 are not limited to those described above and can be changed as appropriate depending on circumstances. For example, a write circuit, a row driver, a read circuit, and the like that are provided in an electronic component may be incorporated into the controller chip 5115 instead of the electronic component 4700.

When the electronic component 4700 is also provided on the back side of the substrate 5113, the capacity of the SD card 5110 can be increased. In addition, a wireless chip with a radio communication function may be provided on the substrate 5113. This enables wireless communication between an external device and the SD card 5110, making it possible to write/read data to/from the electronic component 4700.

[SSD]

The memory device described in the above embodiment can be used in an SSD that can be attached to an electronic device such as an information terminal.

Figure 32D:
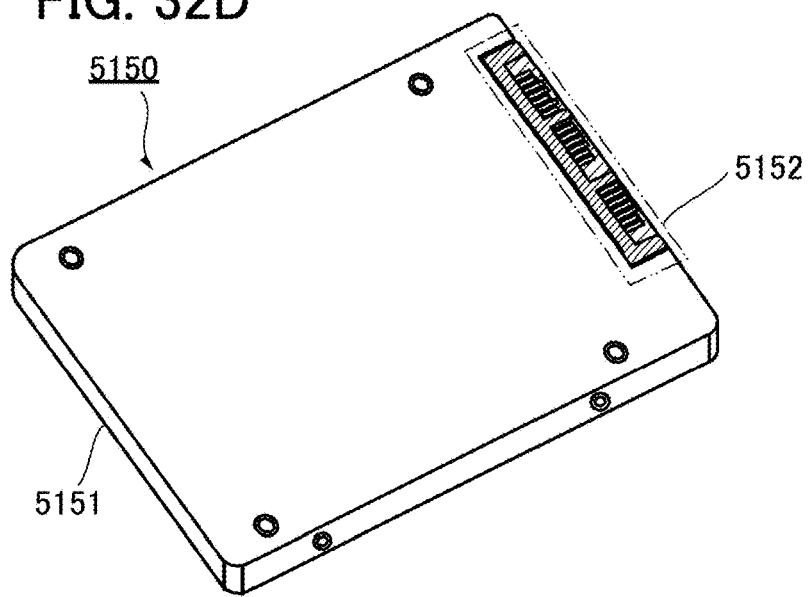
Figure 32E:
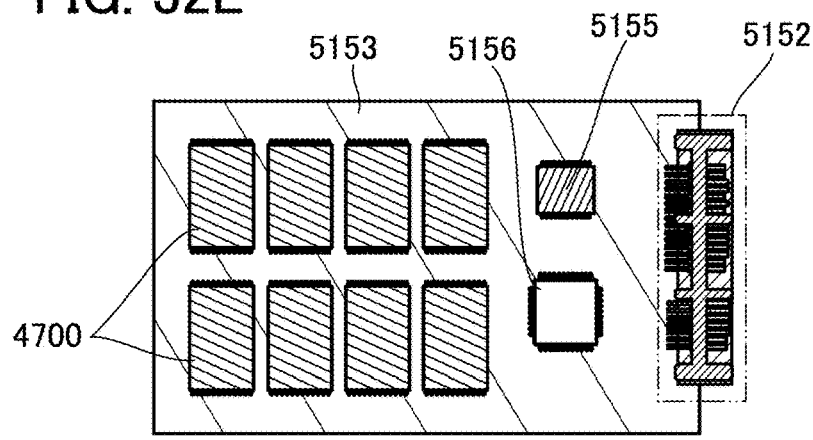

FIG. 32D is a schematic external diagram of an SSD, and FIG. 32E is a schematic diagram of the internal structure of the SSD. An SSD 5150 includes a housing 5151, a connector 5152, and a substrate 5153. The connector 5152 functions as an interface for connection to an external device. The substrate 5153 is held in the housing 5151. The substrate 5153 is provided with a memory device and a circuit for driving the memory device. For example, the substrate 5153 is provided with the electronic component 4700, a memory chip 5155, and a controller chip 5156. When the electronic component 4700 is also provided on the back side of the substrate 5153, the capacity of the SSD 5150 can be increased. A work memory is incorporated into the memory chip 5155. For example, a DRAM chip is used as the memory chip 5155. A processor, an ECC circuit, and the like are incorporated into the controller chip 5156. Note that the circuit structures of the electronic component 4700, the memory chip 5155, and the controller chip 5156 are not limited to those described above and can be changed as appropriate depending on circumstances. For example, a memory functioning as a work memory may also be provided in the controller chip 5156.

[Computer]

Figure 33A:
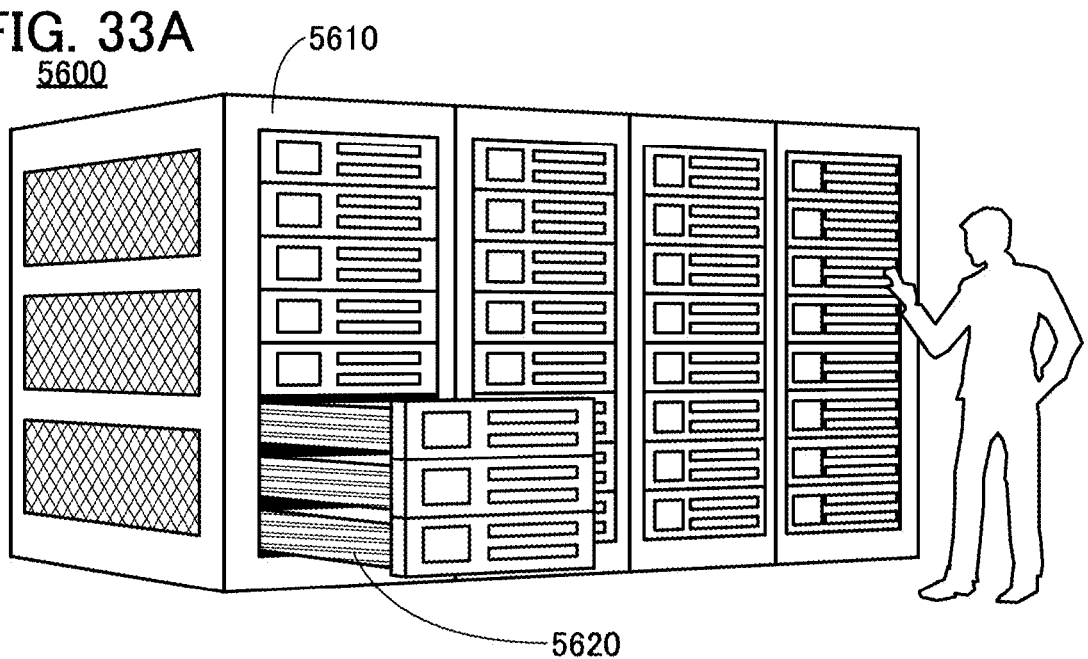
FIG. 33A to FIG. 33C are diagrams illustrating examples of electronic devices.

A computer 5600 illustrated in FIG. 33A is an example of a large computer. In the computer 5600, a plurality of rack mount computers 5620 are stored in a rack 5610. Note that the computer 5600 may be referred to as a supercomputer.

Figure 33B:
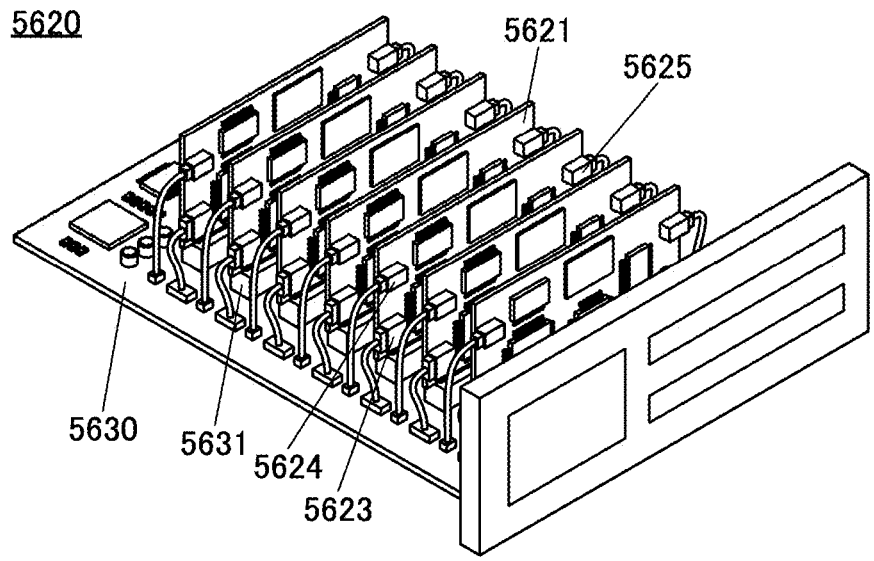

The computer 5620 can have a structure in a perspective view of FIG. 33B, for example. In FIG. 33B, the computer 5620 includes a motherboard 5630, and the motherboard 5630 includes a plurality of slots 5631 and a plurality of connection terminals. A PC card 5621 is inserted in the slot 5631. In addition, the PC card 5621 includes a connection terminal 5623, a connection terminal 5624, and a connection terminal 5625, each of which is connected to the motherboard 5630.

Figure 33C:
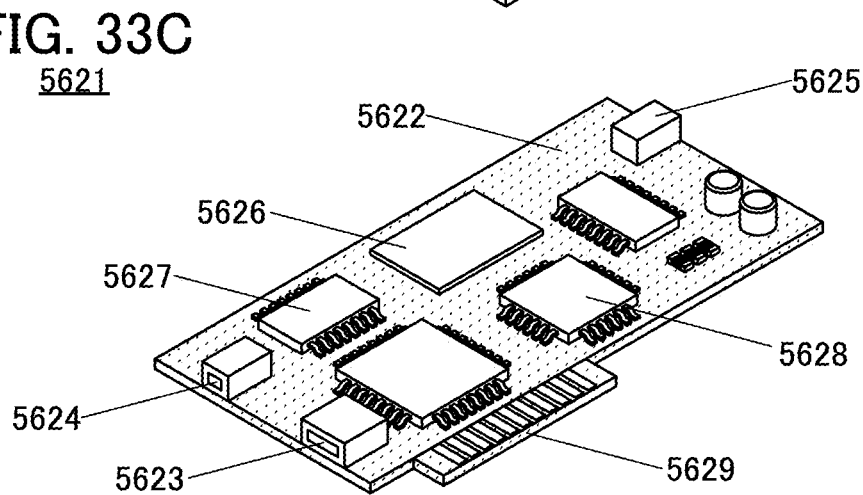

The PC card 5621 illustrated in FIG. 33C is an example of a processing board provided with a CPU, a GPU, a memory device, and the like. The PC card 5621 includes a board 5622. The board 5622 includes the connection terminal 5623, the connection terminal 5624, the connection terminal 5625, a semiconductor device 5626, a semiconductor device 5627, a semiconductor device 5628, and a connection terminal 5629. FIG. 33C also illustrates semiconductor devices other than the semiconductor device 5626, the semiconductor device 5627, and the semiconductor device 5628; the following description of the semiconductor device 5626, the semiconductor device 5627, and the semiconductor device 5628 can be referred to for these semiconductor devices.

The connection terminal 5629 has a shape with which the connection terminal 5629 can be inserted in the slot 5631 of the motherboard 5630, and the connection terminal 5629 functions as an interface for connecting the PC card 5621 and the motherboard 5630. An example of the standard for the connection terminal 5629 is PCIe.

The connection terminal 5623, the connection terminal 5624, and the connection terminal 5625 can serve, for example, as an interface for performing power supply, signal input, or the like to the PC card 5621. As another example, they can serve as an interface for outputting a signal calculated by the PC card 5621. Examples of the standard for each of the connection terminal 5623, the connection terminal 5624, and the connection terminal 5625 include USB, SATA (Serial ATA), and SCSI (Small Computer System Interface). In the case where video signals are output from the connection terminal 5623, the connection terminal 5624, and the connection terminal 5625, an example of the standard therefor is HDMI (registered trademark).

The semiconductor device 5626 includes a terminal (not illustrated) for inputting and outputting signals. When the terminal is inserted in a socket (not illustrated) of the board 5622, the semiconductor device 5626 and the board 5622 can be electrically connected to each other.

The semiconductor device 5627 includes a plurality of terminals. When the terminals are reflow-soldered, for example, to wirings of the board 5622, the semiconductor device 5627 and the board 5622 can be electrically connected to each other. Examples of the semiconductor device 5627 include an FPGA (Field Programmable Gate Array), a GPU, and a CPU. As the semiconductor device 5627, the electronic component 4730 can be used, for example.

The semiconductor device 5628 includes a plurality of terminals. When the terminals are reflow-soldered, for example, to wirings of the board 5622, the semiconductor device 5628 and the board 5622 can be electrically connected to each other. An example of the semiconductor device 5628 is a memory device. As the semiconductor device 5628, the electronic component 4700 can be used, for example.

The computer 5600 can also function as a parallel computer. When the computer 5600 is used as a parallel computer, large-scale computation necessary for artificial intelligence learning and inference can be performed, for example.

The semiconductor device of one embodiment of the present invention is used in a variety of electronic devices described above, whereby a smaller size, higher speed, or lower power consumption of the electronic devices can be achieved. In addition, since the semiconductor device of one embodiment of the present invention has low power consumption, heat generation from a circuit can be reduced. Accordingly, it is possible to reduce adverse effects of the heat generation on the circuit itself, the peripheral circuit, and the module. Furthermore, the use of the semiconductor device of one embodiment of the present invention can achieve an electronic device that operates stably even in a high-temperature environment. Thus, the reliability of the electronic device can be improved.

Figure 34:
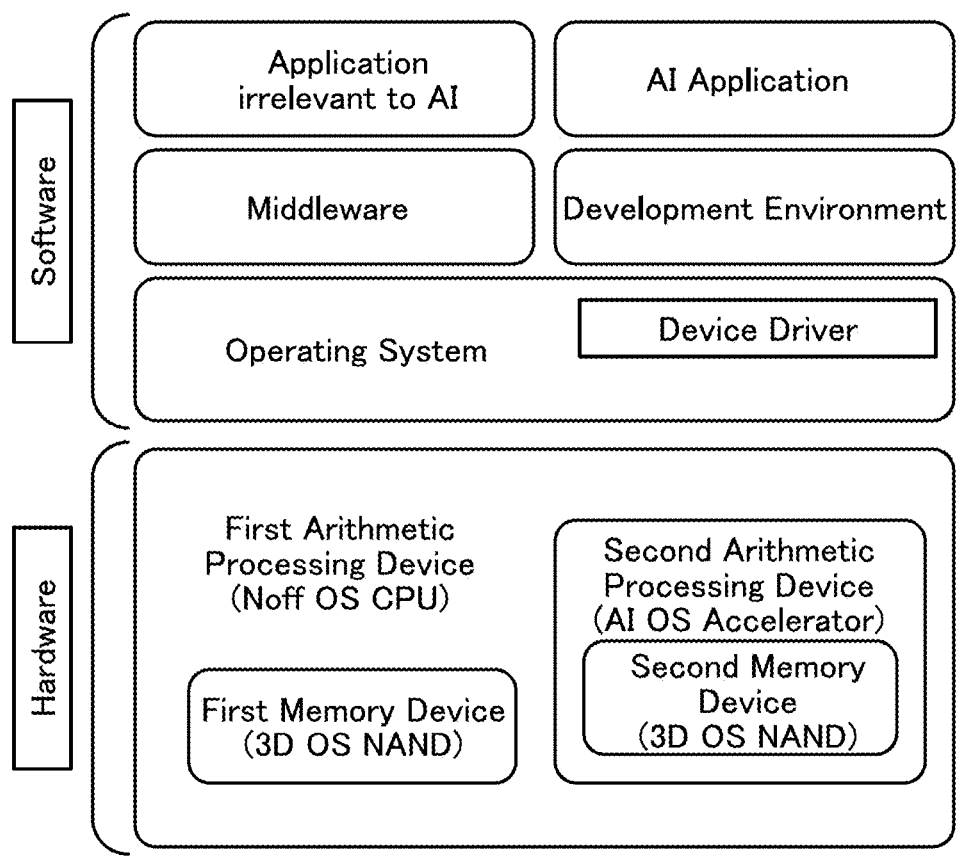
FIG. 34 illustrates an example of an electronic device.

Next, a structure example of a computer system that can be used in the computer 5600 is described. FIG. 34 illustrates a structure example of a computer system 7000. The computer system 7000 is made of software and hardware. Note that the hardware included in the computer system is sometimes referred to as an information processing device.

Examples of the software in the computer system 7000 include operating systems including device drivers, middleware, a variety of development environments, application programs related to AI (AI Application), and application programs irrelevant to AI.

The device drivers include, for example, application programs for controlling externally connected devices such as an auxiliary memory device, a display device, and a printer.

The hardware in the computer system 7000 includes a first arithmetic processing device, a second arithmetic processing device, a first memory device, and the like. The second arithmetic processing device includes a second memory device.

As the first arithmetic processing device, a central processing unit such as an Noff OS CPU is preferably used, for example. The Noff OS CPU includes a memory unit using OS transistors (e.g., a nonvolatile memory), and has a function of storing necessary data into the memory unit and stopping power supply to the central processing unit when it does not need to operate. The use of the Noff OS CPU as the first arithmetic processing device can reduce the power consumption of the computer system 7000.

As the second arithmetic processing device, a GPU or an FPGA can be used, for example. Note that as the second arithmetic processing device, an AI OS Accelerator is preferably used. The AI OS Accelerator is composed of OS transistors and includes an arithmetic unit such as a product-sum operation circuit. The power consumption of the AI OS Accelerator is lower than that of a common GPU and the like. The use of the AI OS Accelerator as the second arithmetic processing device can reduce the power consumption of the computer system 7000.

As the first memory device and the second memory device, the memory device of one embodiment of the present invention is preferably used. For example, the 3D OS NAND memory device is preferably used. The 3D OS NAND memory device can function as a cache, a main memory, and storage. The use of the 3D OS NAND memory device facilitates fabrication of a non-von Neumann computer system.

The power consumption of the 3D OS NAND memory device is lower than that of a 3D NAND memory device using Si transistors. The use of the 3D OS NAND memory device as the memory devices can reduce the power consumption of the computer system 7000. In addition, the 3D OS NAND memory device can function as a universal memory, thereby reducing the number of components included in the computer system 7000.

When the semiconductor device constituting the hardware is configured with the semiconductor device including OS transistors, the hardware including the central processing unit, the arithmetic processing device, and the memory device can be easily monolithic. Making the hardware monolithic facilitates a further reduction in power consumption as well as a reduction in size, weight, and thickness.

[IoT]

The memory device of one embodiment of the present invention can be suitably used for a small-scale system such as an IoT (Internet of Things) terminal device (also referred to as endpoint microcomputer) in the IoT field, for example.

Figure 35:
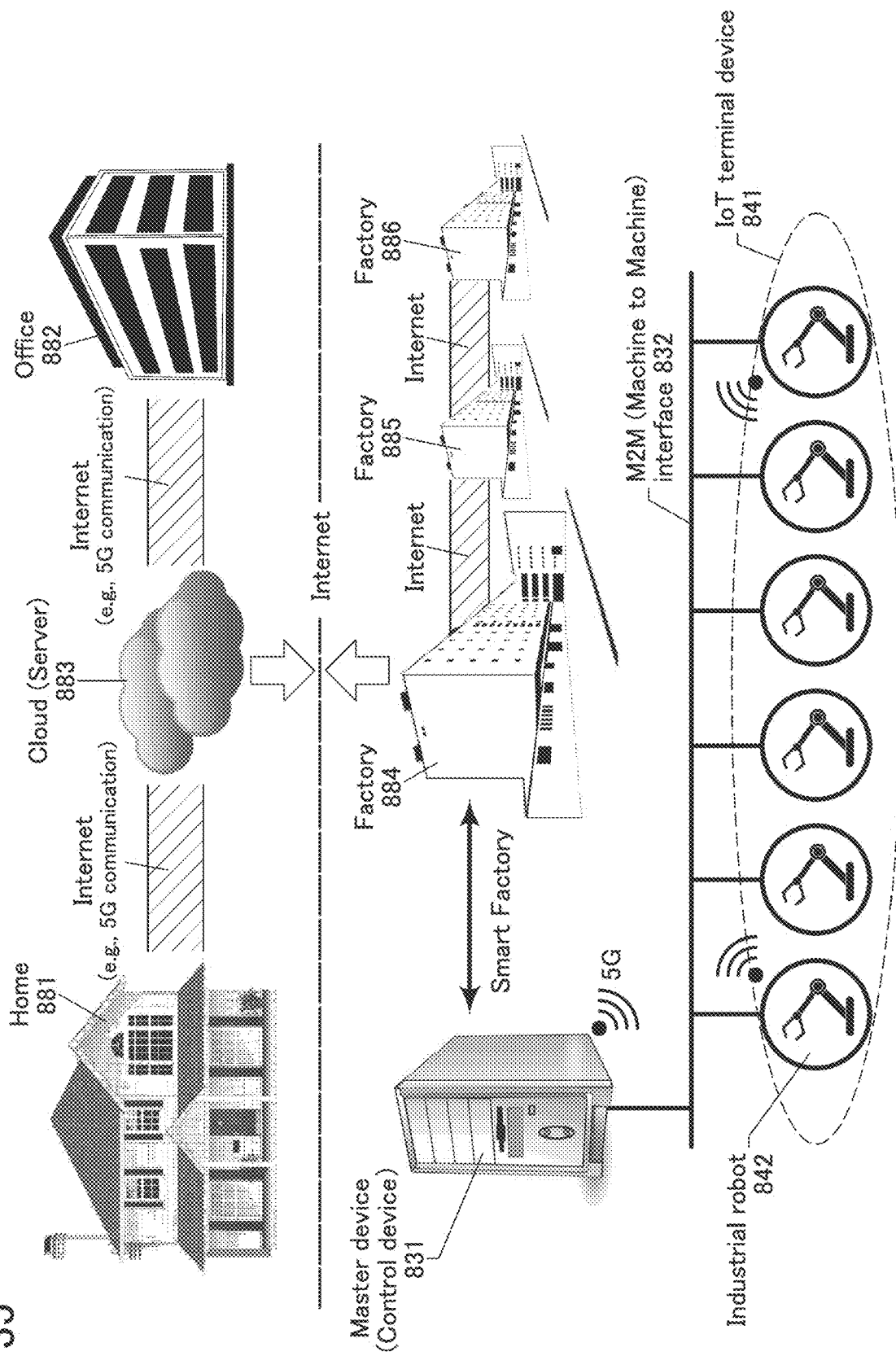
FIG. 35 is a conceptual diagram of factory automation.

FIG. 35 shows a conceptual diagram showing factory automation as an application example of the endpoint microcomputer. A factory 884 is connected to a cloud 883 through Internet connection (Internet). The cloud 883 is connected to a home 881 and an office 882 through the Internet connection. The Internet connection may be wired communication or wireless communication. In the case of wireless communication, for example, wireless communication based on a communication standard such as the fourth-generation mobile communication system (4G) or the fifth-generation mobile communication system (5G) is performed using the memory device of one embodiment of the present invention in a communication device. The factory 884 may be connected to a factory 885 and a factory 886 through the Internet connection.

The factory 884 includes a master device (control device) 831. The master device 831 is connected to the cloud 883 and has a function of transmitting and receiving data. The master device 831 is connected to a plurality of industrial robots 842 included in an IoT terminal device 841 through an M2M (Machine-to-Machine) interface 832. As the M2M interface 832, for example, industrial Ethernet ("Ethernet" is a registered trademark), which is a kind of wired communication, or local 5G, which is a kind of wireless communication, may be used.

A factory manager can check the operational status or the like from the home 881 or the office 882 connected to the factory 884 through the cloud 883. In addition, the manager can check wrong items and part shortage, instruct a storage space, and measure takt time, for example.

In recent years, IoT has been globally introduced into factories; under the name "Smart Factory". Smart Factory has been reported to enable not only simple examination and inspection by an endpoint microcomputer but also detection of failures and prediction of abnormality, for example.

The total power consumption of a small-scale system such as an endpoint microcomputer during operation is often small, which enhances the power reduction effect in a standby state by the memory device. Although the embedded field of IoT sometimes requires quick response, the use of the memory device of one embodiment of the present invention allows high-speed return from a standby state.

Note that this embodiment can be combined with any of the other embodiments in this specification as appropriate.

REFERENCE NUMERALS abl: wiring, awl: wiring, AD: address signal, BL: wiring, BLD: circuit, BSL: wiring, BTr: transistor, CAL: wiring, CD: column decoder, CL: wiring, COIL: coil, CPU: central processing unit, CTr: transistor, CTR: control circuit, C11: capacitor, C12: capacitor, CS: control signal, CVC: circuit, EW: wiring, MC: memory cell, MCA: memory cell array, MCL: memory cell portion, M11: transistor, M12: transistor, M13: transistor, N11: node, N12: node, OBLD: circuit, OAD: address signal, OCD: column decoder, OMC: memory cell, OMCL: memory cell portion, OOPC: output circuit, OPC: output circuit, OPR: precharge circuit, ORD: data signal, ORPH: circuit, OSA: sense amplifier, OSC: circuit, OUTP: output circuit, OWC: write circuit, OWD: data signal, OWLD: circuit, PRPH: circuit, PU: arithmetic portion, rbl: wiring, rwl: wiring, RD: data signal, RDATA: data signal, RFBL: RF block circuit, SA: sense amplifier, SCL1: scribe line, SCL2: scribe line, SRG: string, SSL: wiring, STr: transistor, SUB: substrate, wbl: wiring, wwl: wiring, WC: write circuit, WD: data signal, Vdd: potential, WDATA: data signal, WL: wiring, WLD: circuit, 10: layer, 10B: layer, 20: layer, 30: layer, 30B: layer, 40: layer, 40A: layer, 40B: layer, 100: memory device, 100A: memory device, 110: memory device, 111: insulator, 112: insulator, 113: insulator, 114: insulator, 115: insulator, 116: insulator, 117: insulator, 121: insulator, 122: insulator, 131: insulator, 132: insulator, 133: insulator, 141: semiconductor, 142: semiconductor, 143: semiconductor, 150: host, 151: conductor, 152: conductor, 153: conductor, 154: conductor, 155: conductor, 156: conductor, 200A: central management unit, 211: insulator, 212: insulator, 213: insulator, 214: insulator, 215: insulator, 216: insulator, 221: conductor, 222: conductor, 223: conductor, 231: semiconductor, 232: semiconductor, 240: insulator, 241: insulator, 242: insulator, 250: conductor, 251: conductor, 252: conductor, 300: transistor, 300A: data processing system, 311: substrate, 313: semiconductor region, 314$a$: low-resistance region, 314$b$: low-resistance region, 315: insulator, 316: conductor, 320: insulator, 322: insulator, 324: insulator, 326: insulator, 328: conductor, 330: conductor, 350: insulator, 382: insulator, 384: insulator, 386: conductor, 402: insulator, 404: insulator, 410: memory element, 411: transistor, 412: transistor, 413: node, 421: terminal, 422: terminal, 423: terminal, 425: capacitor, 431: transistor, 432: transistor, 433: terminal, 434: terminal, 500: transistor, 503: conductor, 503$a$: conductor, 503$b$: conductor, 505: conductor, 505$a$: conductor, 505$b$: conductor, 510: insulator, 510A: transistor, 510B: transistor, 510C: transistor, 510D: transistor, 511: insulator, 512: insulator, 514: insulator, 516: insulator, 518: conductor, 520: insulator, 521: insulator, 522: insulator, 524: insulator, 530: oxide, 530$a$: oxide, 530$b$: oxide, 530$c$: oxide, 530$c1$: oxide, 530$c2$: oxide, 532$a$: conductor, 532$b$: conductor, 540$a$: conductor, 540$b$: conductor, 542: conductor, 542$a$: conductor, 542$b$: conductor, 543: region, 543$a$: region, 543$b$: region, 544: insulator, 545: insulator, 546: conductor, 546$a$: conductor, 546$b$: conductor, 548: conductor, 550: insulator, 550$a$: insulator, 550$b$: insulator, 551: insulator, 560: conductor, 560$a$: conductor, 560$b$: conductor, 572$a$: conductor, 572$b$: conductor, 574: insulator, 576: insulator, 576$a$: insulator, 576$b$: insulator, 580: insulator, 581: insulator, 582: insulator, 584: insulator, 586: insulator, 600: capacitor, 610: conductor, 612: conductor, 620: conductor, 630: insulator, 650: insulator, 700: transistor, 800: transistor, 831: master device, 832: M2M interface, 841: IoT terminal device, 842: industrial robot, 881: home, 882: office, 883: cloud, 884: factory, 885: factory, 886: factory, 900: transistor, 901: boundary region, 902: boundary region, 4700: electronic component, 4702: printed circuit board, 4704: mounting board, 4710: memory device, 4711: mold, 4712: land, 4713: electrode pad, 4714: wire, 4730: electronic component, 4731: interposer, 4732: package substrate, 4733: electrode, 4735: semiconductor device, 4800: semiconductor wafer, 4800$a$: chip, 4801: wafer, 4801$a$: wafer, 4802: circuit portion, 4803: spacing, 4803$a$: spacing, 5110: SD card, 5111: housing, 5112: connector, 5113: substrate, 5115: controller chip, 5150: SSD, 5151: housing, 5152: connector, 5153: substrate, 5155: memory chip, 5156: controller chip, 5200: portable game machine, 5201: housing, 5202: display portion, 5203: button, 5300: desktop information terminal, 5301: main body, 5302: display portion, 5303: keyboard, 5400: ICD main unit, 5401: battery, 5402: wire, 5403: wire, 5404: antenna, 5405: subclavian vein, 5406: superior vena cava, 5500: information terminal, 5510: housing, 5511: display portion, 5600: computer, 5610: rack, 5620: computer, 5621: PC card, 5622: board, 5623: connection terminal, 5624: connection terminal, 5625: connection terminal, 5626: semiconductor device, 5627: semiconductor device, 5628: semiconductor device, 5629: connection terminal, 5630: mother board, 5631: slot, 5700: automobile, 5800: refrigerator-freezer, 5801: housing, 5802: refrigerator door, 5803: freezer door, 5900: information terminal, 5901: housing, 5902: display portion, 5903: operation switch, 5904: operation switch, 5905: band, 6100: expansion device, 6101: housing, 6102: cap, 6103: USB connector, 6104: substrate, 6106: controller chip, 6240: digital camera, 6241: housing, 6242: display portion, 6243: operation switch, 6244: shutter button, 6246: lens, 6300: video camera, 6301: housing, 6302: housing, 6303: display portion, 6304: operation switch, 6305: lens, 6306: joint, 7000: computer system, 7500: stationary game machine, 7520: main body, 7522: controller.

This application is based on Japanese Patent Application Serial No. 2019-203617 filed on Nov. 10, 2019 and on Japanese Patent Application Serial No. 2019-220233 filed on Dec. 5, 2019, the entire contents of both which are hereby incorporated herein by reference.

The invention claimed is:

1. A memory device comprising:
a first layer;
a plurality of second layers; and
a third layer,
wherein a first circuit is provided in the first layer,
wherein a first memory cell portion is provided in the plurality of second layers,
wherein a second memory cell portion is provided in the third layer,
wherein the first circuit is configured to drive or control the first memory cell portion and the second memory cell portion,
wherein the first memory cell portion is configured to retain stored data for a longer time than the second memory cell portion, in a state where no power is supplied,
wherein the second memory cell portion is configured to perform data writing and data reading at higher speed than the first memory cell portion,
wherein at least part of the plurality of second layers is stacked over the first layer,
wherein at least part of the third layer is stacked over the plurality of second layers,
wherein the first circuit comprises a first transistor comprising silicon in a channel formation region,
wherein the first memory cell portion comprises a second transistor comprising silicon in a channel formation region,
wherein the second memory cell portion comprises a third transistor comprising a metal oxide in a channel formation region, and
wherein in a cross-sectional view, the second transistor comprises:
a first conductor having an opening portion, the first conductor being configured to be a gate of the second transistor;
a first insulator being in contact with part of a side surface of the opening portion;
a second insulator being in contact with the first insulator in the opening portion;
a third insulator being in contact with the second insulator in the opening portion; and
a semiconductor comprising silicon being in contact with the third insulator in the opening portion, the semiconductor having the channel formation region of the second transistor.

2. The memory device according to claim 1, wherein the channel formation region of the first transistor is provided in a single crystal silicon substrate.

3. The memory device according to claim 1, wherein the first transistor is provided on an SOI substrate.

4. A method for operating the memory device according to claim 1, wherein the first circuit is configured to perform writing operation of storing data input to the memory device in the second memory cell portion, and
wherein the first circuit is configured to read out the data stored in the second memory cell portion by the writing operation and then store the data in the first memory cell portion.

5. An electronic device comprising the memory device according to claim 1.

6. The electronic device according to claim 5, wherein the electronic device is a computer, a supercomputer, a smartphone, or an IoT terminal device.

7. The memory device according to claim 1, wherein the second memory cell portion comprises a second circuit and a memory cell array, and
wherein the second circuit is configured to write data to the memory cell array and read out data from the memory cell array.

8. The memory device according to claim 1, wherein the metal oxide comprises at least indium.

9. The memory device according to claim 1, wherein the first memory cell portion comprises a three-dimensional NAND flash memory, and
wherein the second memory cell portion comprises a cache memory.

10. The memory device according to claim 1, wherein the first insulator is configured to be a gate insulating film of the second transistor.

11. The memory device according to claim 10, wherein the second insulator is configured to be a charge accumulation layer of the second transistor, and
wherein the third insulator is configured to be a tunnel insulating film of the second transistor.

12. A memory device comprising:
a first layer;
a plurality of second layers; and
a third layer,
wherein a first circuit is provided in the first layer,
wherein a memory cell portion is provided in the plurality of second layers,
wherein a first RF block circuit is provided in the third layer,
wherein the first circuit is configured to drive or control the memory cell portion and the first RF block circuit,
wherein the memory cell portion is configured to retain stored data in a state where no power is supplied,
wherein at least part of the plurality of second layers is stacked over the first layer,
wherein at least part of the third layer is stacked over the plurality of second layers,
wherein the first circuit comprises a first transistor comprising silicon in a channel formation region, wherein the memory cell portion comprises a second transistor comprising silicon in a channel formation region, wherein the first RF block circuit comprises a third transistor comprising a metal oxide in a channel formation region, and wherein in a cross-sectional view, the second transistor comprises:

a first conductor having an opening portion, the first conductor being configured to be a gate of the second transistor;
 a first insulator being in contact with part of a side surface of the opening portion;
 a second insulator being in contact with the first insulator in the opening portion;
 a third insulator being in contact with the second insulator in the opening portion; and
 a semiconductor comprising silicon being in contact with the third insulator in the opening portion, the semiconductor having the channel formation region of the second transistor.

13. A data processing system comprising:

the memory device according to claim 12; and a central management unit, wherein the central management unit comprises a central processing unit and a second RF block circuit, and wherein the memory device is electrically connected to the central processing unit through the first RF block circuit and the second RF block circuit.

14. An electronic device comprising the memory device according to claim 12.

15. The electronic device according to claim 14, wherein the electronic device is a computer, a supercomputer, a smartphone, or an IoT terminal device.

16. The memory device according to claim 12, wherein the channel formation region of the first transistor is provided in a single crystal silicon substrate.

17. The memory device according to claim 12, wherein the first transistor is provided on an SOI substrate.

18. The memory device according to claim 12, wherein the metal oxide comprises at least indium.

19. The memory device according to claim 12, wherein the memory cell portion comprises a three-dimensional NAND flash memory.

20. The memory device according to claim 12, wherein the first insulator is configured to be a gate insulating film of the second transistor.

21. The memory device according to claim 20, wherein the second insulator is configured to be a charge accumulation layer of the second transistor, and wherein the third insulator is configured to be a tunnel insulating film of the second transistor.

* * * * *